(12) United States Patent
Nam et al.

(10) Patent No.: US 11,645,987 B2
(45) Date of Patent: May 9, 2023

(54) APPARATUS AND VIBRATING GENERATING APPARATUS HAVING REAR VIBRATION MEMBER

(71) Applicant: LG Display Co., Ltd., Seoul (KR)

(72) Inventors: SeulKi Nam, Paju-si (KR); Jeonggoo Kang, Paju-si (KR); Taehyung Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/564,775

(22) Filed: Dec. 29, 2021

(65) Prior Publication Data

US 2022/0208133 A1    Jun. 30, 2022

(30) Foreign Application Priority Data

Dec. 31, 2020    (KR) .................. 10-2020-0190065
Dec. 28, 2021    (KR) .................. 10-2021-0189239

(51) Int. Cl.
*G09G 3/34*    (2006.01)
*H01L 41/047*    (2006.01)
(Continued)

(52) U.S. Cl.
CPC ......... *G09G 3/3493* (2013.01); *H01L 41/042* (2013.01); *H01L 41/0471* (2013.01); *H01L 41/053* (2013.01); *G09G 2330/028* (2013.01)

(58) Field of Classification Search
CPC ............ G09G 3/3493; G09G 2330/028; H01L 41/042; H01L 41/0471; H01L 41/053; H04R 17/005; H04R 9/046; H04R 1/2888; H04R 7/045; H04R 5/02; H04R 9/025; H04R 7/04; H04R 1/028; H04R 7/26;
(Continued)

(56) References Cited

U.S. PATENT DOCUMENTS

| 2003/0003879 A1* | 1/2003 | Saiki | ............... | H04R 9/046 |
| | | | | 379/433.02 |
| 2006/0012559 A1* | 1/2006 | Kang | ............... | H04R 7/04 |
| | | | | 345/108 |

(Continued)

FOREIGN PATENT DOCUMENTS

| CN | 109326236 A | 2/2019 |
| CN | 111629305 A | 9/2020 |

(Continued)

OTHER PUBLICATIONS

Office Action dated Jan. 31, 2023, issued in counterpart Chinese Patent Application No. 202111641951.3.

(Continued)

*Primary Examiner* — Richard J Hong
(74) *Attorney, Agent, or Firm* — Morgan, Lewis & Bockius LLP

(57) ABSTRACT

An apparatus includes a vibration member and a first cover disposed at a rear surface of the vibration member. The apparatus also includes a first vibration apparatus disposed at a rear surface of the first cover and configured to vibrate the vibration member. The apparatus includes a first enclosure member disposed at the rear surface of the first cover and at the rear surface of the vibration member. The apparatus also includes a first rear vibration member disposed at the first enclosure member.

33 Claims, 20 Drawing Sheets

(51) Int. Cl.
*H01L 41/053* (2006.01)
*H01L 41/04* (2006.01)

(58) Field of Classification Search
CPC ..... H04R 1/023; H04R 31/003; G06F 1/1605; G06F 3/0488; G06F 1/1637
See application file for complete search history.

(56) References Cited

U.S. PATENT DOCUMENTS

| | | | |
|---|---|---|---|
| 2009/0097692 A1* | 4/2009 | Sakamoto | H04R 7/045 |
| | | | 381/388 |
| 2010/0220866 A1 | 9/2010 | Hsu | |
| 2014/0055932 A1 | 2/2014 | Nakamura | |
| 2014/0160040 A1* | 6/2014 | Kang | H04R 17/005 |
| | | | 345/173 |
| 2015/0010187 A1* | 1/2015 | Lee | H04R 1/028 |
| | | | 345/177 |
| 2015/0185963 A1* | 7/2015 | Lee | H04R 17/005 |
| | | | 345/177 |
| 2015/0201258 A1* | 7/2015 | Han | H04R 1/023 |
| | | | 381/386 |
| 2015/0341714 A1* | 11/2015 | Ahn | H04R 1/028 |
| | | | 381/333 |
| 2015/0373441 A1* | 12/2015 | Behles | G06F 1/1637 |
| | | | 381/333 |
| 2016/0088379 A1* | 3/2016 | Lobisser | H04R 1/2888 |
| | | | 29/592.1 |
| 2017/0277359 A1* | 9/2017 | Lee | G06F 3/0488 |
| 2017/0280234 A1* | 9/2017 | Choi | G06F 1/1605 |
| 2017/0280246 A1* | 9/2017 | Choi | H04R 5/02 |
| 2017/0289694 A1* | 10/2017 | Choi | H04R 7/045 |
| 2018/0332400 A1* | 11/2018 | Chen | H04R 31/003 |
| 2019/0028787 A1* | 1/2019 | Masuda | H04R 7/26 |
| 2019/0037164 A1* | 1/2019 | Kim | H04R 17/005 |
| 2019/0141450 A1* | 5/2019 | Yoon | H04R 7/045 |
| 2020/0162804 A1 | 5/2020 | Lee et al. | |
| 2020/0169815 A1* | 5/2020 | Kajanus | H04R 9/025 |
| 2020/0245062 A1 | 7/2020 | Son et al. | |
| 2020/0280796 A1 | 9/2020 | Lee et al. | |
| 2022/0174396 A1* | 6/2022 | Kim | H04R 9/046 |

FOREIGN PATENT DOCUMENTS

| | | |
|---|---|---|
| JP | 2011-030124 A | 2/2011 |
| JP | 2020-145674 A | 9/2020 |
| KR | 10-2019-0040608 A | 4/2019 |
| TW | 201032605 A | 9/2010 |

OTHER PUBLICATIONS

Office Action issued in corresponding Taiwanese Patent application No. 11220118660 dated Feb. 7, 2023.

* cited by examiner

APPARATUS AND VIBRATING GENERATING APPARATUS HAVING REAR VIBRATION MEMBER

CROSS-REFERENCE TO RELATED APPLICATIONS

This application claims the benefit of and priority to Korean Patent Application No. 10-2020-0190065 filed on Dec. 31, 2020, and No. 10-2021-0189239 filed on Dec. 28, 2021, which are hereby incorporated by reference as if fully set forth herein.

BACKGROUND

1. Technical Field

The present disclosure relates to an apparatus and a vibration generating apparatus.

2. Discussion of the Related Art

An apparatus or an electronic apparatus, for example, a display apparatus, may include a display panel for displaying an image and a separate speaker for providing a sound. Where a separate speaker is in a display apparatus, the speaker occupies a space. Accordingly, the design and spatial disposition of the display apparatus may be limited.

Also, because a sound output from a speaker may travel in a rearward or a downward direction of the display apparatus, sound quality may be degraded due to interference between soundwaves reflected from walls and the floor. For this reason, it may be difficult to transfer an accurate sound, and the immersion experience of a viewer may be reduced.

SUMMARY

The inventors have recognized problems described above and have performed various experiments for implementing an apparatus for enhancing the quality of a sound and a sound pressure characteristic. Therefore, through the various experiments, the inventors have invented an electronic apparatus and a vibration generating apparatus having a new structure for enhancing the quality of a sound and a sound pressure characteristic. Accordingly, embodiments of the present disclosure are directed to an electronic apparatus and a vibration generating apparatus that substantially obviate one or more problems due to limitations and disadvantages of the related art.

An aspect of the present disclosure is to provide an electronic apparatus and a vibration generating apparatus which may vibrate a vibration member to generate a sound in a forward direction of the apparatus and may enhance one or both of a sound characteristic and a sound pressure level characteristic.

Another aspect of the present disclosure is to provide an electronic apparatus and a vibration generating apparatus, which may vibrate a display member (or a vibration member) to generate a haptic feedback and may enhance a vibration characteristic, strength, and a response time of the haptic feedback.

Additional features and aspects will be set forth in part in the description which follows and in part will become apparent from the description or may be learned by practice of the inventive concepts provided herein. Other features and aspects of the inventive concepts may be realized and attained by the structure particularly pointed out in, or derivable from, the written description, the claims hereof, and the appended drawings.

To achieve these and other advantages and in accordance with the purpose of the disclosure, as embodied and broadly described herein, an apparatus according to an example embodiment of the present disclosure may comprise: a vibration member; a first cover disposed at a rear surface of the vibration member; a first vibration apparatus disposed at a rear surface of the first cover and configured to vibrate the vibration member; a first enclosure member disposed at the rear surface of the first cover and at the rear surface of the vibration member; and a first rear vibration member disposed at the first enclosure member.

In another aspect, a vibration generating apparatus for use with a vibration member according to an example embodiment of the present disclosure may comprise: a support member including a first hole and a second hole; a first vibration device disposed at the first hole; a second vibration device disposed at the second hole; an enclosure member connected to a rear surface of the vibration member and configured to cover the support member, the first vibration device, and the second vibration device; and a rear vibration member disposed at the enclosure member.

In yet another aspect, an apparatus according to an example embodiment of the present disclosure may comprise: a vibration member; a first cover disposed at a rear surface of the vibration member; and a vibration generating apparatus disposed at a rear surface of the first cover and configured to vibrate the vibration member, the vibration generating apparatus comprising a support member including a first hole and a second hole; a first vibration device disposed at the first hole; a second vibration device disposed at the second hole; an enclosure member connected to a rear surface of the vibration member and configured to cover the support member, the first vibration device, and the second vibration device; and a rear vibration member disposed at the enclosure member.

An apparatus or an electronic apparatus according to an example embodiment of the present disclosure may output a sound in a forward direction of a display panel or a vibration member and may output a sound having improved sound quality, sound performance, and sound pressure level characteristic, thereby increasing the immersion experience of a viewer or a user.

An apparatus or an electronic apparatus according to an example embodiment of the present disclosure may generate a haptic feedback based on a vibration of a display panel or a vibration member and may enhance a vibration characteristic, strength, and a response time of the haptic feedback.

A vibration generating apparatus according to an example embodiment of the present disclosure may output a sound in a forward direction of a vibration member (or a vibration object) and may output a sound having improved sound quality, sound performance, and/or sound pressure level characteristic.

A vibration generating apparatus according to an example embodiment of the present disclosure may generate a haptic feedback based on a vibration of a vibration member (or a vibration object).

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the appended claims. Nothing in this section should be taken as a limitation on those claims. Further aspects and advantages are discussed below in conjunction with embodiments of the disclosure.

It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

Figure 1:
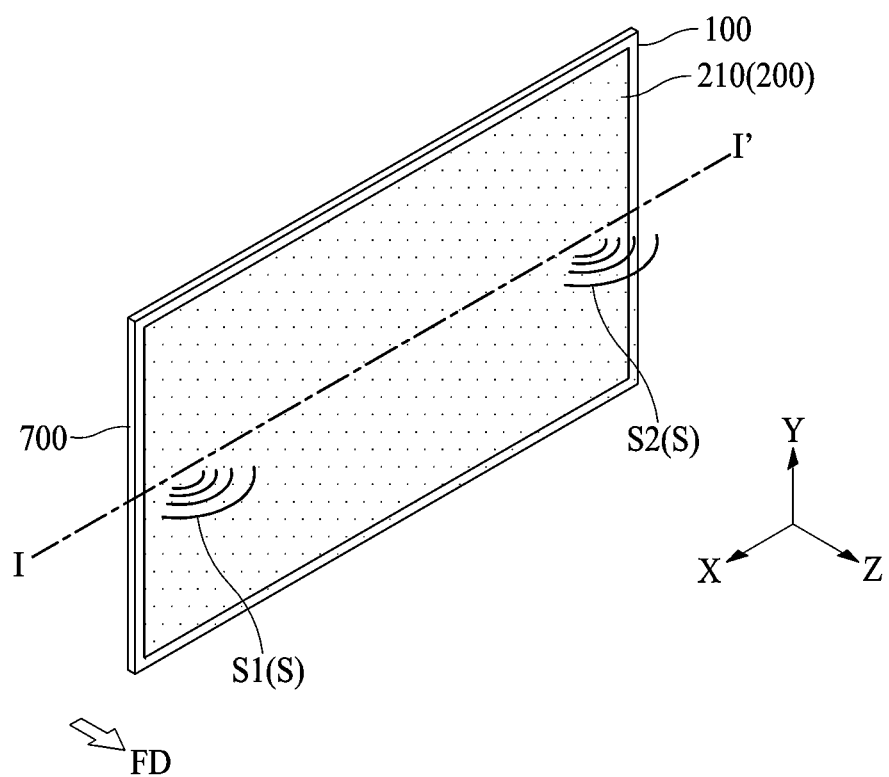
FIG. 1 illustrates an electronic apparatus according to an example embodiment of the present disclosure.

Throughout the drawings and the detailed description, unless otherwise described, the same drawing reference numerals should be understood to refer to the same elements, features, and structures. The relative size and depiction of these elements may be exaggerated for clarity, illustration, and convenience.

DETAILED DESCRIPTION

Reference will now be made in detail to embodiments of the present disclosure, examples of which may be illustrated in the accompanying drawings.

In the following description, the progression of processing steps or operations described herein is not limited to the specific example or examples set forth herein and may be changed as is known in the art, unless otherwise specified. Like reference numerals designate like elements throughout, unless otherwise specified. Names of the respective elements used in the following explanations are selected only for convenience of writing the specification and may thus be different from those used in actual products.

Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents.

The shapes, sizes, ratios, angles, numbers, and the like, which are illustrated in the drawings to describe various example embodiments of the present disclosure, are merely given by way of example. Therefore, the present disclosure is not limited to the illustrations in the drawings.

In the following description, where the detailed description of the relevant known function or configuration may unnecessarily obscure an important point of the present disclosure, a detailed description of such known function of configuration may be omitted.

Where the terms "comprise," "have," "include," and the like are used, one or more other elements may be added unless the term, such as "only," is used. An element described in the singular form is intended to include a plurality of elements, and vice versa, unless the context clearly indicates otherwise.

In construing an element, the element is to be construed as including an error or tolerance range even where no explicit description of such an error or tolerance range is provided.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third layer or element may be interposed therebetween.

In describing a temporal relationship, when the temporal order is described as, for example, "after," "subsequent," "next," or "before," a case which is not continuous may be included unless a more limiting term, such as "just," "immediate(ly)," or "direct(ly)," is used.

Although the terms "first," "second," A, B, (a), (b), and the like may be used herein to describe various elements, these elements should not be interpreted to be limited by these terms as they are not used to define a particular order or precedence. These terms are used only to distinguish one element from another. For example, a first element could be termed a second element, and, similarly, a second element could be termed a first element, without departing from the scope of the present disclosure.

The expression that an element is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

Where an element or layer is referred to as being "on" or "connected to" another element or layer, it should be understood to mean that the element or layer may be directly on or directly connected to the other element or layer, or that intervening elements or layers may be present. Also, where one element is referred to as being disposed "on" or "under" another element, it should be understood to mean that the elements may be so disposed to directly contact each other, or may be so disposed without directly contacting each other.

The term "at least one" should be understood as including any and all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

In the present disclosure, examples of a display apparatus may include a narrow-sense display apparatus, such as an organic light emitting display (OLED) module or a liquid crystal module (LCM) including a display panel and a driver for driving the display panel. Also, examples of the display apparatus may include a set device (or a set apparatus) or a set electronic apparatus, such as a notebook, laptop, or portable computer, a television, a computer monitor, an equipment apparatus including an automotive apparatus or another type apparatus for vehicles, or a mobile electronic apparatus, such as a smartphone or an electronic pad, which is a complete product (or a final product) including an LCM or an OLED module.

Therefore, in the present disclosure, examples of the display apparatus may include a narrow-sense display apparatus itself, such as an LCM or an OLED module, and a set apparatus which is a final consumer apparatus or an application product including the LCM or the OLED module.

In some embodiments, an LCM or an OLED module including a display panel and a driver may be referred to as a narrow-sense display apparatus, and an electronic apparatus which is a final product including an LCM or an OLED module may be referred to as a set apparatus. For example, the narrow-sense display apparatus may include a display panel, such as an LCD panel or an OLED panel, and a source printed circuit board (PCB) which is a controller for driving the display panel. The set apparatus may further include a set PCB which is a set controller electrically connected to the source PCB to control overall operation of the set apparatus.

In some embodiments of the present disclosure, the apparatus including a vibration apparatus may be applied to vehicles as a user interface module, such as a central control panel for automobiles. For example, the apparatus may be provided between occupants sitting in two front seats for a vibration of the apparatus to be transmitted to the interior of a vehicle. Therefore, an audio experience in a vehicle may be improved in comparison with a case where speakers are disposed on interior sides of the vehicle.

Features of various embodiments of the present disclosure may be partially or overall coupled to or combined with each other, and may be variously inter-operated with each other and driven technically as those skilled in the art can sufficiently understand. Embodiments of the present disclosure may be carried out independently from each other, or may be carried out together in a co-dependent relationship.

The accompanying drawings, which are included to provide a further understanding of the present disclosure and are incorporated in and constitute a part of this application, illustrate embodiments of the disclosure and together with the description serve to explain the principle of the disclosure. However, the technical features of the present disclosure are not limited to specific drawings, and features disclosed in the drawings may be combined with each other to form a new embodiment.

Hereinafter, example embodiments of the present disclosure will be described in detail with reference to the accompanying drawings. Also, for convenience of description, a scale in which each of elements is illustrated in the accompanying drawings may differ from an actual scale. Thus, the illustrated elements are not limited to the specific scale in which they are illustrated in the drawings.

FIG. 1 illustrates an electronic apparatus according to an example embodiment of the present disclosure.

A shown in FIG. 1, the apparatus according to an example embodiment of the present disclosure may include a display member 200. For example, the display member 200 may display an image, for example, an electronic image, or a digital image, or a still image, or a video image. The apparatus may generate a sound and/or a haptic feedback (or a haptic vibration) based on a vibration of the display member 200. For example, the apparatus may generate a first sound and/or a first haptic feedback in one region thereof and may generate a second sound and/or a second haptic feedback in another region thereof.

According to an example embodiment of the present disclosure, the apparatus may output sounds S1 and S2 (or vibration sounds or display vibration sounds) based on a vibration of the display member 200 configured to display an image. For example, in the apparatus, the display member 200 may be vibrated by the vibration apparatus to generate the sounds S1 and S2. Accordingly, the apparatus according to an example embodiment of the present disclosure may use the display member 200 as a vibration plate for generating a sound and/or a haptic feedback.

The apparatus according to an example embodiment of the present disclosure may output the sounds S1 and S2 in a forward direction FD of a screen by using the display member 200 as a vibration plate for generating a sound. Thus, a sound may be accurately transmitted, sound quality may be improved, and the immersion experience of a viewer or a user may improve. For example, the display member 200 may be a vibration member, a passive vibration member, a vibration object, a display panel, or a vibration plate, but embodiments of the present disclosure are not limited thereto.

Figure 2:
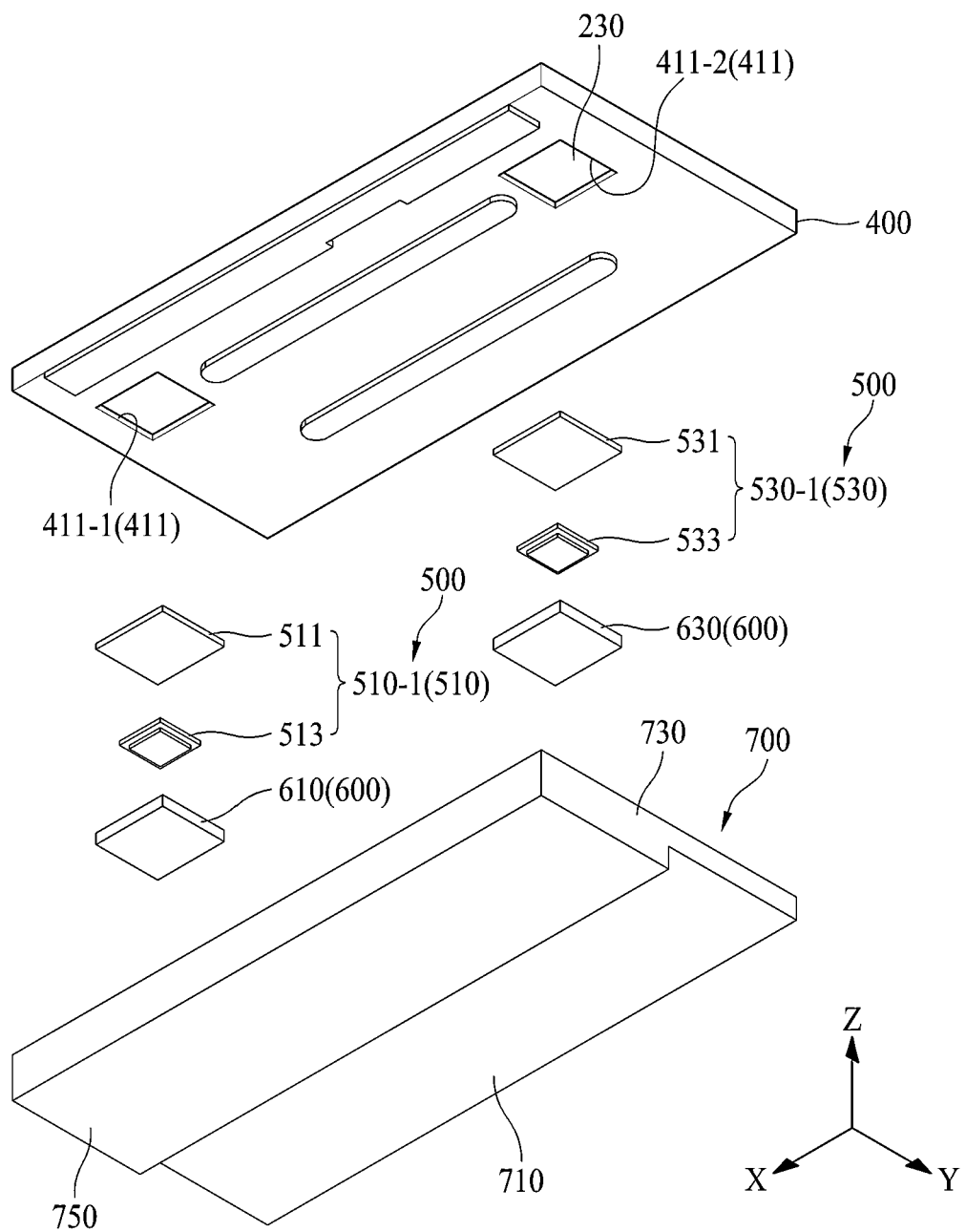
FIG. 2 is an exploded perspective view of the apparatus illustrated in FIG. 1.
Figure 3:
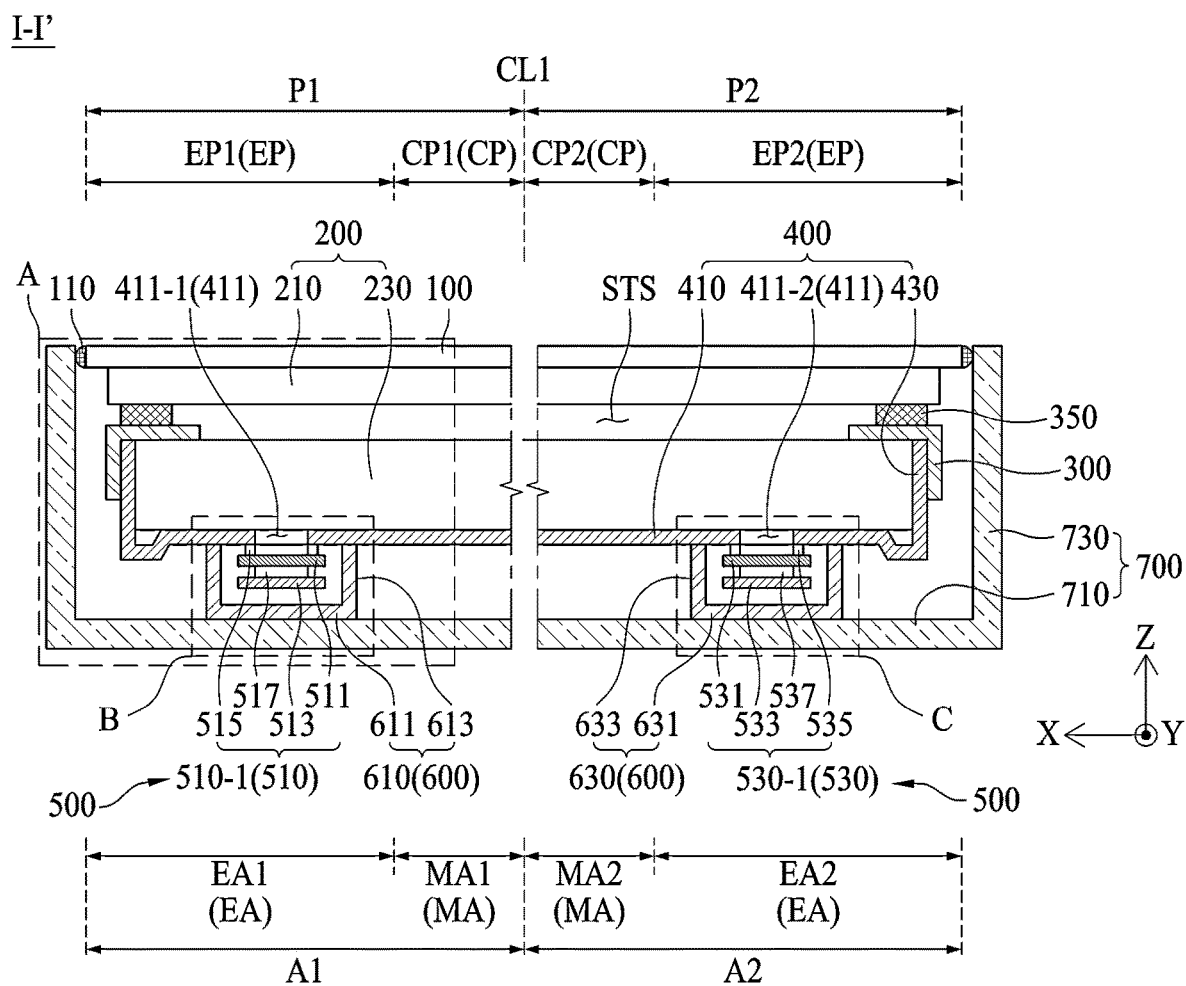
FIG. 3 is a cross-sectional view taken along line I-I' illustrated in FIG. 1.
Figure 4:
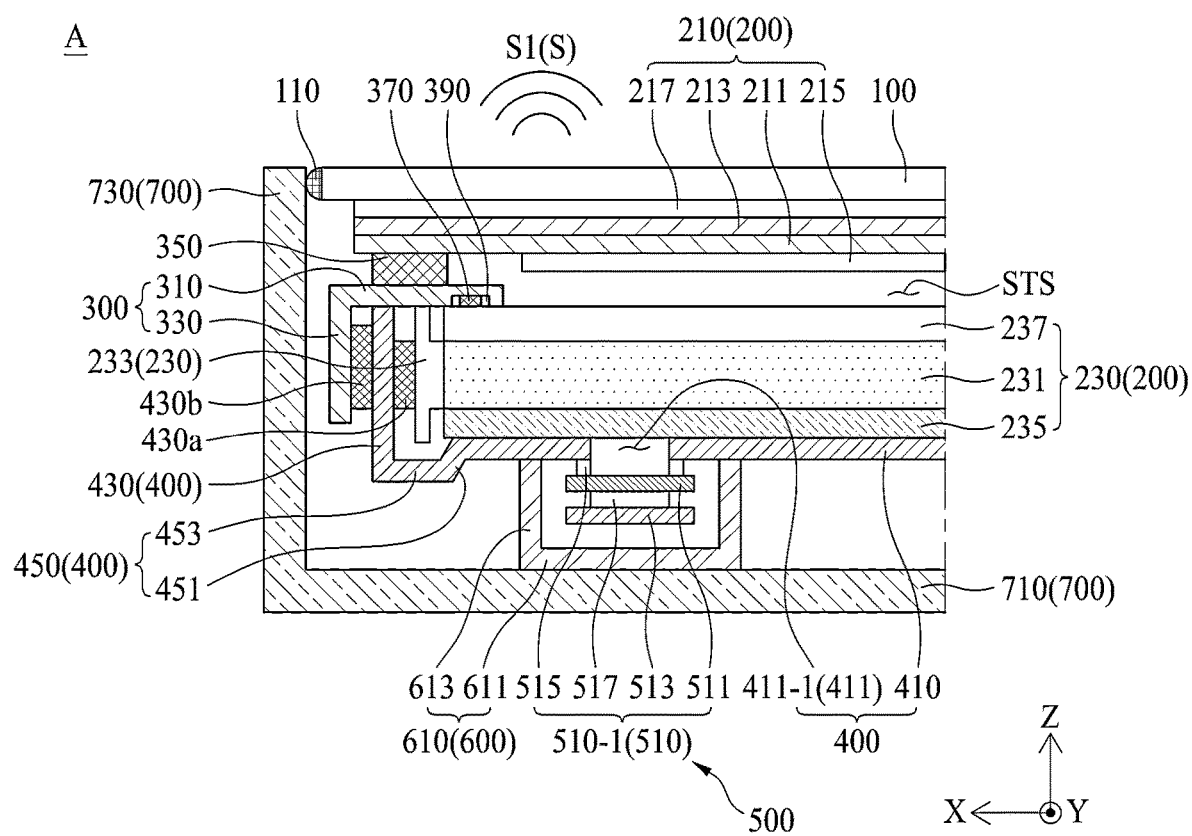
FIG. 4 is an enlarged view of a region "A" illustrated in FIG. 3.

FIG. 2 is an exploded perspective view of the apparatus illustrated in FIG. 1. FIG. 3 is a cross-sectional view taken along line I-I' illustrated in FIG. 1. FIG. 4 is an enlarged view of a region "A" illustrated in FIG. 3.

As illustrated in FIGS. 1 to 4, the electronic apparatus according to an example embodiment of the present disclosure may include a front member 100, a display member 200, a guide member 300, a first cover 400, one or more vibration apparatuses 500, one or more enclosure members 600, and a second cover 700. A configuration of the apparatus is not limited to the illustrated example.

The front member 100 may configure a foremost structure of the apparatus. For example, the front member 100 may be disposed at a front surface of the display member 200 and may protect a screen of the display member 200. For example, the front member 100 may cover a front surface of the display member 200 to protect the display member 200 from an external impact. Moreover, the front member 100 may vibrate together with the vibration of the display member 200 to generate a sound S and/or a haptic feedback. For example, the front member 100 may generate different sounds S1 and S2 and/or haptic feedback in different regions.

For example, the front member 100 may include a transparent plastic material, a glass material, or a tempered glass material. According to an example embodiment of the present disclosure, the front member 100 may include one of sapphire glass and gorilla glass or a stacked structure thereof. According to another example embodiment of the present disclosure, the front member 100 may include a transparent plastic material, such as polyethyleneterephthalate (PET) or the like. The front member 100 may include tempered glass with scratch resistance and transparency. For example, the front member 100 may be a front structure, a front window, a cover window, a glass window, a cover screen, a screen cover, a window glass, or the like, but embodiments of the present disclosure are not limited thereto.

For example, the front member 100 may cover a non-display area other than a display area of the display member 200. For example, the front member 100 may include a transparent area overlapping the display area of the display member 200 and a non-transparent area (or a light blocking area) overlapping the non-display area of the display member 200. For example, the non-transparent area may cover not only the non-display area of the display member 200, but also the non-display area where an image is not displayed in the apparatus.

The front member 100 may have a shape corresponding to the outer shape or outer periphery of the display member 200 or the display panel 210. For example, the front member 100 may have a polygonal shape including a rectangular shape or a square shape or may have a non-polygonal shape including at least one side having a curve shape, but embodiments of the present disclosure are not limited thereto.

The apparatus according to an example embodiment of the present disclosure may further include a first connection member 110.

The first connection member 110 may be disposed at a lateral surface of the front member 100. For example, the first connection member 110 may be disposed to surround the lateral surface of the front member 100. The first connection member 110 may be disposed to cover at least one or more of lateral surfaces and corners of the front member 100. The first connection member 110 may be disposed between the front member 100 and the second cover 700. The first connection member 110 may be disposed along a region between the front member 100 and an upper inner surface of the second cover 700. The first connection member 110 may connect or couple the front member 100 to the second cover 700 and may fill a space between the front member 100 and the second cover 700, thereby preventing light from leaking into a region between the front member 100 and the second cover 700 (lateral light leakage).

According to an example embodiment of the present disclosure, the first connection member 110 may include a silicone-based or UV curing-based sealant (or resin). In consideration of a process tact time (or takt time), the first connection member 110 may include a UV curing-based sealant. The first connection member 110 may have a color (for example, blue, red, cyan, or black), but embodiments of the present disclosure are not limited thereto. For example, the first connection member 110 may include a colored resin or a light blocking resin for preventing lateral light leakage.

The display member 200 may be disposed at a rear surface (or a back surface) of the front member 100 and may be configured to display an image. For example, the image may include an electronic image, a digital image, or a still image, or a video image, or the like. For example, the display member 200 may be a liquid crystal display device, but the type of the display member 200 is not limited thereto. For example, the display member 200 may be another type of display device, such as a light emitting display device, an electrophoretic display device, a micro light emitting diode display device, an electrowetting display device, a quantum dot light emitting display device, or the like.

According to an example embodiment of the present disclosure, a rear surface (or a back surface) of the display member 200 may include a center portion CP and periphery portions EP. For example, the rear surface of the display member 200 may be divided into the center portion CP and two periphery portions EP parallel to each other with the center portion CP therebetween.

The center portion CP of the display member 200 may be divided into a first center portion CP1 and a second center portion CP2. For example, the first center portion CP1 may be a left portion (or a left center portion) of the center portion CP, and the second center portion CP2 may be a right portion (or a right center portion) of the center portion CP. With respect to a first direction X (or a widthwise direction) of the display member 200, the first center portion CP1 and the second center portion CP2 may be left-right (or horizontally) symmetrical with respect to a center line (or a widthwise center line) CL1 of the display member 200.

The first center portion CP1 and a first periphery portion EP1 may configure a first portion (or a left portion) P1 of the display member 200. The second center portion CP2 and a second periphery portion EP2 may configure a second portion (or a right portion) P2 of the display member 200.

The display member 200 according to an example embodiment of the present disclosure may include a display panel 210 and a backlight 230. The configuration of the display member 200 is not limited thereto.

The display panel 210 may be disposed at a rear surface of the front member 100 and may be configured to display an image. For example, the image may include an electronic image, a digital image, or a still image, or a video image, or the like.

The display panel 210 according to an example embodiment of the present disclosure may be configured to display an image using the light irradiated from the backlight 230. Moreover, the display panel 210 may act as a touch sensor that senses a touch applied to the front member 100, for example, by a user. The display panel 210 may output the sound S according to a vibration of the vibration apparatus(es) 500 or may generate a haptic feedback (or a haptic vibration) in response to the touch. The display panel 210 may be disposed at the rear surface of the front member 100 through a bonding process using a panel bonding member (or an adhesive member). The panel bonding member may include a pressure sensitive adhesive (PSA), an optically clear adhesive (OCA), or an optically clear resin (OCR), but embodiments of the present disclosure are not limited thereto.

The display panel 210 according to an example embodiment of the present disclosure may have a polygonal shape including a rectangular shape or a square shape or may have a non-polygonal shape including at least one side having a curve shape. However, embodiments of the present disclosure are not limited thereto. The display panel 210 may have a shape which is the same as or different from the front member 100. For example, the front member 100 may have a rectangular shape, and the display panel 210 may have a rectangular shape having a smaller size than the front member 100. For another example, the front member 100 may have a non-polygonal shape, and the display panel 210 may have a non-polygonal shape or a rectangular shape each having a smaller size than the front member 100.

The display panel 210 may function as a vibration plate, which vibrates based on vibration (or driving) of the vibration apparatus(es) 500 to output the sound S1 and S2 in the forward direction FD. For example, the display panel 210 may simultaneously or sequentially output a first sound S1 of a first pitched sound band and a second sound S2 of a second pitched sound band based on the vibration apparatus(es) 500 in the forward direction FD thereof. According to an example embodiment of the present disclosure, the first pitched sound band may be the same or different from the second pitched sound band. For example, the first sound S1 having the first pitched sound band may be output from a first portion (or a left portion) P1 of the display panel 210 in the forward direction FD, and the second sound S2 having the second pitched sound band may be output from a second portion (or a right portion) P2 of the display panel 210 in the forward direction FD.

The display panel 210 may be a vibration plate which vibrates based on a vibration of the vibration apparatus(es) 500 to generate a haptic feedback. For example, the display panel 210 may generate a first haptic feedback at a first portion (or a left portion) P1 and may generate a second haptic feedback at a second portion (or a right portion) P2, based on a vibration of the vibration apparatuses 500. For example, the display panel 210 may generate the first haptic feedback at a first periphery portion EP1 and may generate the second haptic feedback at a second periphery portion EP2.

As illustrated in FIG. 4, the display panel 210 according to an example embodiment of the present disclosure may include a first substrate 211, a second substrate 213, a first polarization member 215, and a second polarization member 217. A configuration of the display panel 210 is not limited thereto.

The first substrate 211 may be a lower substrate or a thin film transistor (TFT) array substrate. The first substrate 211 may include a pixel array including a plurality of pixels which are respectively provided in a plurality of pixel areas formed at intersections between a plurality of gate lines and a plurality of data lines. Each of the plurality of pixels may include a TFT connected to a gate line and a data line, a pixel electrode connected to the TFT, and a common electrode which is adjacent to the pixel electrode and is supplied with a common voltage.

The first substrate 211 may further include a pad portion provided at a first periphery thereof and a gate driving circuit provided at a second periphery thereof. The pad portion may transfer a signal, supplied from an external source, to the pixel array and the gate driving circuit. For example, the pad portion may include a plurality of data pads connected to a plurality of data lines through a plurality of data link lines and may also include a plurality of gate input pads connected to the gate driving circuit through gate control signal lines.

The gate driving circuit according to an example embodiment of the present disclosure may be embedded (or integrated) into a second periphery of the first substrate 211 and may be connected to the plurality of gate lines in one-to-one relationship. For example, the gate driving circuit may be implemented with a shift register including a transistor, which is formed through the same process as the TFT provided in the pixel area. Alternatively, the gate driving circuit may be implemented in the form of an integrated circuit (IC) and may be provided at a driving circuit part without being embedded into the first substrate 211.

The second substrate 213 may be an upper substrate or a color filter array substrate. For example, the second substrate 213 may include a pixel pattern to include an opening area overlapping with each of the pixel areas formed at the first substrate 211 and may include a color filter layer formed at the opening area. The second substrate 213 may have a size smaller than the first substrate 211, but embodiments of the present disclosure are not limited thereto. For example, the second substrate 213 may overlap a remaining portion, other than the first periphery, of the first substrate 211. The second substrate 213 may be bonded using a sealant to a remaining portion, other than the first periphery, of the first substrate 211 with a liquid crystal layer therebetween.

The liquid crystal layer may be disposed between the first substrate 211 and the second substrate 213. For example, the liquid crystal layer may include a liquid crystal including liquid crystal molecules where an alignment direction thereof is changed based on an electric field generated by the common voltage and a data voltage applied to a pixel electrode for each pixel.

The first polarization member 215 may be attached on a rear surface of the first substrate 211 and may polarize light which is incident from the backlight 230 and travels to the liquid crystal layer. The second polarization member 217 may be attached on a top surface of the second substrate 213 and may polarize light, which passes through the second substrate 213 and is incident thereon, to discharge the polarized light to a front surface of the apparatus.

The display panel 210 may drive the liquid crystal layer based on an electric field generated in each pixel by the data voltage and the common voltage applied to each pixel. Thus, the display panel 210 may display an image based on light passing through the liquid crystal layer.

The display panel 210 according to an example embodiment of the present disclosure may further include a touch electrode layer for sensing a touch applied to the front member 100, for example, by a user.

The touch electrode layer may include a plurality of touch electrodes for sensing the touch. Each of the plurality of touch electrodes may act as a touch sensor for sensing the touch, based on a mutual capacitance type or a self-capacitance type. For example, the touch electrode layer may be implemented as a touch panel including the plurality of touch electrodes. For example, the touch panel may be an add-on type touch panel or an in-cell type touch panel.

In display panel 210 according to another example embodiment of the present disclosure, the first substrate 211 may be implemented as the color filter array substrate, and the second substrate 213 may be implemented as the TFT array substrate. For example, the display panel 210 according to another example embodiment of the present disclosure may have a type where an upper portion and a lower portion of the display panel 210 are reversed with respect to the example embodiment described above. For example, a pad part of the display panel 210 according to another example embodiment of the present disclosure may be covered by a separate mechanism or structure.

The display panel 210 according to another example embodiment of the present disclosure may include a bending portion that may be bent or curved to have a curved shape or a certain curvature radius.

The bending portion of the display panel 210 may be implemented in at least one of the first periphery and the second periphery of the display panel 210, which are parallel to each other. The first periphery and/or the second periphery (where the bending portion is implemented) of the display panel 210 may include only the non-display area or may alternatively include a periphery of the display area in addition to the non-display area. The display panel 210 including the bending portion implemented by bending of the non-display area may have a one-side bezel bending structure or a both-side bezel bending structure. Moreover, the display panel 210 including the bending portion implemented by bending of the periphery of the display area and the non-display area may have a one-side active bending structure or a both-side active bending structure.

The backlight 230 may be disposed at a rear surface of the display panel 210 and may irradiate light onto the rear surface of the display panel 210. For example, the backlight 230 may be disposed between the display panel 210 and the first cover 400 and may be supported by the first cover 400.

The backlight 230 according to an example embodiment of the present disclosure may include a light guide plate 231, a light source part 233, a reflective sheet 235, and an optical sheet part 237. The configuration of the backlight 230 is not limited thereto.

The light guide plate 231 may include a light incident surface which is disposed at the first cover 400 to overlap the display panel 210 and is provided in at least one sidewall thereof. For example, the light guide plate 231 may include a light-transmitting plastic or glass material. The light guide plate 231 may transfer (or output) light, which is incident on the light incident surface from the light source part 233, to the display panel 210. For example, the light guide plate 231 may be referred to as a light guide member or a flat light source, or the like, but embodiments of the present disclosure are not limited thereto.

The light source part 233 may irradiate light onto the light incident surface provided at the light guide plate 231. The light source part 233 may be disposed at one side surface of the light guide plate 231 to overlap a first periphery of the display panel 210. For example, the light source part 233 may be disposed between the guide member 300 and the first cover 400. For example, the light source part 233 may be disposed between a supporting part 310 of the guide member 300 and the first cover 400. For example, the light source part 233 may include a plurality of light emitting diode (LED) devices which are mounted at a light source printed circuit board and irradiate lights onto the light incident surface of the light guide plate 231. For example, the guide member 300 may be a panel guide or a guide panel, but embodiments of the present disclosure are not limited thereto.

The reflective sheet 235 may be disposed at a rear surface of the light guide plate 231. For example, the reflective sheet 235 may be disposed between the first cover 400 and the rear surface of the light guide plate 231. The reflective sheet 235 may reflect light, which is incident from the light guide plate 231, back toward the light guide plate 231 to minimize or reduce the loss of the light.

The optical sheet part 237 may be disposed at a front surface of the light guide plate 231. For example, the optical sheet part 237 may enhance a luminance characteristic of light output from the light guide plate 231. For example, the optical sheet part 237 may include a lower diffusive sheet, a lower prism sheet, and an upper first prism sheet, but embodiments of the present disclosure are not limited thereto. For example, the optical sheet part 237 may be configured by a stacked combination of one or more sheets of a diffusive sheet, a prism sheet, a dual brightness enhancement film (DBEF), and a lenticular sheet, or may be configured with one composite sheet having a light diffusing function and a light collecting function.

The display member 200 according to an example embodiment of the present disclosure may further include a driving circuit part. The driving circuit part may be connected to a pad portion provided at the first periphery portion of the display panel 210 and may be configured to display an image corresponding to video data supplied from the display host system on each pixel of the display panel 210. For example, the driving circuit part may be connected to a pad portion provided at the first periphery portion of the first substrate 211 of the display panel 210. For example, the driving circuit part may sense a touch (for example, by a user) through the plurality of touch electrodes disposed at the touch electrode layer of the display panel 210.

According to an example embodiment of the present disclosure, the driving circuit part may be disposed at the first cover 400. For example, the driving circuit part may extend from a first periphery of the display panel 210 along a side surface and a rear surface of the first cover 400. For example, the driving circuit part may be fixed to or connected to the rear surface of the first cover 400. For example, the driving circuit part may include at least one flexible circuit film, at least one data driving integrated circuit (IC), a printed circuit board (PCB), a control circuit, and a connector, but a configuration of the driving circuit part is not limited thereto. The connector may be a user connector, but embodiments of the present disclosure are not limited thereto.

Each of the at least one flexible circuit film may be attached at a pad portion provided at a first periphery of the first substrate 211 of the display panel 210 using a film attachment process. Each of the at least one flexible circuit film may be bent to surround a side surface (or a first side surface) of one or both of the display panel 210 and the backlight 230 and may be connected to the PCB at one periphery (or a first rear periphery) of the rear surface of the first cover 400.

The at least one data driving IC may be individually mounted at each of the at least one flexible circuit film. The data driving IC may receive pixel data and a data control signal provided from the control circuit, convert the pixel data into a pixel-based analog data signal based on the data control signal, and supply the analog data voltage to a corresponding data line. Optionally, each of the at least one data driving IC may be directly mounted at a first periphery of the first substrate 211 through a chip bonding process and may be connected to a plurality of data lines. In this example configuration, the at least one flexible circuit film may be omitted.

The PCB may be connected to the at least one flexible circuit film in common. For example, the PCB may be connected to the display panel 210 through the at least one flexible circuit film. For example, the PCB may be electrically connected to the other side of the at least one flexible circuit film through a film attachment process using an anisotropic conductive film and may be disposed at the first rear periphery of the first cover 400 based on bending of the at least one flexible circuit film.

The control circuit may be disposed at (or mounted at) the PCB. For example, the control circuit may receive a timing synchronization signal and video data supplied from a display host system through a connector. For example, the timing synchronization signal may include a vertical synchronization signal, a horizontal synchronization signal, a data enable signal, and a main clock signal, or the like, but embodiments of the present disclosure are not limited thereto.

The control circuit may generate a gate control signal for controlling a driving timing of a gate driving circuit and a data control signal for controlling a driving timing of the at least one data driving IC, based on the timing synchronization signal. For example, the gate control signal may include at least one gate start signal and a plurality of gate shift clocks, or the like. The data control signal may include a source start signal, a source shift clock, and a source output enable signal, or the like.

The connector may receive various signals including a sound signal from the display host system and may provide the received signal to the control circuit.

According to an example embodiment of the present disclosure, the driving circuit part may further include a touch driving circuit connected to the touch electrode layer of the display panel 210. The touch driving circuit may sense a touch (for example, by a user) through each of the plurality of touch electrodes disposed at the touch electrode layer to generate touch raw data and may transmit coordinate information about the touch to the display host system based on the generated touch raw data.

The display host system or a host system may include a main board, various circuits mounted on the main board, various storage mediums, a peripheral device, a keyboard, and a power device, or the like. The various circuits mounted on the main board may include a central control circuit for processing various information, an image processing circuit for processing data according to control by the central control circuit, and a sound processing circuit for processing a sound according to control by the central control circuit. The display host system may process various information, may generate and provide the timing synchronization signal and the video data to the control board, and may generate and provide a driving signal including a sound signal or a haptic feedback signal to the control board. For example, the sound signal may or may not be synchronized with the video data.

The display host system may execute an application program associated with touch coordinates corresponding to coordinate information about a touch provided from the touch driving circuit or may perform a user interface based on a touch input of a user. Also, the display host system may generate a driving signal including a haptic feedback signal corresponding to the coordinate information about the touch provided from the touch driving circuit.

The guide member 300 according to an example embodiment of the present disclosure may be disposed between the display panel 210 and the backlight 230. For example, the guide member 300 may be disposed between a rear periphery portion EP of the display panel 210 and a front periphery portion of the backlight 230. For example, the guide member 300 may support the rear periphery portion EP of the display panel 210. For example, the guide member 300 may cover at least one or both of the front periphery portion and a side surface (or a lateral surface) of the backlight 230. For example, the guide member 300 may cover and support a side surface of the first cover 400.

According to an example embodiment of the present disclosure, the guide member 300 may maintain an interval between the display panel 210 and the backlight 230 and may provide a sound transfer space STS between the display panel 210 and the backlight 230.

According to an example embodiment of the present disclosure, the guide member 300 may have a tetragonal frame shape which includes an opening portion overlapping a center portion CP, other than the rear periphery portions EP, of the display panel 210. A configuration of the guide member 300 is not limited thereto.

According to an example embodiment of the present disclosure, because the guide member 300 has a tetragonal frame shape including an opening portion, the guide member 300 may provide the sound transfer space STS between a rearmost surface of the display panel 210 and a frontmost surface of the backlight 230 facing each other with an opening portion therebetween, thereby preventing or minimizing the leakage (or loss) of a sound pressure level transferred to the sound transfer space STS. The sound transfer space STS may have a function of a sound pressure generating space, where a sound pressure is generated based on a vibration of the backlight 230. The sound transfer space STS may additionally or alternatively have a function of a panel vibration space which enables the display panel 210 to vibrate smoothly based on a sound pressure level.

As illustrated in FIGS. 3 and 4, the second connection member 350 according to an example embodiment of the present disclosure may be disposed between a periphery portion EP of the rear surface of the display panel 210 and the guide member 300. The third connection member 370 may be disposed between a periphery portion of a front surface of the backlight 230 and the guide member 300.

According to an example embodiment of the present disclosure, the guide member 300 may be disposed or positioned at the rear periphery portion EP of the display panel 210 by the second connection member 350. For example, the guide member 300 may be disposed or positioned at a front periphery portion of the backlight 230 by the third connection member 370.

According to an example embodiment of the present disclosure, a front surface of the second connection member 350 may be disposed at or connected to a rear periphery portion EP of the first substrate 211 of the display panel 210. A rear surface of the second connection member 350 may be disposed on or connected to the front surface of the guide member 300. Thus, the display panel 210 and the guide member 300 may be connected to the second connection member 350. Accordingly, the display panel 210 may be fixed or connected to the guide member 300 with the second connection member 350.

The second connection member 350 may be disposed at the rear periphery portion EP of the first substrate 211 to surround a lateral surface of the first polarization member 215, thereby preventing lateral light leakage occurring in the first polarization member 215. The second connection member 350 may provide a sound transfer space STS between the display panel 210 and the guide member 300. For example, the sound transfer space STS may be formed in a four-side-sealed type or a closed loop type by one or both of the guide member 300 and the second connection member 350, but embodiments of the present disclosure are not limited thereto.

According to an example embodiment of the present disclosure, a front surface of the third connection member 370 may be disposed at or connected to the rear surface of the guide member 300. A rear surface of the third connection member 370 may be disposed at or connected to the front surface of the backlight 230. Thus, the guide member 300 and the backlight 230 may be connected to the third connection member 370. Accordingly, the backlight 230 may be fixed or connected to the guide member 300 by the third connection member 370.

According to an example embodiment of the present disclosure, the guide member 300 may further include a groove 390 into which the third connection member 370 may be inserted (or accommodated), and the third connection member 370 may be inserted (or accommodated) into the groove 390. For example, the groove 390 may be formed at the rear surface of the guide member 300 overlapping the front surface of the backlight 230. For example, the third connection member 370 may have a thickness (or a height) which enables the backlight 230 to be connected to the guide member 300 despite being inserted (or accommodated) into the groove 390. For example, the third connection member 370 may have a thickness (or a height) which is equal to that of the groove 390 or is greater than that of the groove 390 within an error range. According to an example embodiment of the present disclosure, because the third connection member 370 may be inserted or accommodated into the groove 390, an increase in thickness of the apparatus caused by the third connection member 370 may be reduced or minimized. Also, in a case where a height of the sound transfer space STS is adjusted, the thickness or height of the third connection member 390 may be excluded. Thus, a height of the sound transfer space STS may be adjusted to a combined thickness or height of the guide member 300 and the second connection member 350. Accordingly, a height of the sound transfer space STS may be controlled, thereby providing an apparatus for outputting a desired sound.

According to an example embodiment of the present disclosure, the second and third connection members 350 and 370 may include an acrylic-based or urethane-based adhesive member, but embodiments of the present disclosure are not limited thereto. For example, the second and third connection members 350 and 370 may include an acrylic-based adhesive member having a relatively strong adhesive force and relatively high hardness so that a vibration of the guide member 300 may be sufficiently transferred to the display panel 210. In this case, the second and third connection members 350 and 370 may include an acrylic-based adhesive layer, a double-sided foam adhesive pad, or an acrylic-based adhesive resin curing layer. However, embodiments of the present disclosure are not limited to such examples.

According to an example embodiment of the present disclosure, the guide member 300 may include a plastic material, a metal material, or a combination of a plastic material and a metal material, but a material of the guide member 300 is not limited thereto. For example, the guide member 300 may function as a vibration transfer member which transfers a vibration, generated by the vibration apparatus 400, to the rear periphery portion EP of the display panel 210. Therefore, the vibration, generated by the vibration apparatus(es) 500, may be transferred from the guide member 300 to the display panel 210 without being lost. For example, the guide member 300 may include a metal material for transferring the vibration, generated by the vibration apparatus(es) 500, to the display panel 210 in a state of maintaining the stiffness of the display panel 210. However, embodiments of the present disclosure are not limited thereto.

The guide member 300 according to an example embodiment of the present disclosure may include a supporting part 310 and a side part 330. For example, the guide member 300 may have a cross-sectional structure having a gamma shape (Γ) or a rotated L shape (⌐) based on a coupling structure of the supporting part 310 and the side part 330.

The supporting part 310 according to an example embodiment of the present disclosure may be disposed between the display panel 210 and the backlight 230. For example, the supporting part 310 may be disposed between the rear periphery portion EP of the display panel 210 and the front periphery portion of the backlight 230 and may support the rear periphery portion EP of the display panel 210.

According to an example embodiment of the present disclosure, the supporting part 310 may maintain an interval between the display panel 210 and the backlight 230. For example, the supporting part 310 may provide the sound transfer space STS between the display panel 210 and the backlight 230. For example, the supporting part 310 may have a tetragonal frame shape which includes an opening portion overlapping a center portion CP, other than the rear periphery portion EP, of the display panel 210. However, a configuration of the supporting part 310 is not limited to this particular example.

According to an example embodiment of the present disclosure, the second connection member 350 may be disposed at a front surface of the supporting part 310, and the third connection member 370 may be disposed at a rear surface of the supporting part 310. For example, the groove 390 may be disposed at the rear surface of the supporting part 310.

The side part (or a guide sidewall) 330 according to an example embodiment of the present disclosure may be connected to the supporting part 310 and may cover the side surface (or a lateral surface) of the backlight 230. For example, the side part 330 may cover the side surface (or a lateral surface) of the first cover 400. For example, the side part 330 may be bent from the supporting part 310 toward the side surface of the first cover 400 and may cover and support the side surface of the first cover 400.

The first cover 400 may be configured to support the display member 200 and may be configured to cover a rear surface of the display member 200. Also, the first cover 400 may be configured to support the vibration apparatus(es) 500. The first cover 400 may function as a vibration plate. The first cover 400 may include a metal material or a metal alloy material. For example, the first cover 400 may include any one or more of an aluminum (Al) material, aa magnesium (Mg) material, a magnesium (Mg) alloy material, a magnesium-lithium (Mg—Li) alloy material, and an aluminum (Al) alloy material, but embodiments of the present disclosure are not limited thereto.

The first cover 400 may be configured to include a rear portion 410 and a lateral portion 430. The rear portion 410 may be configured to support a rear surface of the display member 200. The lateral portion 430 may be connected to a periphery portion of the rear portion 410 and may cover a lateral surface of the display member 200. However, a configuration of the first cover 400 is not limited to this particular example.

The rear portion 410 may be disposed to cover the rear surface of the display member 200 and may be configured to support the display member 200. For example, the rear portion 410 may be formed in a plate structure. For example, the rear portion 410 may be configured to support the backlight 230 of the display member 200 and may support the vibration apparatus(es) 500. For example, the rear portion 410 may directly contact a rear surface of the backlight 230. For example, the rear portion 410 may directly contact a rear surface of a reflective sheet 235 of the backlight 230. For example, the rear portion 410 may directly contact the rear surface of the backlight 230 and thus may transfer a vibration, generated based on a vibration of the vibration apparatus(es) 500, to the backlight 230.

The rear portion 410 (or the first cover 400) may include a middle region (or a first cover region) MA and a periphery region (or a second cover region) EA. For example, the middle region (or a first cover region) MA of the rear portion 410 (or the first cover 400) may correspond to (or overlap) a center portion CP of the display member 200. For example, the periphery region (or the second cover region) EA of the rear portion 410 (or the first cover 400) may correspond to (or overlap) a periphery portion EP of the display member 200.

The middle region MA of the rear portion 410 (or the first cover 400) may include a first middle region (or a left middle region) MA1 and a second middle region (or a right middle region) MA2. For example, the first middle region (or the left middle region) MA1 of the rear portion 410 (or the first cover 400) may correspond to (or overlap) a first center portion CP1 of the display member 200. For example, the second middle region (or the right middle region) MA2 of the rear portion 410 (or the first cover 400) may correspond to (or overlap) a second center portion CP2 of the display member 200.

The periphery region EA of the rear portion 410 (or the first cover 400) may include a first periphery region (or a left periphery region) EA1 and a second periphery region (or a right periphery region) EA2. For example, the first periphery region (or the left periphery region) EA1 of the rear portion 410 (or the first cover 400) may correspond to (or overlap) a first periphery portion EP1 of the display member 200. For example, the second periphery region (or the right periphery region) EA2 of the rear portion 410 (or the first cover 400) may correspond to (or overlap) a second periphery portion EP2 of the display member 200.

According to an example embodiment of the present disclosure, the first middle region MA1 and the first periphery region EA1 may configure a first region (or a left region) A1 of the rear portion 410 (or the first cover 400). For example, the second middle region MA2 and the second periphery region EA2 may configure a second region (or a right region) A2 of the rear portion 410 (or the first cover 400). For example, the first region A1 may correspond to (or overlap) a first portion P1 of the display member 200, and the second region A2 may correspond to (or overlap) a second portion P2 of the display member 200.

The lateral portion 430 may be disposed between the backlight 230 and the guide member 300. For example, the lateral portion 430 may be disposed between a lateral surface of the backlight 230 and a lateral portion 330 of the guide member 300.

According to an example embodiment of the present disclosure, the lateral portion 430 may be connected to the backlight 230 by a fourth connection member 430*a*. For example, the fourth connection member 430*a* may be disposed between the lateral portion 430 and the backlight 230. For example, the lateral portion 430 may be connected to the guide member 300 by a fifth connection member 430*b*. For example, the fifth connection member 430*b* may be disposed between the lateral portion 430 of the first cover 400 and the lateral portion 330 of the guide member 300.

According to an example embodiment of the present disclosure, the fourth connection member 430*a* and the fifth connection member 430*b* may include an acrylic-based or urethane-based adhesive member, but embodiments of the present disclosure are not limited thereto. For example, the fourth connection member 430*a* and the fifth connection member 430*b* may include an acrylic-based adhesive material having a relatively strong adhesive force and relatively high hardness so that a vibration of the guide member 300 may be sufficiently transferred to the display panel 210.

As illustrated in FIGS. 2 to 4, the first cover 400 according to an example embodiment of the present disclosure may further include one or more holes 411. For example, the hole(s) 411 may be disposed at the rear portion 410 of the first cover 400.

The hole(s) 411 may be disposed at the first cover 400 overlapping the vibration apparatus(es) 500, and the rear surface of the backlight 230 may be exposed through the hole(s) 411. For example, the hole(s) 411 may secure a vibration space of the first cover 400 through which a sound generated based on a vibration of the vibration apparatus(es) 500 may travel in a direction toward the front surface of the apparatus. For example, the reflective sheet 235 of the backlight 230 may be exposed in a direction toward a rear surface of the first cover 400 through the hole(s) 411. For example, the hole(s) 411 may be disposed at each of the first region A1 and the second region A2 of the rear portion 410. For example, the holes 411 in the first cover 400 may include a first hole 411-1 disposed at the first region A1 and a second hole 411-2 disposed at the second region A2.

According to an example embodiment of the present disclosure, the first hole 411-1 in or through the first cover 400 may be disposed at the first middle region MA1 or the first periphery region EA1 or may be disposed over the first middle region MA1 or the first periphery region EA1. For example, the second hole 411-2 in or through the first cover 400 may be disposed at the second middle region MA2 or the second periphery region EA2 or may be disposed over the second middle region MA2 or the second periphery region EA2.

A hole 411 may provide a first gap space between the display member 200 and a vibration apparatus 500. For example, the hole 411 may provide the first gap space between the backlight 230 of the display member 200 and the vibration apparatus 500. For example, the hole 411 may provide the first gap space between the reflective sheet 235 of the backlight 230 and the vibration apparatus 500. For example, the first gap space may be a vibration space based on driving of the vibration apparatus 500, a sound pressure level space (or a sound portion) where a sound pressure level may be generated based on a vibration of the vibration apparatus 500, or a sound wave propagation path (or a sound energy incident portion) through which a sound wave generated based on a vibration of the vibration apparatus 500 may be directly propagated to the display member 200. However, embodiments of the present disclosure are not limited thereto.

A size (or a width) of the hole(s) 411 according to an example embodiment of the present disclosure may be smaller than a size (or a width) of the vibration apparatus(es) 500. In the event that a total size (or a total width) of a hole 411 is greater than a total size of the corresponding vibration apparatus 500, the vibration apparatus 500 may be inserted (or accommodated) into the hole 411. Thus, the vibration apparatus 500 may not be positioned at the rear portion 410 without using a separate mechanism. Therefore, in the event that the total size (or a total width) of the hole 411 is smaller than the total size of the corresponding vibration apparatus 500, the vibration apparatus 500 may be positioned at the rear portion 410 to overlap the first hole 411 even without a separate mechanism. For example, the hole 411 according to an example embodiment of the present disclosure may have the same shape as that of the vibration apparatus 500 or may have a tetragonal shape or a circular shape. However, embodiments of the present disclosure are not limited thereto.

As illustrated in FIGS. 3 and 4, the first cover 400 according to an example embodiment of the present disclosure may further include a reinforcement portion 450. The reinforcement portion 450 may increase or complement the stiffness of the first cover 400. For example, the reinforcement portion 450 may protrude rearward by a certain height from the rear portion 410, thereby increasing or complementing the stiffness of the first cover 400. For example, the reinforcement portion 450 may be a forming portion of the first cover 400.

According to an example embodiment of the present disclosure, the reinforcement portion 450 may be formed along the periphery region EA of the rear portion 410. For example, the reinforcement portion 450 may be formed at a region where the rear portion 410 is connected to the lateral portion 430. For example, the reinforcement portion 450 may protrude in a rearward direction from a rear surface of the rear portion 410 to include an inclined surface inclined from an end or one side of the rear portion 410. The lateral portion 430 may be connected to an end or one side of the reinforcement portion 450.

According to an example embodiment of the present disclosure, the reinforcement portion 450 may include a first reinforcement portion (or an inclined surface) 451 and a second reinforcement portion (or a flat surface) 453. For example, the first reinforcement portion (or the inclined surface) 451 may be disposed (or extend) to be inclined in a rearward direction from one end or one side of the rear portion 410. For example, the second reinforcement portion (or the flat surface) 453 may be disposed (or extend) horizontally in a first direction X toward the lateral portion 430 from an end or one side of the first reinforcement portion 451. For example, an end or one side of the second reinforcement portion 453 may be connected to the lateral portion 430.

A vibration apparatus 500 may be disposed at the rear surface of the first cover 400 and may vibrate the display member 200. For example, the vibration apparatus 500 may be supported by the first cover 400. For example, the vibration apparatus 500 may be disposed at the rear portion 410 to cover a hole 411 disposed at the rear portion 410 of the first cover 400.

A vibration apparatus 500 according to an example embodiment of the present disclosure may be a film type vibration apparatus. For example, the vibration apparatus 500 may be referred to as a piezoelectric device, a flexible sound generator, a flexible actuator, a flexible speaker, a flexible piezoelectric speaker, a film actuator, a film type piezoelectric composite actuator, a film speaker, a film type piezoelectric speaker, or a film type piezoelectric composite speaker, or the like. However, embodiments of the present disclosure are not limited thereto.

According to an example embodiment of the present disclosure, a vibration apparatus 500 may vibrate based on a driving signal including a haptic feedback signal or/and a sound signal to vibrate the display member 200. Thus, the vibration apparatus 500 may generate a sound S based on a vibration of the display member 200 or may generate a haptic feedback (or a haptic vibration) in response to a touch, for example, by a user.

According to an example embodiment of the present disclosure, a vibration apparatus 500 may vibrate the first portion P1 of the display member 200 to generate a first sound S1 of a first pitched sound band based on a vibration of the first portion P1 or may generate a first haptic feedback (or a haptic vibration) in response to a touch. For example, the vibration apparatus 500 may vibrate the second portion P2 of the display member 200 to generate a second sound S2 of a second pitched sound band based on a vibration of the second portion P2 or may generate a second haptic feedback (or a haptic vibration) in response to a touch.

The vibration apparatus(es) 500 according to an example embodiment of the present disclosure may include a plurality of vibration apparatuses, for example, a first vibration apparatus 510 and a second vibration apparatus 530, but embodiments of the present disclosure are not limited thereto.

The first vibration apparatus 510 may include at least one or more vibration devices, for example, a first vibration device 510-1. For example, the first vibration apparatus 510 may include one vibration device, e.g., the first vibration device 510-1. The first vibration device 510-1 according to an example embodiment of the present disclosure may be substantially the same as the first vibration apparatus 510.

The second vibration apparatus 530 may include at least one or more vibration devices, for example a second vibration device 530-1. For example, the second vibration apparatus 530 may include one vibration device, e.g., the second vibration device 530-1. The second vibration device 530-1 according to an example embodiment of the present disclosure may be substantially the same as the second vibration apparatus 530.

According to an example embodiment of the present disclosure, the first vibration device 510-1 may include a plate 511 and a vibration generator 513, and the second vibration device 530-1 may include a plate 531 and a vibration generator 533. However, a configuration of each of the first vibration device 510-1 and the second vibration device 530-1 is not limited thereto.

The first vibration apparatus 510 may be disposed in the first region A1 of the first cover 400 (or the rear portion 410) and may cover the first hole 411-1 disposed at the first region A1.

The first vibration apparatus 510 may vibrate the first region A1 of the first cover 400 based on a first driving signal including one or both of a haptic feedback signal and a sound signal to vibrate the first portion P1 of the display member 200. Thus, the first vibration apparatus 510 may generate a first sound S1 of a first pitched sound band based on a vibration of the first portion P1 of the display member 200 or may generate a first haptic feedback (or a haptic vibration) in response to a touch, for example, by a user. For example, the first vibration apparatus 510 may vibrate the first region A1 of the first cover 400 to directly vibrate the first portion P1 of the display member 200. Thus, the first vibration apparatus 510 may generate a first sound S1 of a first pitched sound band or may generate a first haptic feedback (or a haptic vibration) in response to a touch.

The first vibration apparatus 510 according to an example embodiment of the present disclosure may vibrate the first region A1 of the first cover 400 to generate a sound pressure level in an inner region (or the first gap space) of the first hole 411-1 in or through the first cover 400, in response to the first driving signal. Thus, the first vibration apparatus 510 may vibrate the first portion P1 of the display member 200 to generate the first sound S1 of the first pitched sound band or to generate the first haptic feedback.

According to an embodiment of the present disclosure, when the first vibration apparatus 510 vibrates based on the first driving signal, a sound pressure level may be generated in the inner region of the first hole 411-1 by a vibration of the first region A1 of the first cover 400 based on a vibration of the first vibration apparatus 510. A sound pressure level may be generated in the sound transfer space STS by a vibration of the backlight 230 based on the sound pressure level. Based on a vibration of the first portion P1 of the display panel 210 by the sound pressure level generated in the sound transfer space STS, the first sound S1 of the first pitched sound band may be output in the forward direction FD of the display panel 210 or the first haptic feedback may be generated. For example, a sound wave generated based on a vibration of the first vibration apparatus 510 may be transferred (or propagated) to the display member 200 through the first hole 411-1. Thus, a sound pressure level characteristic and/or sound quality of the first sound S1 may be enhanced. According to an example embodiment of the present disclosure, the sound wave generated based on the vibration of the first vibration apparatus 510 may be directly transferred (or propagated) to the display member 200 through the first hole 411-1. Thus, a sound pressure level characteristic and/or sound quality of the first sound S1 may be enhanced.

The second vibration apparatus 530 may vibrate the second region A2 of the first cover 400 based on a second driving signal including one or both of a haptic feedback signal and a sound signal to vibrate the second portion P2 of the display member 200. Thus, the second vibration apparatus 530 may generate a second sound S2 of a second pitched sound band based on a vibration of the second portion P2 of the display member 200 or may generate a second haptic feedback (or a haptic vibration) in response to a touch, for example, by a user. For example, the second vibration apparatus 530 may vibrate the second region A2 of the first cover 400 to directly vibrate the second portion P2 of the display member 200. Thus, the second vibration apparatus 530 may generate a second sound S2 of a second pitched sound band or may generate a second haptic feedback (or a haptic vibration) in response to a touch.

The second vibration apparatus 530 according to an example embodiment of the present disclosure may vibrate the second region A2 of the first cover 400 to generate a sound pressure level in an inner region (or the first gap space) of the second hole 411-2 in or through the first cover 400, in response to the second driving signal. Thus, the second vibration apparatus 530 may vibrate the second portion P2 of the display member 200 to generate the second sound S2 of the second pitched sound band or to generate the second haptic feedback.

According to an example embodiment of the present disclosure, when the second vibration apparatus 530 vibrates based on the second driving signal, a sound pressure level may be generated in the inner region of the second hole 411-2 by a vibration of the second region A2 of the first cover 400 based on a vibration of the second vibration apparatus 530. A sound pressure level may be generated in the sound transfer space STS by a vibration of the backlight 230 based on the sound pressure level. Based on a vibration of the second portion P2 of the display panel 210 by the sound pressure level generated in the sound transfer space STS, the second sound S2 of the second pitched sound band may be output in the forward direction FD of the display panel 210 or the second haptic feedback may be generated. For example, a sound wave generated based on a vibration of the second vibration apparatus 530 may be transferred (or propagated) to the display member 200 through the second hole 411-2. Thus, a sound pressure level characteristic and/or sound quality of the second sound S2 may be enhanced. According to an example embodiment of the present disclosure, the sound wave generated based on the vibration of the second vibration apparatus 530 may be directly transferred (or propagated) to the display member 200 through the second hole 411-2. Thus, a sound pressure level characteristic and/or sound quality of the second sound S2 may be enhanced.

The plates 511 and 531 according to an example embodiment of the present disclosure may be disposed at the rear portion 410 of the first cover 400 by sixth and seventh connection members 515 and 535, respectively. For example, the plates 511 and 531 may respectively cover the holes 411-1 and 411-2 in or through the rear portion 410 of the first cover 400. For example, the plates 511 and 531 may have a greater size (a greater width) than the holes 411-1 and 411-2, respectively.

According to an example embodiment of the present disclosure, the plate (or a first plate) 511 of the first vibration device 510-1 may be disposed at the rear portion 410 of the first cover 400. For example, the plate (or the first plate) 511 of the first vibration device 510-1 may be disposed at the rear portion 410 of the first cover 400 by the sixth connection member 515. For example, the plate (or the first plate) 511 of the first vibration device 510-1 may cover the first hole 411-1 of the rear portion 410. For example, a size of the plate (or the first plate) 511 of the first vibration device 510-1 may be greater than or equal to that of a vibration generator (or a first vibration generator) 513.

According to an example embodiment of the present disclosure, the plate (or a second plate) 531 of the second vibration device 530-1 may be disposed at the rear portion 410 of the first cover 400. For example, the plate (or the second plate) 531 of the second vibration device 530-1 may be disposed at the rear portion 410 of the first cover 400 by the seventh connection member 535. For example, the plate (or the second plate) 531 of the second vibration device 530-1 may cover the second hole 411-2 of the rear portion 410. For example, a size of the plate (or the second plate) 531 of the second vibration device 530-1 may be greater than or equal to that of a vibration generator (or a second vibration generator) 533.

The plate (or the first plate) 511 may be a vibration plate which generates a sound pressure level in an inner region of the first hole 411-1 of the rear portion 410 of the first cover 400. The plate (or the second plate) 531 may be a vibration plate which generates a sound pressure level in an inner region of the second hole 411-2 of the rear portion 410. The plates 511 and 531 according to an example embodiment of the present disclosure may include any one or more of metal materials, such as stainless steel, aluminum (Al), magnesium (Mg), a Mg alloy, a magnesium-lithium (Mg—Li)

alloy, and an Al alloy. However, embodiments of the present disclosure are not limited thereto.

The sixth connection member 515 may be disposed between the plate 511 and the rear portion 410 near the first hole 411-1 and may connect (or fix) the vibration generator 513 to the rear portion 410. The sixth connection member 515 may include a double-sided tape or a double-sided foam tape, which includes an adhesive layer. The adhesive layer of the sixth connection member 515 according to an example embodiment of the present disclosure may include an acrylic-based or urethane-based adhesive member. For example, the adhesive layer of the sixth connection member 515 may include a urethane-based adhesive material which has a relatively ductile characteristic compared to an acrylic-based adhesive material having a relatively high hardness, so as to minimize the transfer of a vibration of the vibration generator 513 to the rear portion 410. However, embodiments of the present disclosure are not limited thereto.

The seventh connection member 535 may be disposed between the plate 531 and the rear portion 410 near the second hole 411-2. Therefore, the seventh connection member 535 may connect (or fix) the vibration generator 533 to the rear portion 410. The seventh connection member 535 may include a double-sided tape or a double-sided foam tape, which includes an adhesive layer. The adhesive layer of the seventh connection member 535 according to an example embodiment of the present disclosure may include an acrylic-based or urethane-based adhesive member. For example, the adhesive layer of the seventh connection member 535 may include a urethane-based adhesive material having a relatively ductile characteristic compared to an acrylic-based adhesive material having a relatively high hardness, so as to minimize the transfer of a vibration of the vibration generator 533 to the rear portion 410. However, embodiments of the present disclosure are not limited thereto.

The vibration generators 513 and 533 may be disposed at rear surfaces of the plates 511 and 531, respectively. The vibration generators 513 and 533 may respectively be disposed at the plates 511 and 531 and may respectively vibrate the plates 511 and 531. The vibration generators 513 and 533 may respectively overlap the first and second holes 411-1 and 411-2 of the rear portion 410. For example, the vibration generators 513 and 533 may respectively be disposed at the rear surfaces of the plates 511 and 531 to respectively overlap the first and second holes 411-1 and 411-2 of the rear portion 410. For example, the vibration generators 513 and 533 may be disposed at the plates 511 and 531 by eighth and ninth connection members 517 and 537, respectively.

According to an example embodiment of the present disclosure, the vibration generator (or a first vibration generator) 513 of the first vibration device 510-1 may be disposed at a rear surface of the first plate 511. For example, the vibration generator (or the first vibration generator) 513 of the first vibration device 510-1 may be disposed at the rear surface of the first plate 511 by the eighth connection member 517. For example, the vibration generator (or the first vibration generator) 513 of the first vibration device 510-1 may overlap the first hole 411-1 of the rear portion 410 of the first cover 400. According to an example embodiment of the present disclosure, the vibration generator (or a second vibration generator) 533 of the second vibration device 530-1 may be disposed at a rear surface of the second plate 531. For example, the vibration generator (or the second vibration generator) 533 of the second vibration device 530-1 may be disposed at the rear surface of the second plate 531 by the ninth connection member 537. For example, the vibration generator (or the second vibration generator) 533 of the second vibration device 530-1 may overlap the second hole 411-2 of the rear portion 410.

According to an example embodiment of the present disclosure, the second cover 700 may be disposed at the rear surface of the first cover 400. The second cover 700 may accommodate (or receive) the display member 200 where one or more vibration apparatuses 500 are disposed (or coupled). The second cover 700 may cover the rear surface of the first cover 400, a lateral surface of the first cover 400, and a lateral surface of the display member 200. For example, the second cover 700 may be referred to as a set cover, a rear set cover, an outermost cover, an outermost set cover, a product cover, or an outermost product cover, or the like, but embodiments of the present disclosure are not limited thereto.

The second cover 700 according to an example embodiment of the present disclosure may include a rear structure 710 and a lateral structure 730.

The rear structure 710 may be an outermost rear structure disposed at the rear surface of the electronic apparatus. For example, the rear structure 710 may support the display member 200 where one or more vibration apparatuses 500 are disposed and may cover the rear surface of the display member 200.

The lateral structure 730 may be an outermost lateral structure disposed at a lateral surface of the electronic apparatus. For example, the lateral structure 730 may be connected to a periphery of the rear structure 710 and may cover at least one or more of the rear surface of the first cover 400, the lateral surface of the second cover 700, and the lateral surface of the display member 200.

As illustrated in FIG. 2, the second cover 700 according to an example embodiment of the present disclosure may further include a cover box 750. For example, the cover box 750 may wholly accommodate (or receive) the vibration apparatus(es) 500 and may be implemented at the rear structure 710 to wholly cover the vibration apparatus(es) 500.

For example, the cover box 750 may provide a closed space between the rear portion 410 of the first cover 400 and the rear structure 710, thereby enhancing a characteristic of a sound generated by the vibration apparatus(es) 500. For example, the closed space provided by the cover box 750 may be used as a space for a resonance effect, and a sound pressure level generated by the vibration apparatus(es) 500 may be amplified based on the resonance effect in the cover box 750. For example, the cover box 750 may be referred to as a sound box, a sound part, or a resonance portion, or the like, but embodiments of the present disclosure are not limited thereto.

According to an example embodiment of the present disclosure, the electronic apparatus may include one or more enclosure members 600. For example, the enclosure members 600 may be disposed at the rear surface of the first cover 400. For example, each enclosure member 600 may be disposed at the rear surface of the first cover 400 by a connection member (for example, a tenth connection member 651 shown in FIG. 5 or an eleventh connection member 653 shown in FIG. 6). For example, an enclosure member 600 may be disposed between the first cover 400 and the second cover 700. For example, the enclosure member 600 may be disposed to cover a corresponding vibration apparatus 500 entirely. For example, the enclosure member 600 may cover a corresponding hole 411 disposed at the first cover 400. For example, the enclosure member 600 may acoustically seal or separate a space where the corresponding vibration apparatus 500 is disposed. For example, one enclosure member 600 may acoustically seal or separate a space where a first vibration apparatus 510 is disposed. Another enclosure member 600 may acoustically seal or separate a space where a second vibration apparatus 530 is disposed. The enclosure members 600 may prevent or decrease interference between a sound generated in the space where the first vibration apparatus 510 is disposed and a sound generated in the space where the second vibration apparatus 530 is disposed, thereby preventing or decreasing a reduction in sound characteristic. An enclosure member 600 may be referred to as an enclosure, a rear enclosure, a vibration module box, a vibration module cover, a vibration box, or a sound box, but embodiments of the present disclosure are not limited thereto. For example, the enclosure member 600 may be a module frame member, a first member, or a second member and may be used in common, but embodiments of the present disclosure are not limited thereto.

According to an example embodiment of the present disclosure, the tenth and eleventh connection members 651 and 653 may include a double-sided tape or a double-sided foam tape, which includes an adhesive layer. The adhesive layer of the tenth and eleventh connection members 651 and 653 according to an example embodiment of the present disclosure may include an acrylic-based or urethane-based adhesive member.

The enclosure members 600 may include a first enclosure member 610 and a second enclosure member 630. The first enclosure member 610 and the second enclosure member 630 may be disposed at the rear surface of the rear portion 410 of the first cover 400.

According to an example embodiment of the present disclosure, the first enclosure member 610 may be disposed at the first region A1 of the rear portion 410 of the first cover 400. For example, the first enclosure member 610 may cover the first vibration apparatus 510. For example, the first enclosure member 610 may cover the first hole 411-1 disposed at the rear portion 410 of the first cover 400.

The first enclosure member 610 according to an example embodiment of the present disclosure may have a tetragonal shape covering the first vibration apparatus 510, but embodiments of the present disclosure are not limited thereto. For example, the first enclosure member 610 may have a shape which is the same as or different from that of the first vibration apparatus 510. For example, where the first vibration apparatus 510 has a square shape, the first enclosure member 610 may have a square shape having a greater size (or a greater width) than the first vibration apparatus 510, or may have a circular shape or an oval shape. However, embodiments of the present disclosure are not limited thereto.

The first enclosure member 610 may limit (or define) a vibration region (or a vibration area) of the display member 200 based on the first vibration apparatus 510. For example, in the first portion P1 of the display member 200, as a size of the first enclosure member 610 increases, a vibration region of the first portion P1 may increase. Thus, a low-pitched sound band characteristic of a left sound may be enhanced. As another example embodiment of the present disclosure, in the first portion P1 of the display member 200, as a size of the first enclosure member 610 decreases, the vibration region of the first portion P1 may decrease. Thus, a high-pitched sound band characteristic of the left sound may be enhanced. Accordingly, a size of the first enclosure member 610 may be set based on a desired characteristic of a pitched sound band based on a vibration of the display member 200 based on a vibration of the first vibration apparatus 510.

According to an example embodiment of the present disclosure, the second enclosure member 630 may be disposed at the second region A2 of the rear portion 410 of the first cover 400. For example, the second enclosure member 630 may cover the second vibration apparatus 530. For example, the second enclosure member 630 may cover the second hole 411-2 disposed at the rear portion 410 of the first cover 400.

The second enclosure member 630 according to an example embodiment of the present disclosure may have a tetragonal shape covering the second vibration apparatus 530, but embodiments of the present disclosure are not limited thereto. For example, the second enclosure member 630 may have a shape which is the same as or different from that of the second vibration apparatus 530. For example, where the second vibration apparatus 530 has a square shape, the second enclosure member 630 may have a square shape having a greater size (or a greater width) than the second vibration apparatus 530, or may have a circular shape or an oval shape. However, embodiments of the present disclosure are not limited thereto.

The second enclosure member 630 according to an example embodiment of the present disclosure may have the same shape as that of the first enclosure member 610 for symmetry between a left sound and a right sound. The second enclosure member 630 may have a symmetrical structure with the first enclosure member 610 with respect to a first center line CL1 of the display member 200.

The second enclosure member 630 may limit (or define) a vibration region (or a vibration area) of the display member 200 based on the second vibration apparatus 530. For example, in the second portion P2 of the display member 200, as a size of the second enclosure member 630 increases, a vibration region of the second portion P2 may increase. Thus, a low-pitched sound band characteristic of a right sound may be enhanced. As another example embodiment of the present disclosure, in the second portion P2 of the display member 200, as a size of the second enclosure member 630 decreases, the vibration region of the second portion P2 may decrease. Thus, a high-pitched sound band characteristic of the right sound may be enhanced. Accordingly, a size of the second enclosure member 630 may be set based on a desired characteristic of a pitched sound band based on a vibration of the display member 200 based on a vibration of the second vibration apparatus 530.

The first enclosure member 610 and the second enclosure member 630 may respectively define or limit vibration regions (or vibration areas) of the first and second vibration apparatuses 510 and 530. Thus, horizontal symmetry between the left sound and the right sound generated based on a vibration of the display member 200 may be enhanced. Also, a sound pressure level characteristic and/or a reproduction pitched sound band of each of the left sound and the right sound may be optimized.

According to an example embodiment of the present disclosure, the plates 511 and 531, the vibration generators 513 and 533, and the enclosure members 610 and 630 may configure a vibration generating apparatus. For example, the first plate 511, the first vibration generator 513, and the first enclosure member 610 may configure a first vibration generating apparatus. For example, the second plate 531, the second vibration generator 533, and the second enclosure member 630 may configure a second vibration generating apparatus.

According to an example embodiment of the present disclosure, because an enclosure member 600 is provided, an air impedance of the corresponding vibration apparatus 500 may be controlled, thereby providing an apparatus enabling a pitched sound band to extend. Also, an electronic apparatus according to an example embodiment of the present disclosure may include a film type vibration apparatus. Also, an apparatus having enhanced sound pressure level characteristic and/or sound characteristic including a high-pitched sound band may be provided. In addition, a thickness of the apparatus may be reduced, thereby providing an apparatus having a slim structure.

Figure 5:
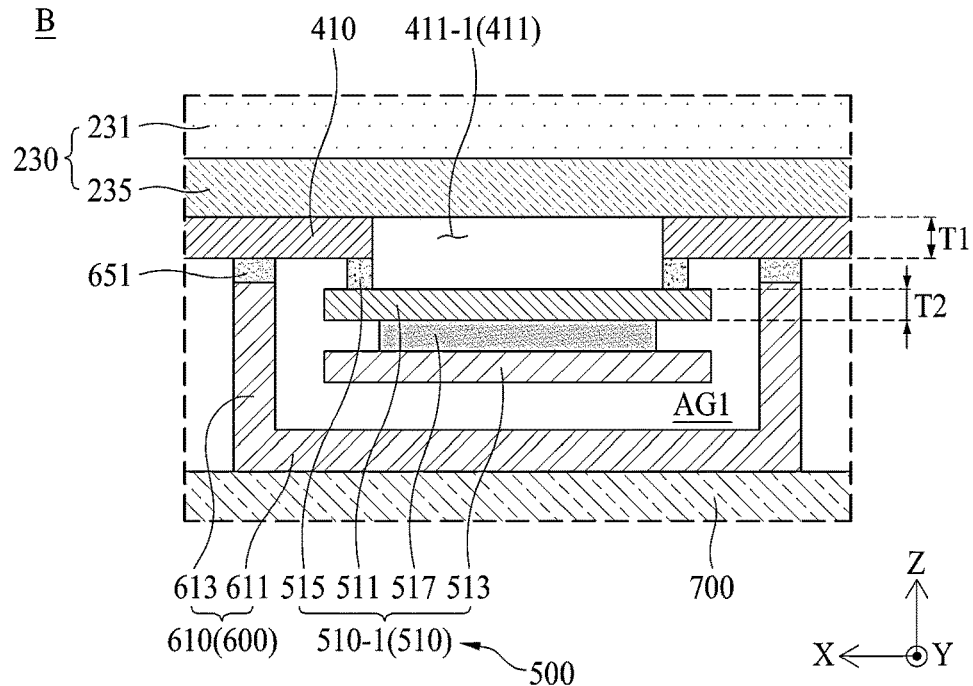
FIG. 5 is an enlarged view of a region "B" illustrated in FIG. 3.
Figure 6:
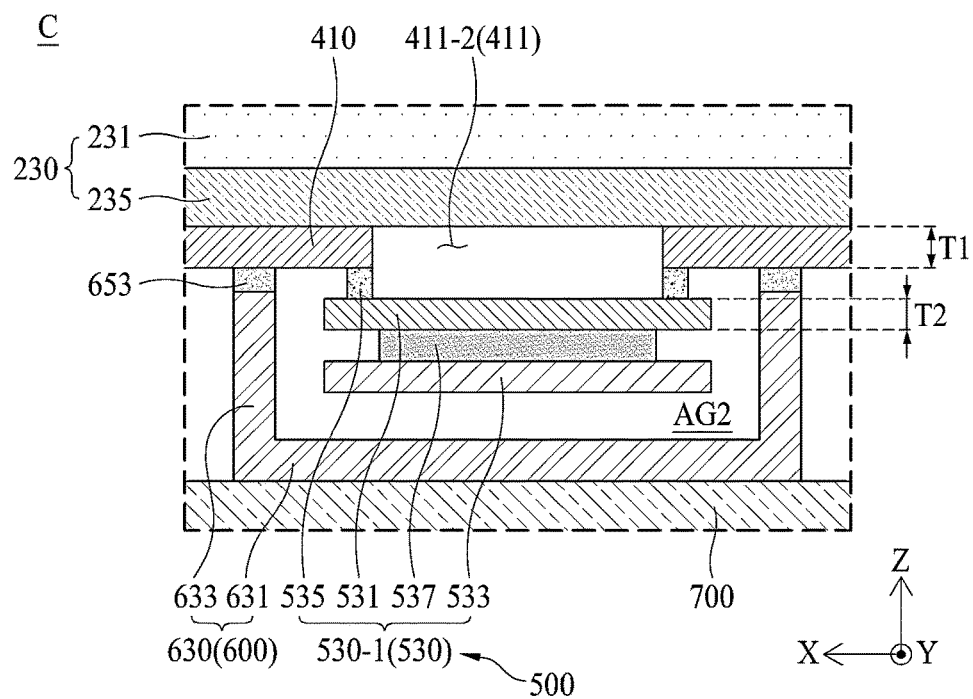
FIG. 6 is an enlarged view of a region "C" illustrated in FIG. 3.

FIG. 5 is an enlarged view of a region "B" illustrated in FIG. 3. FIG. 6 is an enlarged view of a region "C" illustrated in FIG. 3.

As illustrated in FIGS. 5 and 6, the plates 511 and 531 may have a second thickness T2 which is smaller than a first thickness T1 of the rear portion 410 of the first cover 400. Therefore, the vibration apparatuses 510 and 530 may enhance a sound S of a middle-high-pitched sound band where one or both of a sound pressure level characteristic and sound quality may be at least suitable. In the event that the second thickness T2 of the plates 511 and 531 is thicker than the first thickness T1 of the rear portion 410, vibrations of the vibration generators 513 and 533 may not sufficiently propagate to inner regions of the first and second holes 411-1 and 411-2 of the rear portion 410 of the first cover 400. The plates 511 and 531 may vibrate based on vibrations of the vibration generators 513 and 533 to generate a sound (or a sound pressure level) of a middle-high-pitched sound band of 3 kHz or more, and the generated sound may propagate to the inner regions of the first and second holes 411-1 and 411-2.

According to an example embodiment of the present disclosure, the first enclosure member 610 may independently cover the first vibration apparatus 510 (in FIG. 5, the first vibration device 510-1) and may cover the first hole 411-1 disposed at the rear portion 410 of the first cover 400. Therefore, a first air gap AG1 may be provided at the first enclosure member 610. For example, an inner portion of the first enclosure member 610 may include a single space and may include two or more divided spaces. In the event that the first enclosure member 610 includes the two or more divided spaces, an inner region of the apparatus may be used. In the event that the first enclosure member 610 includes the two or more divided spaces, the two or more spaces may be connected (or communicated) to one another through a pipeline. For example, the first enclosure member 610 may have a sealed structure or a structure including a vent hole (for example, a vent structure).

According to an example embodiment of the present disclosure, the first enclosure member 610 may be disposed at the rear surface of the rear portion 410 of the first cover 400. For example, the first enclosure member 610 may be disposed at the rear surface of the rear portion 410 of the first cover 400 by a tenth connection member 651.

The first enclosure member 610 according to an example embodiment of the present disclosure may include a bottom portion 611 and a lateral portion 613.

According to an example embodiment of the present disclosure, the bottom portion 611 of the first enclosure member 610 may be disposed at the rear surface of a first vibration apparatus 510 (in FIG. 5, the first vibration device 510-1) and may cover the rear surface of the first vibration apparatus 510. For example, the lateral portion 613 of the first enclosure member 610 may be disposed at a lateral surface of the first vibration apparatus 510 and may cover a lateral surface of the first vibration apparatus 510. For example, the lateral portion 613 may be connected to one side (or an end) of the bottom portion 611 and may be disposed along a periphery of the bottom portion 611. For example, one side (or one end) of the lateral portion 613 may be disposed at the rear surface of the rear portion 410 of the first cover 400 by the tenth connection member 651. For example, the bottom portion 611 of the first enclosure member 610 may be referred to as a first bottom frame or a first bottom member, but embodiments of the present disclosure are not limited thereto. For example, the lateral portion 613 of the first enclosure member 610 may be referred to as a sidewall portion, a first lateral frame, a first sidewall frame, or a first sidewall member, but embodiments of the present disclosure are not limited thereto.

The first enclosure member 610 may limit (or define) a vibration region (or a vibration area) of the display member 200 based on the first vibration apparatus 510 (or the first vibration device 510-1). For example, in the first portion P1 of the display member 200, as a size of the first enclosure member 610 increases, a vibration region of the first portion P1 may increase. Thus, a low-pitched sound band characteristic of a left sound may be enhanced. As another example embodiment of the present disclosure, in the first portion P1 of the display member 200, as a size of the first enclosure member 610 decreases, the vibration region of the first portion P1 may decrease. Thus, a high-pitched sound band characteristic of the left sound may be enhanced. For example, a size of the first enclosure member 610 may be set based on a desired characteristic of a pitched sound band based on a vibration of the display member 200 based on a vibration of the first vibration apparatus 510 (or the first vibration device 510-1).

According to an example embodiment of the present disclosure, the second enclosure member 630 may independently cover the second vibration apparatus 530 (in FIG. 6, the second vibration device 530-1) and may cover the second hole 411-2 disposed at the rear portion 410 of the first cover 400. Therefore, a second air gap AG2 may be provided at the second enclosure member 630. For example, an inner portion of the second enclosure member 630 may include a single space and may include two or more divided spaces. In the event that the second enclosure member 630 includes the two or more divided spaces, an inner region of the apparatus may be used. When the second enclosure member 630 includes the two or more divided spaces, the two or more spaces may be connected (or communicated) to one another through a pipeline. For example, the second enclosure member 630 may have a sealed structure or a structure including a vent hole (for example, a vent structure).

According to an example embodiment of the present disclosure, the second enclosure member 630 may be disposed at the rear surface of the rear portion 410 of the first cover 400. For example, the second enclosure member 630 may be disposed at the rear surface of the rear portion 410 of the first cover 400 by using an eleventh connection member 653.

The second enclosure member 630 according to an example embodiment of the present disclosure may have the same shape as that of the first enclosure member 610, for symmetry between a left sound and a right sound. The second enclosure member 630 also may have a symmetrical structure with the first enclosure member 610 with respect to a first center line CL1 of the display member 200.

The second enclosure member 630 according to an example embodiment of the present disclosure may include a bottom portion 631 and a lateral portion 633.

According to an embodiment of the present disclosure, the bottom portion 631 of the second enclosure member 630 may be disposed at the rear surface of the second vibration apparatus 530 (in FIG. 6, the second vibration device 530-1) and may cover the rear surface of the second vibration apparatus 530. For example, the lateral portion 633 of the second enclosure member 630 may be disposed at a lateral surface of the second vibration apparatus 530 and may cover a lateral surface of the second vibration apparatus 530. For example, the lateral portion 633 may be connected to one side (or an end) of the bottom portion 631 and may be disposed along a periphery of the bottom portion 631. For example, one side (or one end) of the lateral portion 633 may be disposed at the rear surface of the rear portion 410 of the first cover 400 by the eleventh connection member 653. For example, the bottom portion 631 of the second enclosure member 630 may be referred to as a second bottom frame or a second bottom member, but embodiments of the present disclosure are not limited thereto. For example, the lateral portion 633 of the second enclosure member 630 may be referred to as a sidewall portion, a second lateral frame, a second sidewall frame, or a second sidewall member, but embodiments of the present disclosure are not limited thereto.

The second enclosure member 630 may limit (or define) a vibration region (or a vibration area) of the display member 200 based on the second vibration apparatus 530 (in FIG. 6, the second vibration device 530-1). For example, in the second portion P2 of the display member 200, as a size of the second enclosure member 630 increases, a vibration region of the second portion P2 may increase. Thus, a low-pitched sound band characteristic of a right sound may be enhanced. As another example embodiment of the present disclosure, in the second portion P2 of the display member 200, as a size of the second enclosure member 630 decreases, the vibration region of the second portion P2 may decrease. Thus, a high-pitched sound band characteristic of the right sound may be enhanced. For example, a size of the second enclosure member 630 may be set based on a desired characteristic of a pitched sound band based on a vibration of the display member 200 based on a vibration of the vibration apparatus 530.

The first enclosure member 610 and the second enclosure member 630 may limit a vibration region (or a vibration area) of the first and second vibration apparatuses 510 and 530, respectively. Thus, a horizontal symmetry between the left sound and the right sound generated based on a vibration of the display member 200 may be enhanced, and a sound pressure level characteristic and/or a reproduction pitched sound band of each of the left sound and the right sound may be optimized.

According to an example embodiment of the present disclosure, the plates 511 and 531, the vibration generators 513 and 533, and the enclosure members 610 and 630 may configure one or more vibration generating apparatuses. For example, the first plate 511, the first vibration generator 513, and the first enclosure member 610 may configure a first vibration generating apparatus. For example, the second plate 531, the second vibration generator 533, and the second enclosure member 630 may configure a second vibration generating apparatus.

Figure 7:
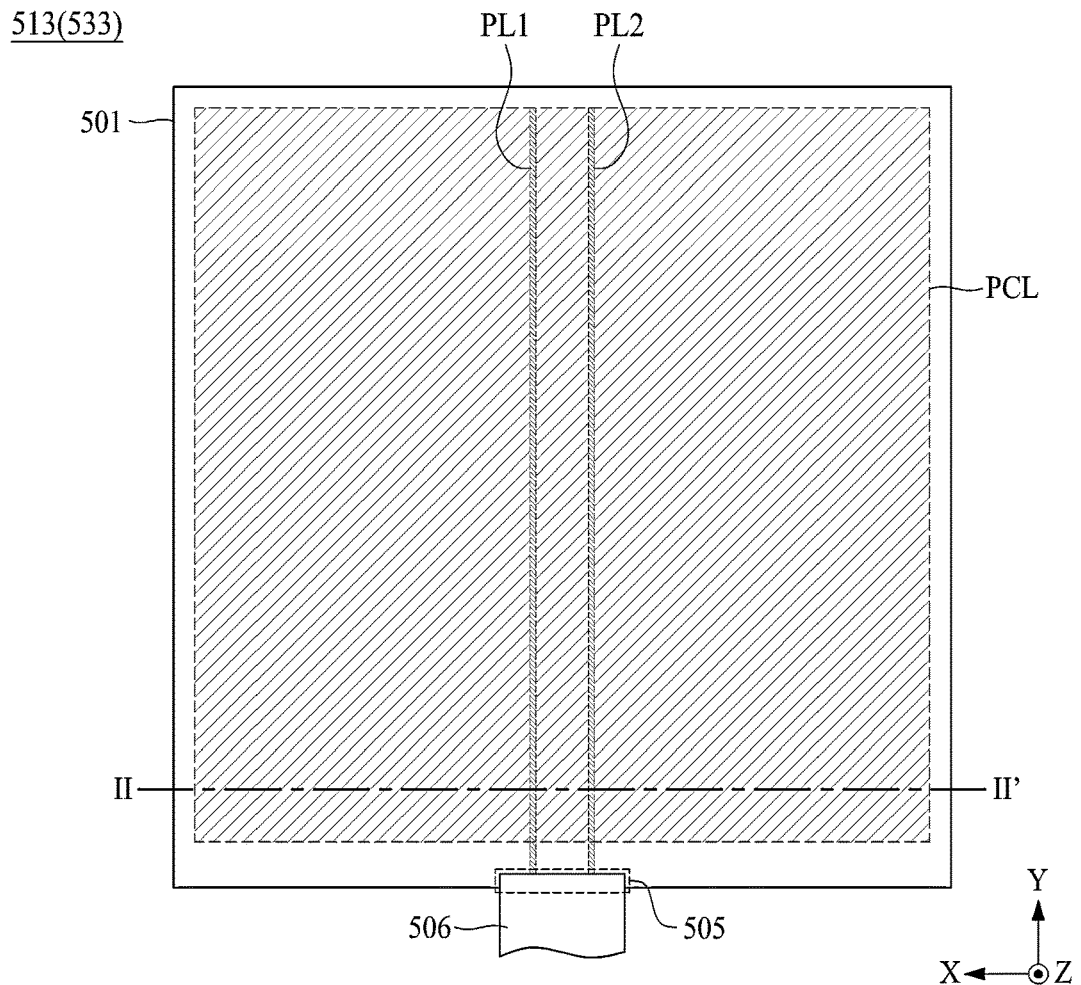
FIG. 7 illustrates a vibration generator according to an example embodiment of the present disclosure.
Figure 8:
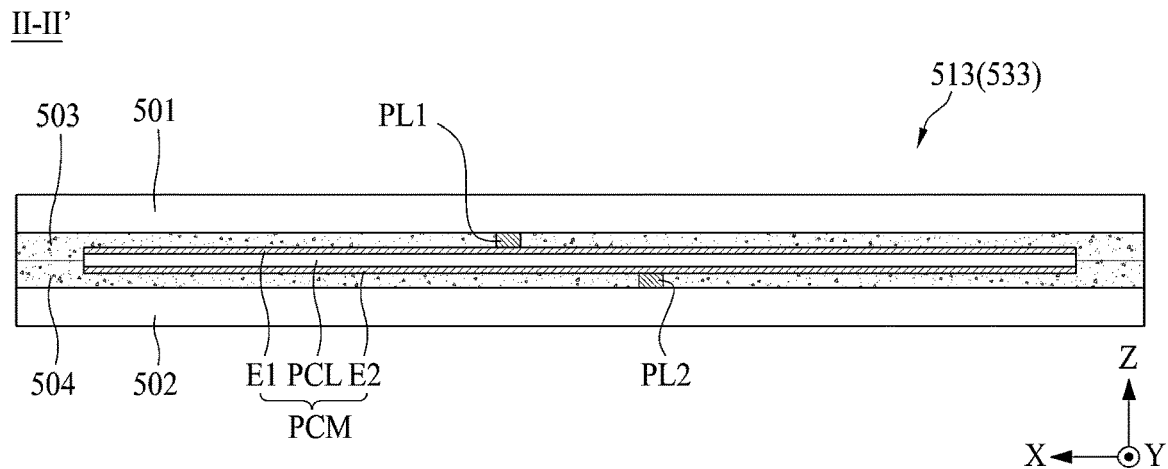
FIG. 8 is a cross-sectional view taken along line II-IF illustrated in FIG. 7.

FIG. 7 illustrates a vibration generator according to an example embodiment of the present disclosure. FIG. 8 is a cross-sectional view taken along line II-IF illustrated in FIG. 7.

As illustrated in FIGS. 7 and 8, each of the vibration generators 513 and 533 according to an example embodiment of the present disclosure may alternately and/or repeatedly contract and expand based on a piezoelectric effect (or a piezoelectric characteristic) to vibrate. For example, each of the vibration generators 513 and 533 may alternately and/or repeatedly contract and expand based on an inverse piezoelectric effect to vibrate in a thickness direction Z, thereby directly vibrating the display member 200. For example, each of the vibration generators 513 and 533 may have a tetragonal shape or a square shape, but embodiments of the present disclosure are not limited thereto.

Each of the vibration generators 513 and 533 according to an example embodiment of the present disclosure may include a vibration portion (or a vibration layer) PCL, a first electrode layer E1, and a second electrode layer E2. For example, a structure including the vibration portion PCL, the first electrode layer E1, and the second electrode layer E2 may be referred to as a vibration device (or a vibrator) PCM.

The vibration portion PCL may include a piezoelectric material, a composite piezoelectric material, or an electroactive material. The piezoelectric material, the composite piezoelectric material, and the electroactive material may have a piezoelectric effect. The vibration portion PCL may be referred to as a vibration layer, a piezoelectric material layer, a piezoelectric composite layer, an electroactive layer, a piezoelectric material portion, a piezoelectric composite layer, an electroactive portion, a piezoelectric structure, a piezoelectric composite, or a piezoelectric ceramic composite, but embodiments of the present disclosure are not limited thereto.

The vibration portion PCL according to an example embodiment of the present disclosure may include a ceramic-based material capable of realizing a relatively high vibration. For example, the vibration portion PCL may include a 1-3 composite structure or a 2-2 composite structure. For example, a piezoelectric deformation coefficient "$d_{33}$" of the vibration portion PCL in a thickness direction Z may have 1,000 pC/N or more, but embodiments of the present disclosure are not limited thereto.

The first electrode layer E1 may be disposed at a first surface (or an upper or front surface) of the vibration portion PCL and may be electrically connected to the first surface of the vibration portion PCL. For example, the first electrode layer E1 may have a single-body electrode shape (or a common electrode shape) which is disposed at a whole first surface of the vibration portion PCL. The first electrode layer E1 according an example embodiment of the present disclosure may include a transparent conductive material, a semitransparent (or translucent) conductive material, or an opaque conductive material. For example, examples of the transparent conductive material or the semitransparent conductive material may include indium tin oxide (ITO) or indium zinc oxide (IZO), but embodiments of the present disclosure are not limited thereto. The opaque conductive material may include aluminum (Al), copper (Cu), gold (Au), silver (Ag), molybdenum (Mo), magnesium (Mg), or the like, or an alloy of any of these materials. However, embodiments of the present disclosure are not limited thereto.

The second electrode layer E2 may be at a second surface (or a lower or rear surface) opposite to the first surface of the vibration portion PCL and may be electrically connected to the second surface of the vibration portion PCL. For example, the second electrode layer E2 may have a single-body electrode shape (or a common electrode shape) which is disposed at a whole second surface of the vibration portion PCL. The second electrode layer E2 according to an example embodiment of the present disclosure may include a transparent conductive material, a semitransparent conductive material, or an opaque conductive material. For example, the second electrode layer E2 may include the same material as the first electrode layer E1, but embodiments of the present disclosure are not limited thereto. As another example embodiment of the present disclosure, the second electrode layer E2 may include a material different from the first electrode layer E1.

The vibration portion PCL may be polarized (or poling) by a certain voltage applied to the first electrode layer E1 and the second electrode layer E2 in a certain temperature atmosphere, or in a temperature atmosphere that may be changed from a high temperature to a room temperature. However, embodiments of the present disclosure are not limited thereto.

Each of the vibration generators 513 and 533 according to an example embodiment of the present disclosure may further include a first protection member 501 and a second protection member 502.

The first protection member 501 may be disposed at the first surface of the vibration device PCM. For example, the first protection member 501 may cover the first electrode layer E1 disposed at the first surface of the vibration device PCM. Thus, the first protection member 501 may support the first surface of the vibration device PCM and may protect the first surface of the vibration device PCM or the first electrode layer E1.

The first protection member 501 according to an example embodiment of the present disclosure may be disposed at the first surface of the vibration device PCM by a first adhesive layer 503. For example, the first protection member 501 may be connected or attached to the first surface of the vibration device PCM by a film laminating process using the first adhesive layer 503.

The second protection member 502 may be disposed at the second surface of the vibration device PCM. For example, the second protection member 502 may cover the second electrode layer E2 disposed at the second surface of the vibration device PCM. Thus, the second protection member 502 may support the second surface of the vibration device PCM and may protect the second surface of the vibration device PCM or the second electrode layer E2.

The second protection member 502 may be disposed at the second surface of the vibration device PCM by a second adhesive layer 504. For example, the second protection member 502 may be connected or attached to the second surface of the vibration device PCM by a film laminating process using the second adhesive layer 504.

Each of the first protection member 501 and the second protection member 502 according to an example embodiment of the present disclosure may include a plastic film. For example, each of the first protection member 501 and the second protection member 502 may be a polyimide (PI) film or a polyethyleneterephthalate (PET) film, but embodiments of the present disclosure are not limited thereto.

The first adhesive layer 503 may be disposed at the first surface of the vibration device PCM. For example, the first adhesive layer 503 may be formed at a rear surface (or an inner surface) of the first protection member 501 facing the first surface of the vibration device PCM and disposed at the first surface of the vibration device PCM.

The second adhesive layer 504 may be disposed at the second surface of the vibration device PCM. For example, the second adhesive layer 504 may be formed at a front surface (or an inner surface) of the second protection member 502 facing the second surface of the vibration device PCM and disposed at the second surface of the vibration device PCM.

The vibration device PCM may be surrounded by the first and second adhesive layers 503 and 504. For example, the first and second adhesive layers 503 and 504 may entirely surround the whole vibration device PCM. For example, the first and second adhesive layers 503 and 504 may be referred to as a cover member, or the like, but embodiments of the present disclosure are not limited thereto. Where each of the first and second adhesive layers 503 and 504 collectively form a cover member, the first protection member 501 may be disposed at a first surface of the cover member, and the second protection member 502 may be disposed at a second surface of the cover member. For example, for convenience of description, the first and second adhesive layers 503 and 504 are illustrated as first and second adhesive layers 503 and 504. However, embodiments of the present disclosure are not limited thereto, and they may be provided as one adhesive layer.

Each of the first and second adhesive layers 503 and 504 according to an example embodiment of the present disclosure may include an electrically insulating material having adhesiveness and may include a material capable of compression and decompression. For example, each of the first and second adhesive layers 503 and 504 may include an epoxy resin, an acrylic resin, a silicone resin, or a urethane resin, but embodiments of the present disclosure are not limited thereto.

Each of the vibration generators 513 and 533 according to an example embodiment of the present disclosure may further include a first power supply line PL1, a second power supply line PL2, and a pad part 505.

The first power supply line PL1 may be disposed at the first protection member 501. For example, the first power supply line PL1 may be disposed at a rear surface of the first protection member 501 facing the first surface of the vibration device PCM. The first power supply line PL1 may be electrically connected to the first electrode layer E1 of the vibration device PCM. For example, the first power supply line PL1 may be directly and electrically connected to the first electrode layer E1 of the vibration device PCM. For example, the first power supply line PL1 may be electrically connected to the first electrode layer E1 of the vibration device PCM by an anisotropic conductive film. As another example embodiment of the present disclosure, the first power supply line PL1 may be electrically connected to the first electrode layer E1 of the vibration device PCM by a conductive material (or particle) included in the first adhesive layer 503.

The second power supply line PL2 may be disposed at the second protection member 502. For example, the second power supply line PL2 may be disposed at a front surface of the second protection member 502 facing the second surface of the vibration device PCM. The second power supply line PL2 may be electrically connected to the second electrode layer E2 of the vibration device PCM. For example, the second power supply line PL2 may be directly and electrically connected to the second electrode layer E2 of the vibration device PCM. For example, the second power supply line PL2 may be electrically connected to the second electrode layer E2 of the vibration device PCM by an anisotropic conductive film. As another example embodiment of the present disclosure, the second power supply line PL2 may be electrically connected to the second electrode layer E2 of the vibration device PCM by a conductive material (or particle) included in the second adhesive layer 504.

The pad part 505 may be electrically connected to the first power supply line PL1 and the second power supply line PL2. For example, a pad part 505 may be disposed at each of the vibration generators 513 and 533 to be electrically connected to one portion (or one end) of each of the first power supply line PL1 and the second power supply line PL2. The pad part 505 according to an example embodiment of the present disclosure may include a first pad electrode and a second pad electrode. The first pad electrode may be electrically connected to one portion of the first power supply line PL1. The second pad electrode may be electrically connected to one portion of the second power supply line PL2.

Each of the vibration generators 513 and 533 according to an embodiment of the present disclosure may further include a flexible cable 506.

The flexible cable 506 may be electrically connected to the pad part 505 disposed at the vibration generators 513 and 533 and may supply a driving signal (or a sound signal) provided from a sound processing circuit to the vibration device PCM. The flexible cable 506 according to an example embodiment of the present disclosure may include a first terminal and a second terminal. A first terminal may be electrically connected to the first pad electrode of the pad part 505. The second terminal may be electrically connected to the second pad electrode of the pad part 505. For example, the flexible cable 506 may be configured as a flexible printed circuit cable or a flexible flat cable, but embodiments of the present disclosure are not limited thereto.

The sound processing circuit (or a vibration driving circuit) may generate an alternating current (AC) vibration driving signal including a first polarity driving signal and a second polarity driving signal based on a sound source. The first polarity driving signal may be one of a positive (+) driving signal and a negative (−) driving signal, and the second polarity driving signal may be one of a positive (+) driving signal and a negative (−) driving signal. For example, the first polarity driving signal may be supplied to the first electrode layer E1 of each of the vibration generators 513 and 533 through the first terminal of the flexible cable 506, the first pad electrode of the pad part 505, and the first power supply line PL1. The second polarity driving signal may be supplied to the second electrode layer E2 of each of the vibration generators 513 and 533 through the second terminal of the flexible cable 506, the second pad electrode of the pad part 505, and the second power supply line PL2.

FIGS. 9A to 9F illustrate a vibration portion of a vibration generator according to example embodiments of the present disclosure.

The vibration portion PCL according to example embodiments of the present disclosure may include a plurality of first portions PCLa and a plurality of second portions PCLb between the plurality of first portions PCLa. The first portion PCLa may include an inorganic material, and the second portion PCLb may include an organic material. The first portion PCLa and the second portion PCLb may be connected to each other on a plane. Thus, the first and second, vibration apparatuses 510 and 530 (including, e.g., the first vibration device 510-1 and the second vibration device 530-1) may be implemented as one film. Based on such a configuration, since the first and second vibration apparatuses 510 and 530 may be implemented as one film, the first and second vibration apparatuses 510 and 530 having a small thickness may be implemented in comparison to a structure where a plurality of piezoelectric elements are stacked. Accordingly, an increase in thickness of a display apparatus caused by the arrangement of the first and second vibration apparatuses 510 and 530 may be reduced.

Each of the plurality of first portions PCLa according to example embodiments of the present disclosure may include an inorganic material or a piezoelectric material and may vibrate based on a piezoelectric effect (or a piezoelectric characteristic) caused by an electric field. For example, each of the plurality of first portions PCLa may be referred to as an electroactive portion, an inorganic material portion, a piezoelectric material portion, or a vibration portion, or the like, but embodiments of the present disclosure are not limited thereto.

According to example embodiments of the present disclosure, each of the plurality of first portions PCLa may include a ceramic-based material configured to generate a relatively high vibration or may include a piezoelectric ceramic having a perovskite-based crystalline structure. The perovskite crystalline structure may have a piezoelectric effect and an inverse piezoelectric effect, and may be a structure having an orientation. The perovskite crystalline structure may be represented by a chemical formula "$ABO_3$". In the chemical formula, "A" may include a divalent metal element, and "B" may include a tetravalent metal element. For example, in the chemical formula "$ABO_3$", "A" and "B" may be cations, and "O" may be anions. For example, the chemical formula "$ABO_3$" may include at least one or more of lead(II) titanate ($PbTiO_3$), lead zirconate ($PbZrO_3$), barium titanate ($BaTiO_3$), and strontium titanate ($SrTiO_3$), but embodiments of the present disclosure are not limited thereto.

In an example where the perovskite crystalline structure includes a center ion (for example, $PbTiO_3$, e.g., lead (II) titanate, lead titanium oxide, or lead titanate with a perovskite structure), a position of a titanium (Ti) ion may be changed by an external stress or a magnetic field. Thus, polarization may be changed, thereby generating a piezoelectric effect. For example, in the perovskite crystalline structure, a cubic shape corresponding to a symmetric structure may be changed to a tetragonal (or quadrilateral), orthorhombic, or rhombohedral structure corresponding to an unsymmetric structure. Thus, a piezoelectric effect may be generated. In a tetragonal, orthorhombic, or rhombohedral structure corresponding to an unsymmetric structure, polarization may be relatively high in a morphotropic phase boundary, and realignment of polarization may be relatively easy, whereby the perovskite crystalline structure may have a relatively high piezoelectric characteristic.

For example, an inorganic material included in each of the plurality of first portions PCLa may include one or more materials of lead (Pb), zirconium (Zr), titanium (Ti), zinc (Zn), nickel (Ni), niobium (Nb), magnesium (Mg), manganese (Mn), and indium (In), but embodiments of the present disclosure are not limited thereto. For another example, the inorganic material included in each of the plurality of first portions PCLa may include a lead zirconate titanate (PZT)-based material, including lead (Pb), zirconium (Zr), and titanium (Ti), or may include a lead zirconate nickel niobate (PZNN)-based material, including lead (Pb), zirconium (Zr), nickel (Ni), and niobium (Nb). However, embodiments of the present disclosure are not limited thereto.

According to another example embodiment of the present disclosure, the inorganic material included in each of the plurality of first portions PCLa may include a lead magnesium niobate (PMN)-based material, a lead nickel niobate (PNN)-based material, a lead zirconate niobate (PZN)-based material, or a lead indium niobate (PIN)-based material, but embodiments of the present disclosure are not limited thereto. The PMN-based material may include Pb, Mg, and Nb, and for example, may include Pb(Mg, Nb)$O_3$. The PNN-based material may include Pb, Ni, and Nb, and for example, may include Pb(Ni, Nb)$O_3$. The PIN-based material may include Pb, In, and Nb, and for example, may include Pb(In, Nb)$O_3$. According to another example embodiment of the present disclosure, the inorganic material may include at least one or more of calcium titanate (CaTiO$_3$), BaTiO$_3$, and SrTiO$_3$ without Pb, but embodiments of the present disclosure are not limited thereto.

The plurality of second portions PCLb according to example embodiments of the present disclosure may have modulus (or Young's modulus) and viscoelasticity that are lower than those of the first portion PCLa. Thus, the second portions PCLb may enhance the reliability of the first portions PCLa vulnerable to an impact due to a relatively fragile characteristic. For the vibration apparatuses 510 and 530 to have an impact resistance and high stiffness, each of the plurality of second portions PCLb may include a material having a relatively high damping factor (tan δ) and relatively high stiffness. For example, each of the plurality of second portions PCLb may include a material having a damping factor (tan δ) of about 0.1 GPa (gigapascals) to about 1 GPa (gigapascals) and relatively high stiffness of about 0 GPa (gigapascals) to about 10 GPa (gigapascals). Also, a damping factor (tan δ) and a stiff characteristic may be described based on a correlation between a loss coefficient and modulus. For example, the plurality of second portions PCLb may include a material having a loss coefficient of about 0.01 to about 1.0 and modulus of about 0.1 GPa (gigapascals) to about 10 GPa (gigapascals).

The organic material in each of the plurality of second portions PCLb may include an organic material or an organic polymer having a flexible characteristic in comparison with the inorganic material of each of the first portions PCLa. For example, each of the plurality of second portions PCLb may include an organic material, an organic polymer, an organic piezoelectric material, or an organic non-piezoelectric material. For example, each of the plurality of second portions PCLb may be referred to as an adhesive portion, an elastic portion, a bending portion, a damping portion, or a flexible portion having flexibility, but embodiments of the present disclosure are not limited thereto.

An organic material according to an example embodiment of the present disclosure may include at least one of an organic piezoelectric material and an organic non-piezoelectric material.

An organic material including an organic piezoelectric material may absorb an impact applied to an inorganic material (or a first portion PCLa). Thus, the organic material portion may enhance the total durability of the first and second vibration apparatuses 510 and 530 and may provide a piezoelectric characteristic corresponding to a certain level or more. The organic piezoelectric material according to an example embodiment of the present disclosure may be an organic material having an electro active characteristic. An organic material including an organic non-piezoelectric material may be configured to include a curable resin composition and an adhesive including the curable resin composition. Thus, the organic material may absorb an impact applied to an inorganic material (or a first portion PCLa), thereby enhancing the total durability of the first and second vibration apparatuses 510 and 530. The organic non-piezoelectric material according to an example embodiment of the present disclosure may include at least one or more of an epoxy-based polymer, an acrylic-based polymer, and a silicone-based polymer, but embodiments of the present disclosure are not limited thereto.

According to an example embodiment of the present disclosure, an organic material including an organic non-piezoelectric material may include an adhesion promoter or an adhesion enhancing agent for adhesiveness between epoxy resin and an inorganic material portion, for a high stiffness characteristic for the vibration apparatuses 510 and 530. For example, the adhesion promoter may be phosphate or the like, but embodiments of the present disclosure are not limited thereto. The organic material may be cured by at least one of a thermal curing process and a photo-curing process. In a process of curing the organic material, a solvent free type epoxy resin may be used for avoiding or preventing reduction in the thickness uniformity of the vibration apparatuses 510 and 530 due to contraction of the organic material caused by volatilization of a solvent.

According to another example embodiment of the present disclosure, the organic material including the organic non-piezoelectric material may further include a reinforcing agent, e.g., for a damping characteristic in addition to high stiffness of the first and second vibration apparatuses 510 and 530. For example, the reinforcing agent may be methylmethacrylate-butadiene-styrene (MBS) or the like having a core shell type, and a content thereof may be about 5 wt % to about 40 wt %. The reinforcing agent may be an elastic body having the core shell type, and the shell portion may have a high coupling force to epoxy resin, such as an acrylic-based polymer. Thus, the reinforcing agent may enhance an impact resistance or a damping characteristic of the first and second vibration apparatuses 510 and 530.

The plurality of first portions PCLa and the plurality of second portions PCLb of the vibration portion PCL according to example embodiments of the present disclosure may be alternately and repeatedly arranged in a first direction X (or in a second direction Y). For example, the first direction X may be a widthwise direction of the vibration portion PCL, and the second direction Y may be a lengthwise direction of the vibration portion PCL. However, embodiments of the present disclosure are not limited thereto. For example, the first direction X may be the lengthwise direction of the vibration portion PCL, and the second direction Y may be the widthwise direction of the vibration portion PCL.

Figure 9A:
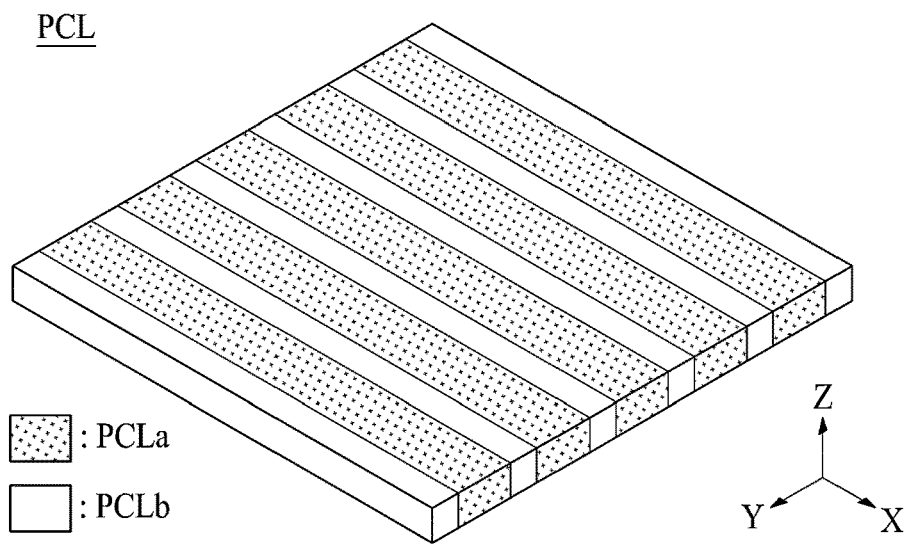
FIGS. 9A to 9F illustrate a vibration portion of a vibration generator according to example embodiments of the present disclosure.
Figure 9B:
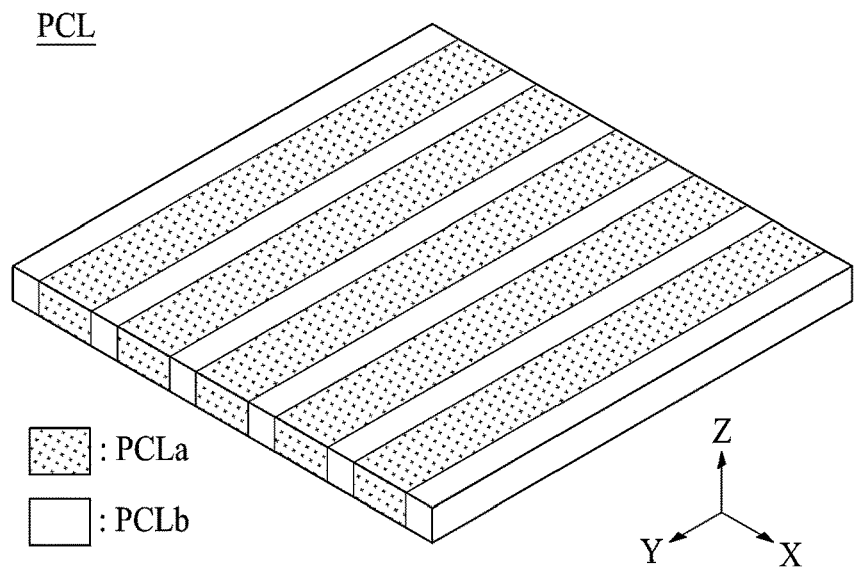

As illustrated in FIGS. 9A and 9B, each of a plurality of first portions PCLa may be disposed between two adjacent second portions PCLb of a plurality of second portions PCLb. For example, each of the plurality of first portions PCLa may have a first width parallel to a first direction X and may have a length parallel to a second direction Y. Each of the plurality of second portions PCLb may have a second width parallel to the first direction X and may have a length parallel to the second direction Y. For example, the first width may be greater than the second width. For example, the plurality of first portions PCLa and the plurality of second portions PCLb may have the same size (or width) or different sizes (or widths), may be alternately and repeatedly arranged in the first direction X (or in the second direction Y), and may have a line shape or a stripe shape. Therefore, a vibration portion PCL illustrated in FIGS. 9A and 9B may have a 2-2 composite structure and thus may have a resonance frequency of 20 kHz or less. However, embodiments of the present disclosure are not limited thereto, and a resonance frequency of the vibration portion PCL may vary based on at least one or more of a shape, a length, and a thickness of the vibration portion PCL.

Figure 9C:
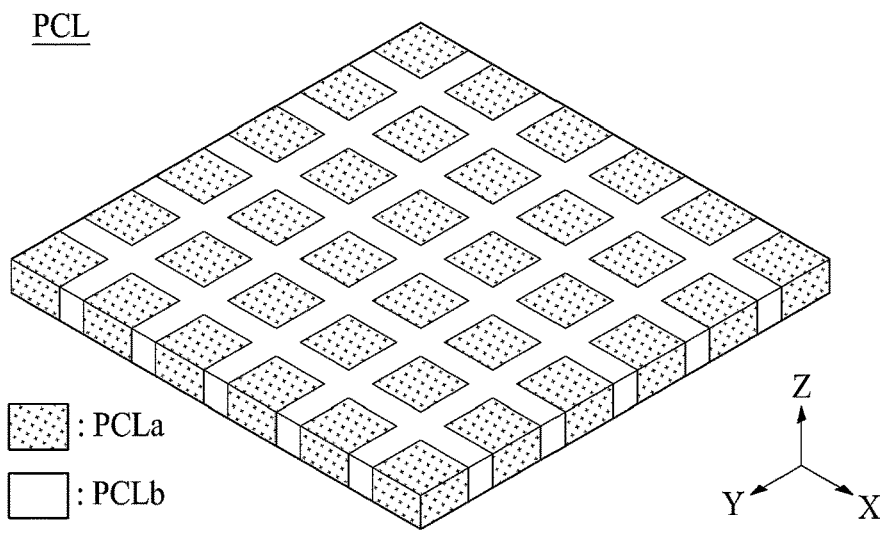
Figure 9D:
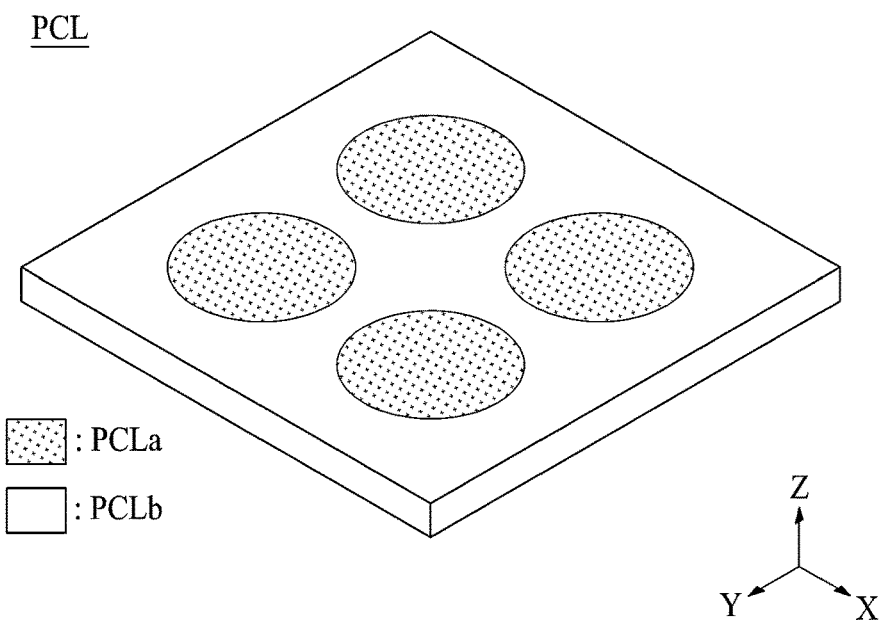
Figure 9E:
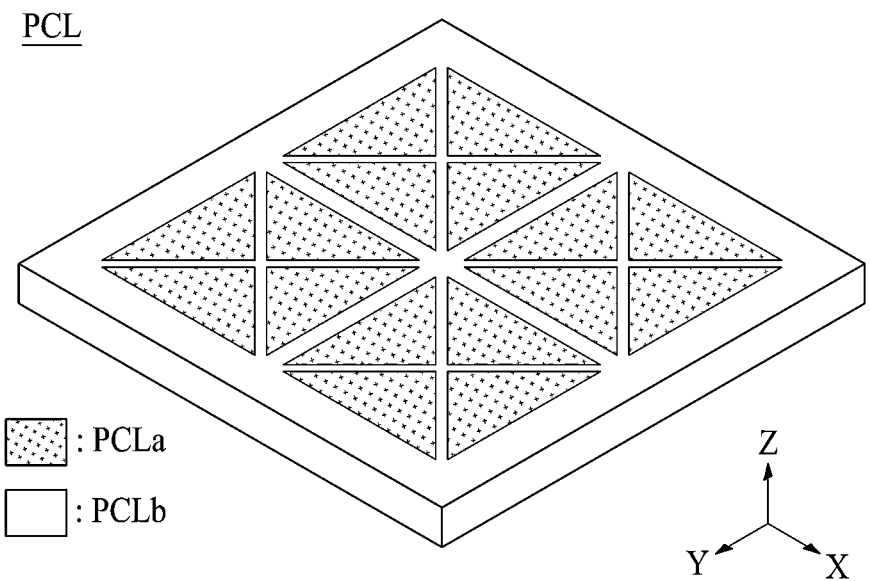
Figure 9F:
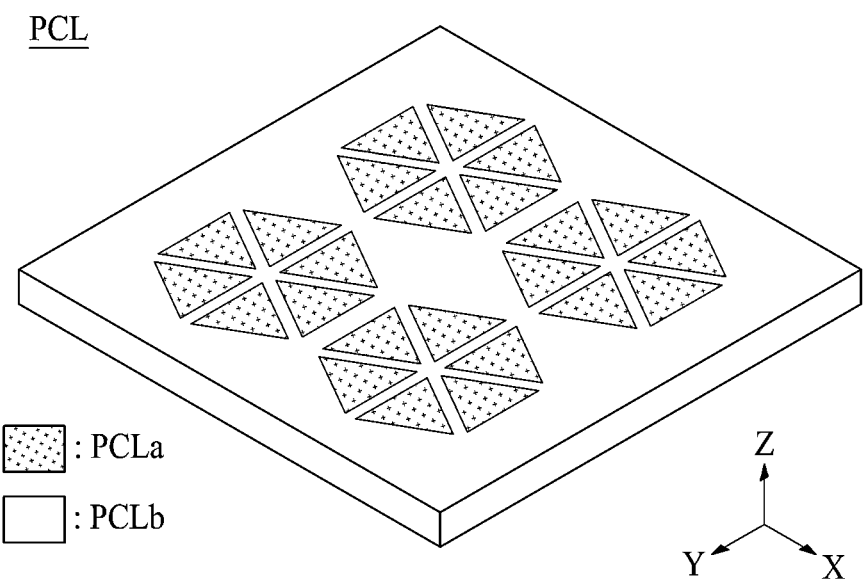

According to an example embodiment of the present disclosure, the plurality of first portions PCLa may be disposed spaced apart from one another along the first direction X and the second direction Y, and each of the plurality of second portions PCLb may be disposed to fill a gap between adjacent first portions PCLa or to surround each of the plurality of first portions PCLa (see, for example, FIGS. 9C, 9D, 9E, and 9F). For example, the plurality of first portions PCLa may be disposed in a lattice shape to have the same size (FIG. 9C). For example, the plurality of first portions PCLa may have a planar structure having a circular shape (FIG. 9D). For example, the plurality of first portions PCLa may have a circular shape (FIG. 9D), but embodiments of the present disclosure are not limited thereto. For example, the plurality of first portions PCLa may have a planar structure having an oval shape, a polygonal shape, or a donut shape. For example, the plurality of first portions PCLa may have a planar structure having a triangular shape (FIGS. 9E and 9F).

The plurality of first portions PCLa and the plurality of second portions PCLb may be disposed at (or connected to) the same plane. Thus, the vibration portion PCL according to various embodiments of the present disclosure may have a single thin film-type. For example, the vibration portion PCL may be vibrated in a vertical direction (or upper and lower direction or a thickness direction) by the first portions PCLa having a vibration characteristic and may be bent in a curved shape by the second portions PCLb having flexibility or ductility. Also, in the vibration portion PCL according to various embodiments of the present disclosure, a size of the first portion PCLa and a size of the second portion PCLb may be adjusted based on a piezoelectric characteristic and flexibility needed for the vibration portion PCL. For example, in a case where the vibration portion PCL needs a piezoelectric characteristic more than flexibility, a size of the first portion PCLa may be adjusted to be greater than the second portion PCLb. In another example embodiment of the present disclosure, in a case where the vibration portion PCL needs flexibility more than a piezoelectric characteristic, a size of the second portion PCLb may be adjusted to be greater than the first portion PCLa. Accordingly, a size of the vibration portion PCL may be adjusted based on a characteristic needed therefor. Thus, a design of the vibration portion PCL may be readily adjusted based on a particular need or application.

Figure 10:
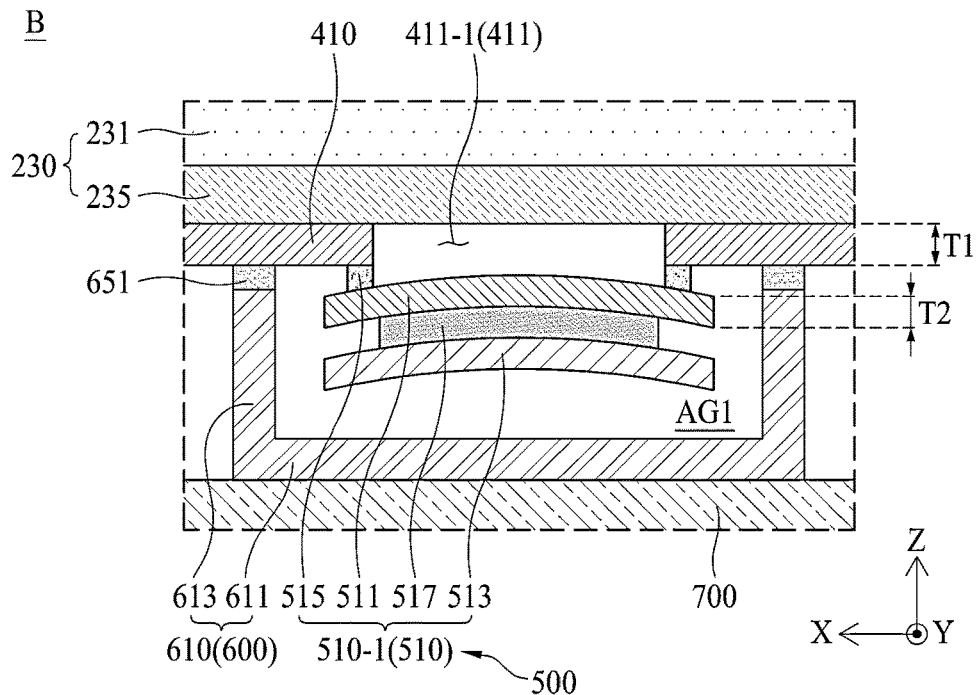
FIG. 10 is another enlarged view of a region "B" illustrated in FIG. 3.
Figure 11:
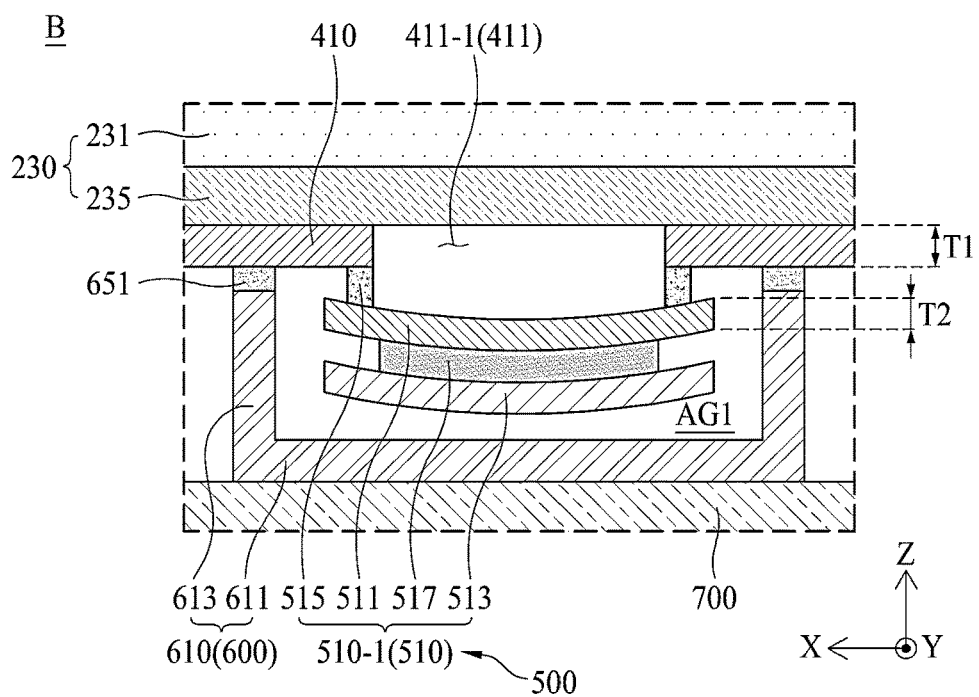
FIG. 11 is another enlarged view of a region "B" illustrated in FIG. 3.

FIGS. 10 and 11 are additional example enlarged views of a region "B" illustrated in FIG. 3.

FIGS. 10 and 11 illustrate example embodiments where the first plate 511 of the first vibration apparatus 510 (or the first vibration device 510-1) illustrated in FIG. 3 is modified. The following description may focus more on modified and relevant elements, and redundant descriptions of the same or similar elements discussed above may be briefly given or may be omitted. A description of the first plate 511 given above with reference to FIGS. 10 and 11 may be identically or similarly applied to the second plate 531 of the second vibration apparatus 530 (or the second vibration device 530-1).

As illustrated in FIGS. 10 and 11, a first plate 511 according to another example embodiment of the present disclosure may have a shape which is convexly or concavely bent. A bending direction of the first plate 511 may be one or more of a long-axis direction, a short-axis direction, and a diagonal direction. For example, a portion of the first plate 511 corresponding to (or overlapping) a first hole 411-1 may have a convex shape or a concave shape. For example, as illustrated in FIG. 10, a portion of the first plate 511 corresponding to (or overlapping) the first hole 411-1 may be bent toward the first hole 411-1. Alternatively, as illustrated in FIG. 11, a portion of the first plate 511 corresponding to (or overlapping) the first hole 411-1 may be bent away from or bent in an opposite direction of the first hole 411-1.

A second plate 531 according to another example embodiment of the present disclosure may have the same shape as that of the first plate 511. For example, the second plate 531 may have a shape which is convexly or concavely bent like the first plate 511. For example, a bending direction of the second plate 531 may be one or more of a long-axis direction, a short-axis direction, and a diagonal direction. For example, a portion of the second plate 531 corresponding to (or overlapping) a second hole 411-2 may have a convex shape or a concave shape. For example, a portion of the second plate 531 corresponding to (or overlapping) the second hole 411-2 may be bent toward the second hole 411-2. As another example, a portion of the second plate 531 corresponding to (or overlapping) the second hole 411-2 may be bent away from or bent in an opposite direction of the second hole 411-2.

Figure 12:
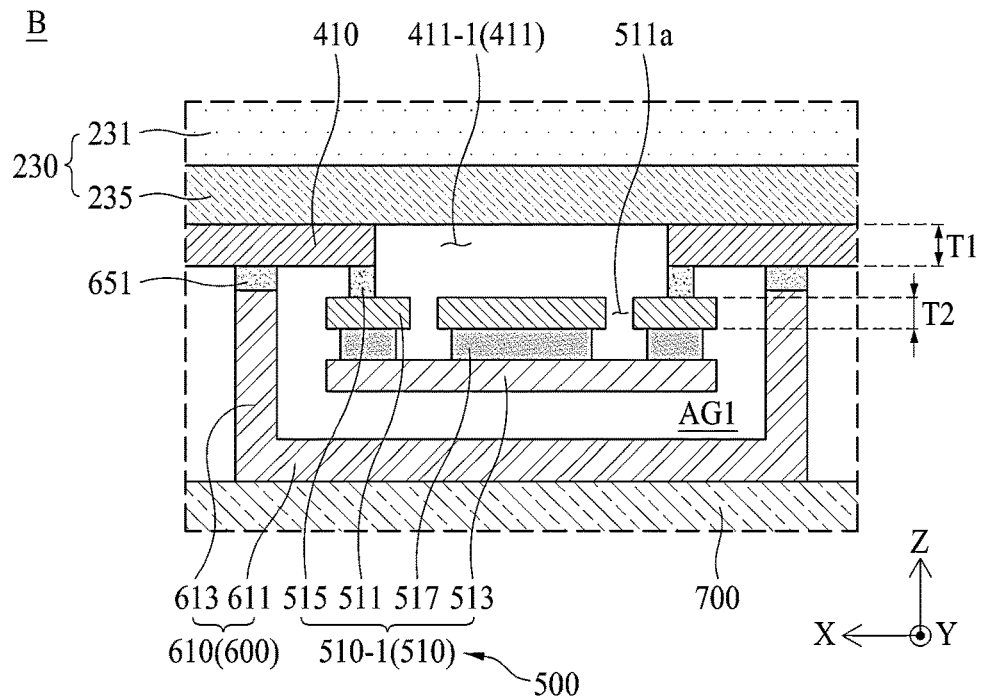
FIG. 12 is another enlarged view of a region "B" illustrated in FIG. 3.
Figure 13:
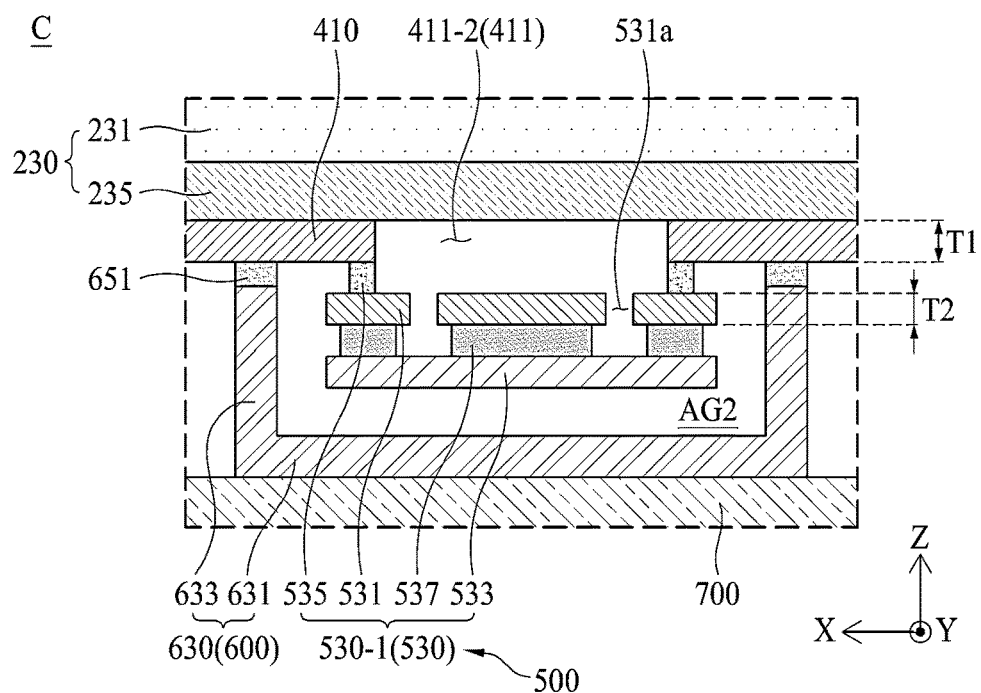
FIG. 13 is another enlarged view of a region "C" illustrated in FIG. 3.

FIG. 12 is another example enlarged view of the region "B" illustrated in FIG. 3. FIG. 13 is another example enlarged view of the region "C" illustrated in FIG. 3. FIG. 12 illustrates an example embodiment where the first plate 511 of the first vibration apparatus 510 (or the first vibration device 510-1) in FIG. 3 is modified. FIG. 13 illustrates an example embodiment where the second plate 531 of the second vibration apparatus 530 (or the second vibration device 530-1) in FIG. is modified 3. The following description may focus more on modified and relevant elements, and redundant descriptions of the same or similar elements discussed above may be briefly given or may be omitted.

As illustrated in FIGS. 12 and 13, a first plate 511 and a second plate 531 according to another example embodiment of the present disclosure may respectively include third and fourth holes 511a and 531a. For example, the third hole 511a of the first plate 511 illustrated in FIG. 12 may be applied to the first plate 511 of FIG. 10, and the fourth hole 531a of the second plate 531 illustrated in FIG. 13 may be applied to the second plate 531 illustrated in FIG. 11.

According to an example embodiment of the present disclosure, the third and fourth holes 511a and 531a may respectively be disposed at the plates 511 and 531 and correspond to (or overlapping) the first and second holes 411-1 and 411-2. For example, the third and fourth holes 511a and 531a may increase displacement amounts of the first and second vibration apparatuses 510 and 530, respectively. For example, the third and fourth holes 511a and 531a may be disposed based on a sound characteristic needed or suitable for the first and second vibration apparatuses 510 and 530, respectively. For example, the number, shapes, lengths, and widths of third and fourth holes 511a and 531a may be changed based on the sound characteristic needed or suitable for the first and second vibration apparatuses 510 and 530, respectively.

According to an example embodiment of the present disclosure, a total area of the third hole or holes 511a disposed at the first plate 511 of the first vibration apparatus 510 (or the first vibration device 510-1) may be the same as or different from a total area of the fourth hole or holes 531a disposed at the second plate 531 of the second vibration apparatus 530 (or the second vibration device 530-1).

According to an example embodiment of the present disclosure, the number, shape, length, and width of the third holes 511a disposed at the first plate 511 may be the same as the number, shape, length, and width of the fourth holes 531a disposed at the second plate 531. For example, at least one or more of the number, shape, length, and width of the third holes 511a may be the different from the number, shape, length, and width of the fourth holes 531a.

The third and fourth holes 511a and 531a may adjust displacement amounts of the first and second plates 511 and 531, respectively. Therefore, the third and fourth holes 511a and 531a may respectively be disposed in the plates 511 and 531 based on the sound characteristic needed or suitable for the first and second vibration apparatuses 510 and 530. Thus, the electronic apparatus may generate a sound having a desired sound characteristic.

According to an example embodiment of the present disclosure, the eighth and ninth connection members 517 and 537 may overlap or may not overlap the third and fourth holes 511a and 531a, respectively.

Figure 14:
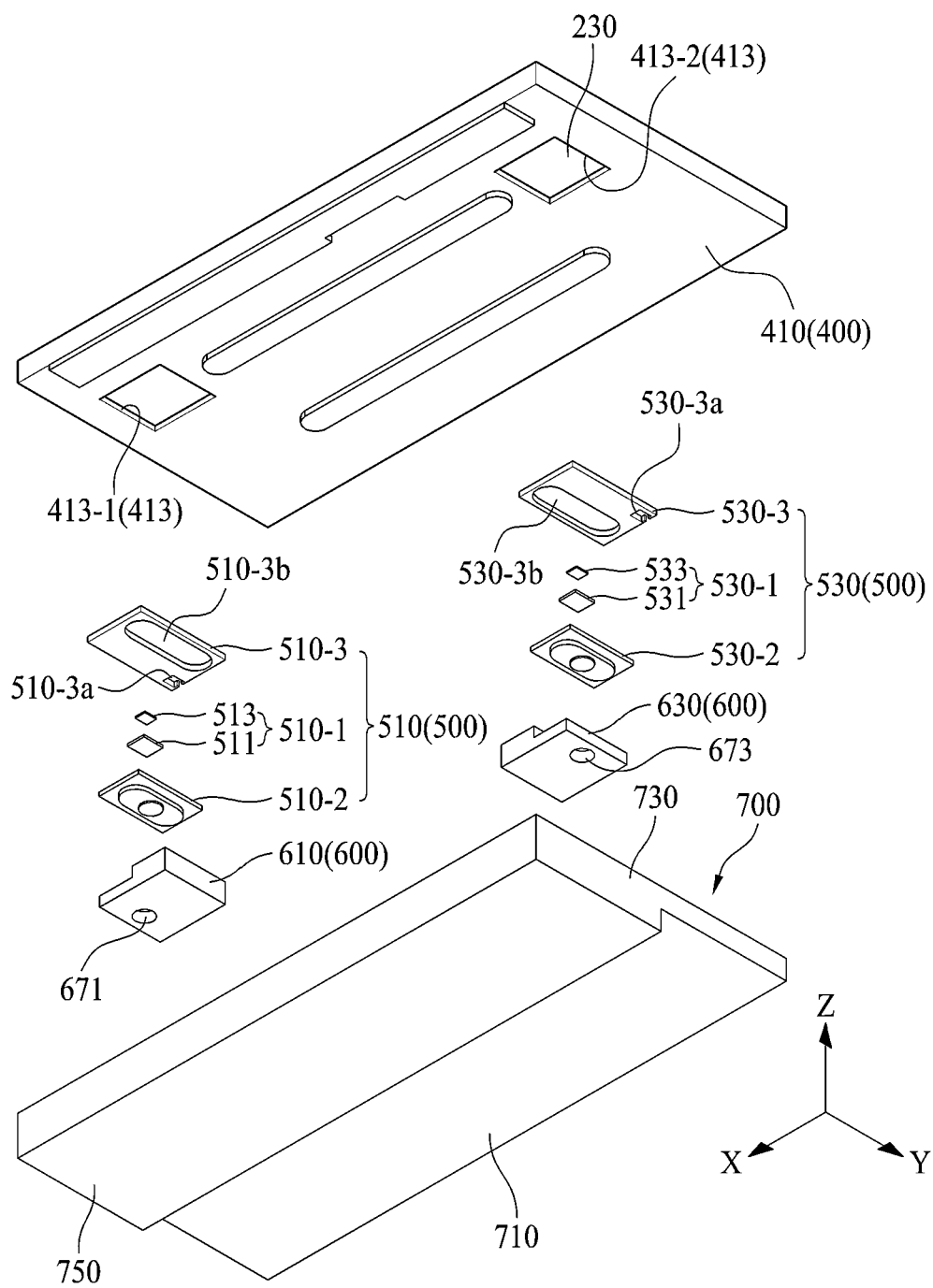
FIG. 14 is an exploded view of an electronic apparatus according to another example embodiment of the present disclosure.
Figure 15:
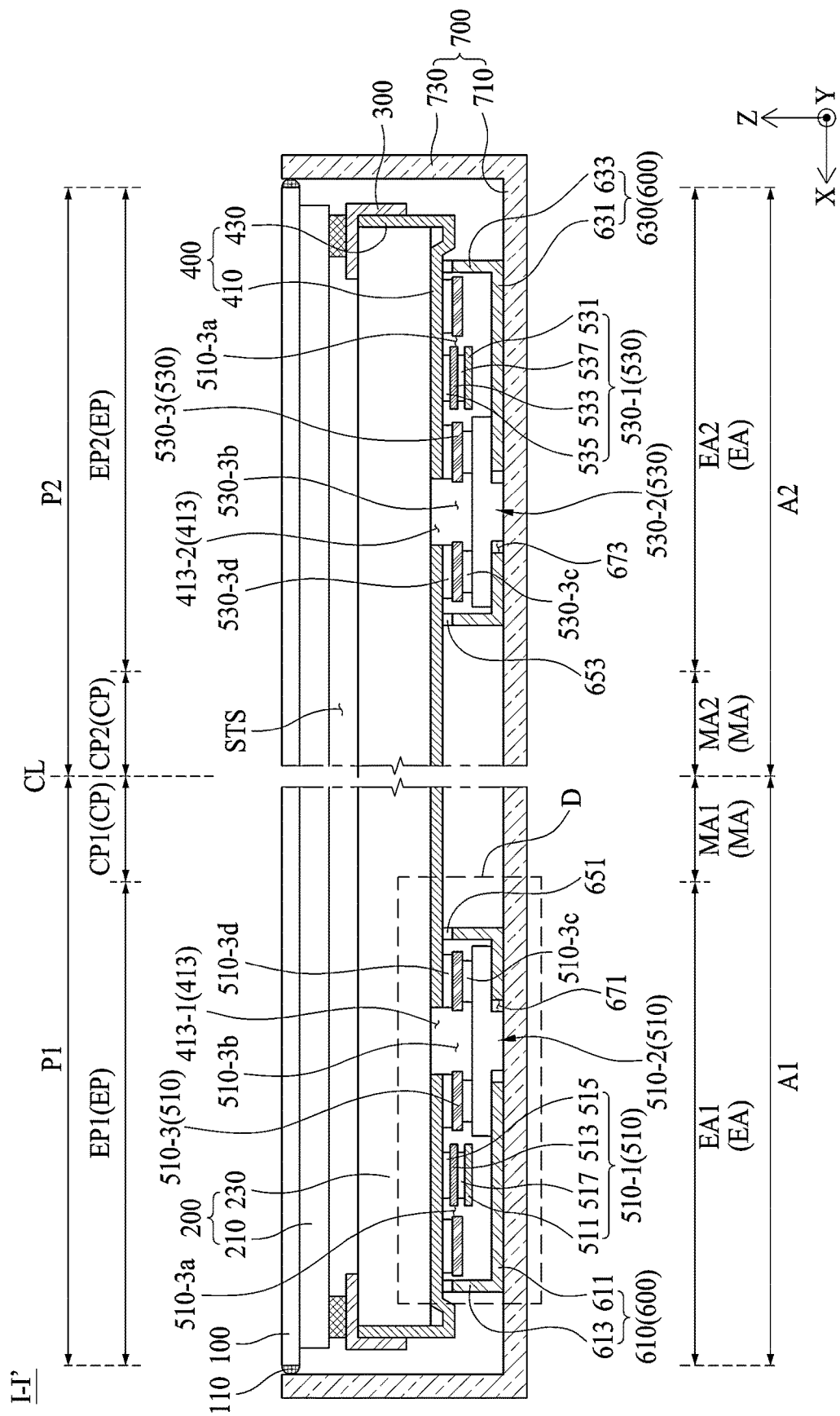
FIG. 15 is an example cross-sectional view taken along line I-I' illustrated in FIG. 1 with respect to a connection structure of the apparatus illustrated in FIG. 14.
Figure 16:
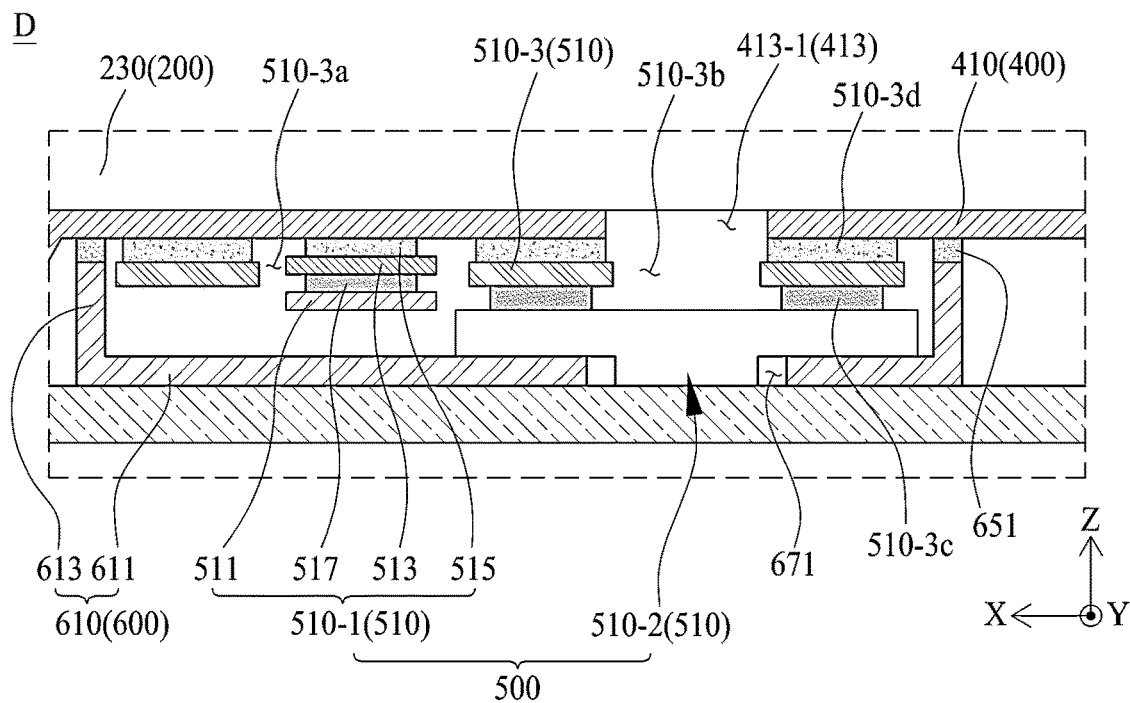
FIG. 16 is an enlarged view of a region "D" illustrated in FIG. 15.

FIG. 14 is an exploded view of an apparatus according to another embodiment of the present disclosure. FIG. 15 is another cross-sectional view taken along line I-I' illustrated in FIG. 1 with respect to a connection structure of the example apparatus illustrated in FIG. 14. FIG. 16 is an enlarged view of a region "D" illustrated in FIG. 15.

The apparatus according to another example embodiment of the present disclosure illustrated in FIGS. 14 to 16 may be implemented by modifying a first cover, one or more vibration apparatuses, and one or more enclosure members in the apparatus according to an example embodiment of the present disclosure illustrated in FIGS. 1 to 13. The following description may focus more on modified and relevant elements, and redundant descriptions of the same or similar elements discussed above may be briefly given or may be omitted.

As illustrated in FIGS. 14 to 16, a first cover 400 according to another example embodiment of the present disclosure may include on or more holes 413 disposed at a rear portion 410 thereof. For example, the holes 413 may increase the amount of sound generated based on vibrations of the first and second vibration apparatuses 510 and 530 and transmitted to a front surface of the apparatus. For example, the holes 413 may be disposed at the first cover 400 overlapping the vibration apparatuses 500, and a rear surface of a backlight 230 may be exposed through the holes 413. For example, a rear surface of a backlight 230 may be exposed to the first and second vibrating apparatuses 510 and 530 through the holes 413. For example, a reflective sheet 235 of the backlight 230 may be exposed through the holes 413 in a direction toward a rear surface of the first cover 400. For example, a reflective sheet 235 of the backlight 230 may be exposed to the first and second vibrating apparatuses 510 and 530 through the holes 413. For example, the holes 413 may be disposed at each of a first region A1 and a second region A2 of the rear portion 410 of the first cover 400.

According to an example embodiment of the present disclosure, the holes 413 may include a first hole 413-1 and a second hole 413-2 through the rear portion 410 of the first cover 400. For example, the first hole 413-1 may be disposed at a first region A1. For example, the second hole 413-2 may be disposed at a second region A2. For example, the first hole 413-1 may be disposed at or over a first middle region MA1 or a first periphery region EA1. For example, the second hole 413-2 may be disposed at or over the second middle region MA2 or the second periphery region EA2.

A hole 413 may provide a second gap space between a display member 200 and a corresponding vibration apparatus 500. For example, the hole 413 may provide the second gap space between the backlight 230 of the display member 200 and the vibration apparatus 500. For example, the second gap space may be referred to as a vibration space based on driving of the vibration apparatus 500, on a sound pressure level space (or a sound portion) where a sound pressure level is generated based on a vibration of the vibration apparatus 500, or on a sound wave propagation path (or a sound energy incident portion) through which a sound wave generated based on a vibration of the vibration apparatus 500 is directly propagated to the display member 200. However, embodiments of the present disclosure are not limited thereto.

The vibration apparatuses 500 according to another example embodiment of the present disclosure may include a first vibration apparatus 510 (including, e.g., a first vibration device 510-1) in a first region A1 and a second vibration apparatus 530 (including, e.g., a second vibration device 530-1) in a second region A2. However, embodiments of the present disclosure are not limited thereto.

The first vibration apparatus 510 according to an example embodiment of the present disclosure may be disposed at a rear surface of the rear portion 410 of the first cover 400. For example, the first vibration apparatus 510 may be disposed at the first region A1 of the first cover 400 and may vibrate the first region A1 of the first cover 400 in response to a first driving signal to vibrate a first portion P1 of the display member 200. Thus, the first vibration apparatus 510 may generate a first sound S1 of a first pitched sound band based on a vibration of the first portion P1 of the display member 200 or may generate a first haptic feedback (or a first haptic vibration) in response to a touch, for example, by a user.

The first vibration apparatus 510 may include a first vibration device 510-1, a third vibration device 510-2, and a first support member 510-3, but embodiments of the present disclosure are not limited thereto. For example, the first vibration device 510-1 and the third vibration device 510-2 may be disposed adjacent to each other. For example, the first support member 510-3 may be a first guide member or a first member and may be used in common. However, embodiments of the present disclosure are not limited thereto. According to another example embodiment of the present disclosure, the first vibration device 510-1 and the third vibration device 510-2 may be applied to be compatible to each other. For example, the third vibration device 510-2 may be disposed at a rear surface of the first cover 400.

The first vibration device 510-1 may be disposed at the rear surface of the first cover 400. For example, the first vibration device 510-1 may be disposed at the first region A1 of the rear portion 410 of the first cover 400. For example, the first vibration device 510-1 may vibrate the first region A1 of the first cover 400 based on a first driving signal including a haptic feedback signal or/and a sound signal to vibrate the first portion P1 of the display member 200. Thus, the first vibration device 510-1 may generate the first sound S1 of the first pitched sound band based on a vibration of the first portion P1 of the display member 200 or may generate the first haptic feedback (or the first haptic vibration) in response to a touch, for example, by a user. For example, the first vibration device 510-1 may vibrate the first region A1 of the first cover 400 to directly vibrate the first portion P1 of the display member 200. Thus, the first vibration device 510-1 may generate the first sound S1 of the first pitched sound band based on a vibration of the first portion P1 of the display member 200 or may generate the first haptic feedback (or the first haptic vibration) in response to the touch.

According to an example embodiment of the present disclosure, the first vibration device 510-1 may be a film type vibration apparatus. For example, the first vibration device 510-1 may be referred to as a flexible sound generator, a flexible actuator, a flexible speaker, a flexible piezoelectric speaker, a film actuator, a film type piezoelectric composite actuator, a film speaker, a film type piezoelectric speaker, or a film type piezoelectric composite speaker, or the like. However, embodiments of the present disclosure are not limited thereto.

In comparison with the first vibration device 510-1 (of the first vibration apparatus 510) according to an example embodiment of the present disclosure configured to cover the first hole 411-1 disposed at the rear portion 410 of the first cover 400 illustrated in FIGS. 1-13 above, except for that the first vibration device 510-1 here according to another example embodiment of the present disclosure not covering a hole disposed at the rear portion 410 of the first cover 400, the first vibration device 510-1 here according to another example embodiment of the present disclosure may have the same or similar configuration as that of the first vibration device 510-1 according to an example embodiment of the present disclosure illustrated in FIGS. 1-13. Thus, redundant descriptions may be omitted or be briefly provided below.

According to an example embodiment of the present disclosure, as illustrated in FIGS. 15 and 16, the first vibration device 510-1 may include a first plate 511, disposed at a rear surface of the rear portion 410 of the first cover 400 by a sixth connection member 515, and a first vibration generator 513 disposed at a rear surface of the first plate 511 by an eighth connection member 517. For example, positions of the first plate 511 and the first vibration generator 513 may be changed. For example, the first vibration device 510-1 may include the first vibration generator 513 disposed at the rear surface of the rear portion 410 of the first cover 400 by the sixth connection member 515 and the first plate 511 disposed at the rear surface of the first vibration generator 513 by the eighth connection member 517.

The third vibration device 510-2 may be disposed at the rear portion 410 of the first cover 400. For example, the third vibration device 510-2 may be disposed at the rear surface of the rear portion 410 of the first cover 400 to cover the first hole 413-1. For example, the first support member 510-3 according to an example embodiment of the present disclosure may be configured such that the third vibration device 510-2 may be disposed at a rear surface of the first support member 510-3. For example, the third vibration device 510-2 may be disposed at a rear surface of the first support member 510-3 by a twelfth connection member 510-3c. For example, the third vibration device 510-2 may be a coil type vibration apparatus (or vibration generator) and may be a vibration apparatus (or a vibration generator) including a magnet, a bobbin, and a coil wound around the bobbin. For example, the twelfth connection member 510-3c may be disposed between the rear surface of the first support member 510-3 and the third vibration device 510-2.

The coil type vibration apparatus according to an example embodiment of the present disclosure may further include a frame (or a plate), a center pole, and a damper. The magnet (or a permanent magnet) may be disposed at the frame so as to be accommodated into a hollow portion of the bobbin. The coil may be wound to surround an outer perimeter of the bobbin. For example, the coil may be supplied with a sound signal (or a voice signal) from an external source. The coil may be raised and lowered together with an elevation of the bobbin. When the sound signal is applied to the coil, the bobbin may vibrate (for example, perform a vertical reciprocating motion) based on Fleming's left hand rule based on an application electric field generated around the coil and an external magnetic field formed around the magnet. The center pole may be disposed on the magnet and may guide a vibration of the bobbin. For example, the center pole may be inserted (or accommodated) into a hollow portion of the bobbin and thus may be surrounded by the bobbin. For example, the center pole may be disposed on the magnet so as to be accommodated into the hollow portion of the bobbin. For example, the damper may be disposed between the frame and the bobbin. The damper may have a creased structure between one side and the other side thereof and may be contracted and relaxed based on a vibration of the bobbin. For example, the damper may limit a vibration distance (for example, a vertical movement distance) of the bobbin with a restoring force thereof. For example, in the event that the bobbin vibrates by a certain distance or more or vibrates by a certain distance or less, the bobbin may be restored to an original position by the restoring force of the damper. However, a configuration of the coil type vibration apparatus is not limited thereto.

According to an example embodiment of the present disclosure, a displacement amount of the third vibration device 510-2 may increase in a low-pitched sound. Thus, the hole 413 (or the first hole 413-1) may secure a vibration space between the first vibration apparatus 510 and an optical sheet part 237. For example, in order to decrease a height of the apparatus based on the third vibration device 510-2, the enclosure member 610 may be implemented so that the bobbin of the third vibration device 510-2 is exposed at the first hole 413-1 or is inserted (or accommodated) into the first hole 413-1.

According to an example embodiment of the present disclosure, the third vibration device 510-2 may vibrate the first region A1 of the first cover 400 based on a third driving signal including a haptic feedback signal or/and a sound signal. Accordingly, the third vibration device 510-2 may vibrate the first region A1 of the display member 200 to vibrate the first portion P1 of the display member 200. Thus, the third vibration device 510-2 may generate a first sound S1 of a first pitched sound band based on a vibration of the first portion P1 of the display member 200 or may generate a first haptic feedback (or a haptic vibration) in response to a touch, for example, by a user.

The third vibration device 510-2 according to an example embodiment of the present disclosure may vibrate the first region A1 of the first cover 400 in response to a third driving signal, thereby generating a sound pressure level in an inner region (or a second gap space) of the first hole 413-1. Accordingly, the first sound S1 of the first pitched sound band may be generated by vibrating the first portion P1 of the display member 200.

According to an example embodiment of the present disclosure, when the third vibration device 510-2 vibrates based on the third driving signal, a sound pressure level may be generated in the inner region of the first hole 413-1 by a vibration of the first region A1 of the first cover 400 based on a vibration of the third vibration device 510-2. A sound pressure level may be generated in a sound transfer space STS by a vibration of the backlight 230 based on the sound pressure level. Based on the sound pressure level generated in the sound transfer space STS, the first sound S1 of the first pitched sound band generated by a vibration of the first portion P1 of the display panel 210 may be output in a forward direction FD of the display panel 210. Accordingly, a sound wave generated based on a vibration of the third vibration device 510-2 may be directly transferred (or propagated) to the display member 200 through the first hole 413-1. Thus, a sound pressure level characteristic and/or sound quality of the first sound S1 may be enhanced.

The first support member 510-3 may be disposed between the rear portion 410 of the first cover 400 and the first vibration apparatus 510. For example, the first support member 510-3 may support the third vibration device 510-2. For example, the first support member 510-3 may be disposed at the rear surface of the rear portion 410 of the first cover 400 by a thirteenth connection member 510-3d.

The first support member 510-3 according to an example embodiment of the present disclosure may include a fifth hole 510-3a and a sixth hole 510-3b.

The fifth hole 510-3a according to an example embodiment of the present disclosure may correspond to (or overlap) the position of the first vibration device 510-1. For example, the fifth hole 510-3a may have the same or similar shape as that of the first vibration device 510-1, but embodiments of the present disclosure are not limited thereto. For example, a size (or a width) of the fifth hole 510-3a may be the same as that of the first vibration device 510-1, or may be greater than that of the first vibration device 510-1. For example, the fifth hole 510-3a may provide a displacement space of the first vibration device 510-1 so that a displacement amount of the first vibration device 510-1 may increase. For example, the fifth hole 510-3a may be covered by the first plate 511 of the first vibration device 510-1. For example, the vibration generator 513 of the first vibration device 510-1 may be disposed at the first plate 511. For example, the vibration generator 513 of the first vibration device 510-1 may be disposed at a rear surface of the first plate 511.

The sixth hole 510-3b according to an example embodiment of the present disclosure may correspond to (or overlap) the first hole 413-1 of the first cover 400. For example, the sixth hole 510-3b may correspond to (or overlap) the third vibration device 510-2. For example, the sixth hole 510-3b may have the same or similar shape as that of the first hole 413-1 of the first cover 400, but embodiments of the present disclosure are not limited thereto. For example, a size (or a width) of the sixth hole 510-3b may be the same as or different from that of the first hole 413-1 of the first cover 400. For example, a size of the sixth hole 510-3b may be smaller than or greater than that of the first hole 413-1.

According to an example embodiment of the present disclosure, the sixth hole 510-3b may be covered by the third vibration device 510-2. For example, the third vibration device 510-2 may be disposed at a rear surface of the first support member 510-3 and may cover the sixth hole 510-3b. For example, the third vibration device 510-2 may output a second sound pressure level through the sixth hole 510-3b. For example, the third vibration device 510-2 may output a sound of a low-pitched sound band through sixth hole 510-3b, but embodiments of the present disclosure are not limited thereto.

According to an example embodiment of the present disclosure, the first support member 510-3 may be accommodated (or received) into the first enclosure member 610 and may support at least one or more of the first vibration device 510-1 and the third vibration device 510-2. For example, the first support member 510-3 may be connected or coupled to at least a portion of the first enclosure member 610. For example, the first support member 510-3 may be referred to as a first member, a first supporting member, a first supporting frame, a first supporting panel, a first guide panel, or a first guider, or the like, but embodiments of the present disclosure are not limited thereto.

According to an example embodiment of the present disclosure, a portion of the first support member 510-3 disposed between the fifth hole 510-3a and the sixth hole 510-3b may acoustically separate a space where the first vibration apparatus 510-1 is disposed and a space where the third vibration device 510-2 is disposed. Accordingly, interference between a first sound pressure level (or a sound wave) generated based on a vibration of the first vibration apparatus 510-1 and a second sound pressure level (or a sound wave) generated based on a vibration of the third vibration device 510-2 and different from the first sound pressure level may be prevented or reduced, thereby preventing or decreasing a reduction in sound quality or characteristic.

The first vibration apparatus 510 according to an example embodiment of the present disclosure may be disposed at the rear surface of the rear portion 410 of the first cover 400. For example, the second vibration apparatus 530 may be disposed at the second region A2 of the first cover 400 and may vibrate the second region A2 of the first cover 400 in response to a third driving signal to vibrate the second portion P2 of the display member 200. Thus, the second vibration apparatus 530 may generate a second sound S2 of a second pitched sound band based on a vibration of the second portion P2 of the display member 200 or may generate a second haptic feedback (or a second haptic vibration) in response to a touch, for example, by a user.

The second vibration apparatus 530 may include a second vibration device 530-1, a fourth vibration device 530-2, and a second support member 530-3, but embodiments of the present disclosure are not limited thereto. For example, the second vibration device 530-1 and the fourth vibration apparatus 530-2 may be disposed adjacent to each other. For example, the second support member 530-3 may be a second guide member or a second member and may be used in common. However, embodiments of the present disclosure are not limited thereto.

The second vibration device 530-1 may be disposed at the rear surface of the first cover 400. For example, the second vibration device 530-1 may be disposed at the second region A2 of the rear portion 410 of the first cover 400. For example, the second vibration device 530-1 may vibrate the second region A2 of the first cover 400 based on a third driving signal including a haptic feedback signal or/and a sound signal to vibrate the second portion P2 of the display member 200. Thus, the second vibration device 530-1 may generate the second sound S2 of the second pitched sound band based on a vibration of the second portion P2 of the display member 200 or may generate the second haptic feedback (or the second haptic vibration) in response to a touch, for example, by a user. For example, the second vibration device 530-1 may vibrate the second region A2 of the first cover 400 to directly vibrate the second portion P2 of the display member 200. Thus, the second vibration device 530-1 may generate the second sound S2 of the second pitched sound band based on a vibration of the second portion P2 of the display member 200 or may generate the second haptic feedback (or the second haptic vibration) in response to the touch.

The second vibration device 530-1 may be configured in a substantially same or similar manner as the first vibration device 510-1.

According to an example embodiment of the present disclosure, as illustrated in FIGS. 15 and 16, the second vibration device 530-1 may include a second plate 531, disposed at the rear surface of the rear portion 410 of the first cover 400 by using a seventh connection member 535, and a second vibration generator 533 disposed at a rear surface of the second plate 531 by using a ninth connection member 537. For example, positions of the second plate 531 and the second vibration generator 533 may be changed. For example, the second vibration device 530-1 may include the second vibration generator 533 disposed at the rear surface of the rear portion 410 of the first cover 400 by using the seventh connection member 535 and the second plate 531 disposed on the rear surface of the second vibration generator 533 by the ninth connection member 537.

The fourth vibration device 530-2 may be disposed at the rear portion 410 of the first cover 400. For example, the fourth vibration device 530-2 may be disposed at the rear surface of the rear portion 410 of the first cover 400 to cover the second hole 413-2. For example, the second support member 530-3 according to an example embodiment of the present disclosure may be configured such that the fourth vibration device 530-2 may be disposed at a rear surface of the second support member 530-3. For example, the fourth vibration device 530-2 may be disposed at a rear surface of the second support member 530-3 by a fourteenth connection member 530-3c. For example, the fourth vibration device 530-2 may be a coil type vibration apparatus (or vibration generator) and may be a vibration apparatus (or a vibration generator) including a magnet, a bobbin, and a coil wound around the bobbin. For example, the fourteenth connection member 530-3c may be disposed between the rear surface of the second support member 530-3 and the fourth vibration device 530-2.

According to an example embodiment of the present disclosure, the fourth vibration device 530-2 may vibrate the second region A2 of the first cover 400 based on a fourth driving signal including a haptic feedback signal or/and a sound signal. Accordingly, the fourth vibration device 530-2 may vibrate the first portion P1 of the display member 200. Thus, the fourth vibration device 530-2 may generate a second sound S2 of a second pitched sound band based on a vibration of the second portion P2 of the display member 200 or may generate a second haptic feedback (or a haptic vibration) in response to a touch, for example, by a user. For example, the fourth vibration device 530-2 may directly vibrate the first portion P1 of the display member 200. Thus, the fourth vibration device 530-2 may generate a second sound S2 of a second pitched sound band based on a vibration of the second portion P2 of the display member 200 or may generate a second haptic feedback (or a haptic vibration) in response to a touch.

The fourth vibration device 530-2 according to an example embodiment of the present disclosure may vibrate the second region A2 of the first cover 400 in response to a fourth driving signal, thereby generating a sound pressure level in an inner region (or a second gap space) of the second hole 413-2. Accordingly, the second sound S2 of the second pitched sound band may be generated by vibrating the second portion P2 of the display member 200.

According to an example embodiment of the present disclosure, when the fourth vibration device 530-2 vibrates based on the fourth driving signal, a sound pressure level may be generated in the inner region of the second hole 413-2 by a vibration of the second region A2 of the first cover 400 based on a vibration of the fourth vibration device 530-2. A sound pressure level may be generated in a sound transfer space STS by a vibration of the backlight 230 based on the sound pressure level. Based on the sound pressure level generated in the sound transfer space STS, the second sound S2 of the second pitched sound band generated by a vibration of the second portion P2 of the display panel 210 may be output in a forward direction FD of the display panel 210. Accordingly, a sound wave generated based on a vibration of the fourth vibration device 530-2 may be directly transferred (or propagated) to the display member 200 through the second hole 413-2. Thus, a sound pressure level characteristic and/or sound quality of the second sound S2 may be enhanced.

The second support member 530-3 may be disposed between the rear portion 410 of the first cover 400 and the second vibration apparatus 530. For example, the second support member 530-3 may support the fourth vibration device 530-2. For example, the second support member 530-3 may be disposed at the rear surface of the rear portion 410 of the first cover 400 by a fifteenth connection member 530-3d.

The second support member 530-3 according to an embodiment of the present disclosure may include a seventh hole 530-3a and an eighth hole 530-3b.

The seventh hole 530-3a according to an embodiment of the present disclosure may correspond to (or overlap) the second vibration device 530-1. For example, the seventh hole 530-3a may have the same or similar shape as that of the second vibration device 530-1, but embodiments of the present disclosure are not limited thereto. For example, a size (or a width) of the seventh hole 530-3a may be equal to that of the second vibration device 530-1, or may be greater than that of the second vibration device 530-1. For example, the seventh hole 530-3a may provide a displacement space of the second vibration device 530-1 so that a displacement amount of the second vibration device 530-1 may increase. For example, the seventh hole 530-3a may be covered by the second plate 531 of the second vibration device 530-1. For example, the vibration generator 533 of the second vibration device 530-1 may be disposed at the second plate 531. For example, the vibration generator 533 of the second vibration device 530-1 may be disposed at a rear surface of the second plate 531.

The eighth hole 530-3b according to an embodiment of the present disclosure may correspond to (or overlap) the second hole 413-2 of the first cover 400. For example, the eighth hole 530-3b may correspond to (or overlap) the fourth vibration device 530-2. For example, the eighth hole 530-3b may have the same shape as that of the second hole 413-2 of the first cover 400, but embodiments of the present disclosure are not limited thereto. For example, a size (or a width) of the eighth hole 530-3b may be the same as or different from that of the second hole 413-2 of the first cover 400. For example, a size of the eighth hole 530-3b may be smaller than or greater than that of the second hole 413-2.

According to an example embodiment of the present disclosure, the eighth hole 530-3b may be covered by the fourth vibration device 530-2. For example, the fourth vibration device 530-2 may be disposed at a rear surface of the second support member 530-3 and may cover the eighth hole 530-3b. For example, the fourth vibration device 530-2 may output a second sound pressure level through the eighth hole 530-3b. For example, the fourth vibration device 530-2 may output a sound of a low-pitched sound band through eighth hole 530-3b, but embodiments of the present disclosure are not limited thereto.

According to an example embodiment of the present disclosure, the second support member 530-3 may be accommodated (or received) into the second enclosure member 630 and may support one or more of the second vibration device 530-1 and the fourth vibration device

530-2. For example, the second support member 530-3 may be connected or coupled to at least a portion of the second enclosure member 630. For example, the second support member 530-3 may be referred to as a second member, a second supporting member, a second supporting frame, a second supporting panel, a second guide panel, or a second guider, but embodiments of the present disclosure are not limited thereto.

According to an example embodiment of the present disclosure, a portion of the second support member 530-3 disposed between the seventh hole 530-3a and the eighth hole 530-3b may acoustically separate a space where the second vibration device 530-1 is disposed and a space where the fourth vibration device 530-2 is disposed. Accordingly, interference between a sound pressure level (or a sound wave) generated based on a vibration of the second vibration device 530-1 and a sound pressure level (or a sound wave) generated based on a vibration of the fourth vibration device 530-2 may be prevented or reduced, thereby preventing or decreasing a reduction in sound quality or characteristic.

An enclosure member 600 according to another example embodiment of the present disclosure may be implemented by modifying the enclosure member 600 according to an above example embodiment of the present disclosure. Except for that the enclosure member 600 according to another example embodiment of the present disclosure including a through hole 670, the enclosure member 600 here according to another example embodiment of the present disclosure may be the same as or similar to the enclosure member 600 according to an above example embodiment of the present disclosure (as illustrated, e.g., in FIGS. 1-13). Thus, redundant descriptions may be omitted or be briefly provided below.

An enclosure member 600 according to another example embodiment of the present disclosure may be disposed at the rear surface of the first cover 400. For example, one or more enclosure members 600 may overlap each of the fifth hole 510-3a and the sixth hole 510-3b and may overlap each of the seventh hole 530-3a and the eighth hole 530-3b. The enclosure members 600 according to another example embodiment of the present disclosure may include a first enclosure member 610 and a second enclosure member 630.

The first enclosure member 610 may cover all of the first vibration apparatus 510. For example, the first enclosure member 610 may cover the first vibration device 510-1 and the third vibration device 510-2. For example, the first enclosure member 610 may be disposed at the first region A1 of the rear portion 410 of the first cover 400 by a tenth connection member 651. For example, the first enclosure member 610 may cover the first hole 413-1 disposed at the rear portion 410 of the first cover 400.

The first enclosure member 610 according to another example embodiment of the present disclosure may include a bottom portion 611, a lateral portion 613, and a first through hole (or a first hole) 671.

According to an example embodiment of the present disclosure, the bottom portion 611 may be disposed at the rear surface of the first vibration apparatus 510. For example, the bottom portion 611 may overlap each of the fifth hole 510-3a and the sixth hole 510-3b. For example, the bottom portion 611 may cover the rear surface of the first vibration apparatus 510. For example, the bottom portion 611 may be disposed on the rear surface of the first vibration device 510-1 and the rear surface of the third vibration device 510-2. For example, the bottom portion 611 may cover the rear surface of the first vibration device 510-1 and the rear surface of the third vibration device 510-2.

According to an embodiment of the present disclosure, the lateral portion 613 may be disposed at a lateral surface of the first vibration apparatus 510 and may cover the lateral surface of the first vibration apparatus 510. For example, the lateral portion 613 may be connected to one side (or an end) of the bottom portion 611. For example, the lateral portion 613 may be disposed along a periphery of the bottom portion 611. For example, one side (or one end) of the lateral portion 613 may be disposed at the rear surface of the rear portion 410 of the first cover 400 by the tenth connection member 651.

According to another example embodiment of the present disclosure, the first through hole 671 may be disposed at the bottom portion 611. For example, the first through hole 671 may correspond to (or overlap) the third vibration device 510-2. For example, the first through hole 671 may provide a displacement space of the third vibration device 510-2 and thus may increase a displacement amount of the third vibration device 510-2. The first through hole 671 may be a path through which a portion of the third vibration device 510-2 may pass. For example, a center portion of the third vibration device 510-2 may be exposed at or protrude to the outside of the first enclosure member 610 through the first through hole 671. According to another example embodiment of the present disclosure, the first through hole 671 may correspond to (or overlap) the first vibration device 510-1. For example, the first through hole 671 may be a path through which a portion of the first vibration device 510-1 may pass. For example, a center portion of the first vibration device 510-1 may be exposed at or protrude to the outside of the first enclosure member 610 through the first through hole 671.

The second enclosure member 630 may cover all of the second vibration apparatus 530. For example, the second enclosure member 630 may cover the second vibration device 530-1 and the fourth vibration device 530-2. For example, the second enclosure member 630 may be disposed at the second region A2 of the rear portion 410 of the first cover 400 by an eleventh connection member 653. For example, the second enclosure member 630 may cover the second hole 413-2 disposed at the rear portion 410 of the first cover 400.

The second enclosure member 630 according to another embodiment of the present disclosure may include a bottom portion 631, a lateral portion 633, and a second through hole (or a second hole) 673.

According to an example embodiment of the present disclosure, the bottom portion 631 may be disposed at the rear surface of the second vibration apparatus 530. For example, the bottom portion 631 may overlap each of the seventh hole 530-3a and the eighth hole 530-3b. For example, the bottom portion 631 may cover the rear surface of the first vibration apparatus 530. For example, the bottom portion 611 may be disposed at the rear surface of the second vibration device 530-1 and the rear surface of the fourth vibration device 530-2. For example, the bottom portion 611 may cover the rear surface of the second vibration device 530-1 and the rear surface of the fourth vibration device 530-2.

According to an example embodiment of the present disclosure, the lateral portion 613 may be disposed at a lateral surface of the second vibration apparatus 530 and may cover the lateral surface of the second vibration apparatus 530. For example, the lateral portion 613 may be connected to one side (or an end) of the bottom portion 611. For example, the lateral portion 613 may be disposed along a periphery of the bottom portion 611. For example, one side (or one end) of the lateral portion 613 may be disposed at the rear surface of the rear portion 410 of the first cover 400 by the eleventh connection member 653.

According to another example embodiment of the present disclosure, the second through hole 673 may be disposed at the bottom portion 611. For example, the second through hole 673 may correspond to (or overlap) the fourth vibration device 530-2. For example, the second through hole 673 may provide a displacement space of the fourth vibration device 530-2 and thus may increase a displacement amount of the fourth vibration device 530-2. For example, the second through hole 673 may be a path through which a portion of the fourth vibration device 530-2 may pass. For example, a center portion of the fourth vibration device 530-2 may be exposed at or protrude to the outside of the second enclosure member 630 through the second through hole 673. According to another example embodiment of the present disclosure, the second through hole 673 may correspond to (or overlap) the second vibration device 530-1. For example, the second through hole 673 may be a path through which a portion of the second vibration device 530-1 may pass. For example, a center portion of the second vibration device 530-1 may be exposed at or protrude to the outside of the second enclosure member 630 through the second through hole 673.

According to an example embodiment of the present disclosure illustrated in FIGS. 14 to 16, the first vibration device 510-1, the third vibration device 510-2, the first support member 510-3, and the first enclosure member 610 may configure a first vibration generating apparatus. The second vibration device 530-1, the fourth vibration device 530-2, the second support member 530-3, and the second enclosure member 630 may configure a second vibration generating apparatus.

According to an example embodiment of the present disclosure, a vibration generating apparatus corresponding to the first vibration generating apparatus and/or the second vibration generating apparatus may be connected to a vibration object (or a vibration member) to vibrate the vibration object (or a vibration member), thereby outputting a sound. For example, the vibration object may include a vibration plate, and the vibration plate may include a metal material or may include one or more sheets or layers of non-metal or composite non-metal materials of wood, plastic, glass, cloth, fiber, paper, rubber, and leather. For example, the vibration object may include a display panel including a plurality of pixels configured to display an image, or may include a non-display panel of a light emitting diode lighting panel, an organic light emitting lighting panel, or an inorganic light emitting lighting panel. For example, the vibration object may include one or more of a display panel including a plurality of pixels configured to display an image, a screen panel on which an image is projected from a display apparatus, a lighting panel, a signage panel, a vehicular exterior material, a building ceiling material, a building interior material, a building glass window, an aircraft interior material, an aircraft glass window, metal, wood, rubber, plastic, glass, fiber, cloth, paper, leather, and a mirror.

According to an example embodiment of the present disclosure, because an enclosure member 600 is provided, an air impedance of the corresponding vibration apparatus 500 may be controlled, thereby providing an apparatus enabling a pitched sound band to extend. Also, the apparatus according to an example embodiment of the present disclosure may include a film type vibration apparatus. An apparatus having enhanced sound pressure level characteristic and/or sound characteristic including a high-pitched sound band may be provided. Additionally, a thickness of the apparatus may be reduced, thereby providing an apparatus having a slim structure.

Figure 17:
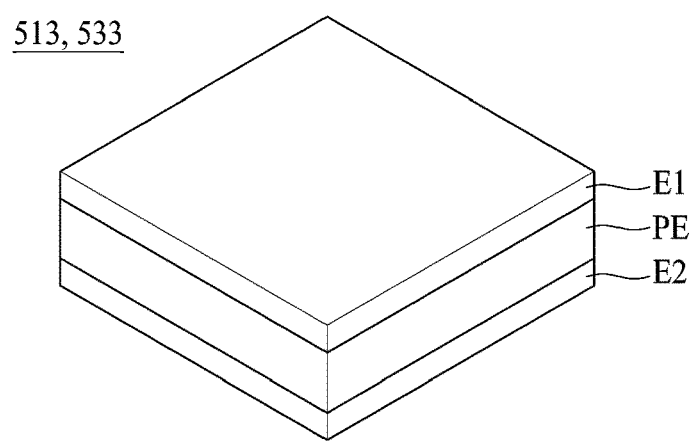
FIG. 17 illustrates an example vibration generator illustrated in FIG. 14.

FIG. 17 illustrates an example of a vibration generator illustrated in FIG. 14.

As illustrated in FIG. 17, a first vibration generator 513 of an apparatus according to another example embodiment of the present disclosure may include a vibration portion (or a vibration layer) PE, a first electrode layer E1, and a second electrode layer E2. For example, the vibration portion PE may be a piezoelectric device.

According to example embodiments of the present disclosure, the first vibration generator 513 may be disposed on the plate 511. According to other example embodiments of the present disclosure, the first vibration generator 513 may be attached at the plate 511 including a metal material.

The vibration portion PE may include a piezoelectric material having a piezoelectric effect. For example, the piezoelectric material may have a characteristic where pressure or twisting is applied to a crystalline structure by an external force, a potential difference occurs due to dielectric polarization caused by a relative position change of a positive (+) ion and a negative (−) ion, and a vibration is generated by an electric field based on a voltage applied thereto. For example, the vibration portion PE may be a vibration layer, a piezoelectric layer, a piezoelectric material layer, an electroactive layer, a piezoelectric vibration portion, a piezoelectric material portion, an electroactive portion, a piezoelectric structure, an inorganic material layer, or an inorganic material portion, or the like. However, embodiments of the present disclosure are not limited thereto.

The vibration portion PE may be formed of a transparent, semitransparent, or opaque piezoelectric material, and may be transparent, semitransparent, or opaque. The vibration portion PE may include a ceramic-based material configured to generate a relatively high vibration or may include a piezoelectric ceramic having a perovskite-based crystalline structure. The perovskite crystalline structure may have a piezoelectric effect and an inverse piezoelectric effect and may be a plate-shaped structure having orientation. The perovskite crystalline structure may be represented by a chemical formula "$ABO_3$". In the chemical formula, "A" may include a divalent metal element, and "B" may include a tetravalent metal element. For example, in the chemical formula "$ABO_3$", "A" and "B" may be cations, and "O" may be anions. For example, the chemical formula "$ABO_3$" may include at least one or more of lead(II) titanate ($PbTiO_3$), lead zirconate ($PbZrO_3$), lead zirconate titanate ($PbZrTiO_3$), barium titanate ($BaTiO_3$), and strontium titanate ($SrTiO_3$), but embodiments of the present disclosure are not limited thereto.

The vibration portion PE according to an example embodiment of the present disclosure may include one or more materials of lead (Pb), zirconium (Zr), titanium (Ti), zinc (Zn), nickel (Ni), niobium (Nb), magnesium (Mg), manganese (Mn), and indium (In), but embodiments of the present disclosure are not limited thereto. The vibration portion PE according to another example embodiment of the present disclosure may include a lead zirconate titanate (PZT)-based material, including lead (Pb), zirconium (Zr), and titanium (Ti), or may include a lead zirconate nickel niobate (PZNN)-based material, including lead (Pb), zirconium (Zr), nickel (Ni), and niobium (Nb). However, embodiments of the present disclosure are not limited thereto.

According to another example embodiment of the present disclosure, the vibration portion PE may include a lead magnesium niobate (PMN)-based material, a lead nickel niobate (PNN)-based material, a lead zirconate niobate (PZN)-based material, or a lead indium niobate (PIN)-based material, but embodiment of the present disclosure are not limited thereto. The PMN-based material may include Pb, Mg, and Nb, and for example, may include Pb(Mg, Nb)$O_3$. The PNN-based material may include Pb, Ni, and Nb, and for example, may include Pb(Ni, Nb)$O_3$. The PIN-based material may include Pb, In, and Nb, and for example, may include Pb(In, Nb)$O_3$. According to another example embodiment of the present disclosure, the vibration portion PE may include at least one or more of CaTiO$_3$, BaTiO$_3$, and SrTiO$_3$ without Pb, but embodiments of the present disclosure are not limited thereto.

The vibration portion PE according to an example embodiment of the present disclosure is not limited to a tetragonal shape illustrated in FIG. 17 and may be configured in a circular shape, an oval shape, a three or more-angle polygonal shape, or various other shapes.

The first electrode layer E1 may be disposed at a first surface (or an upper surface) of the vibration portion PE and may be electrically connected to the first surface of the vibration portion PE. For example, the first electrode layer E1 may have a single-body electrode shape (or a common electrode shape) which is disposed at an entire first surface of the vibration portion PE. The first electrode layer E1 according an example embodiment of the present disclosure may include a transparent conductive material, a semitransparent (or translucent) conductive material, or an opaque conductive material. For example, examples of the transparent conductive material or the semitransparent conductive material may include indium tin oxide (ITO) or indium zinc oxide (IZO), but embodiments of the present disclosure are not limited thereto. The opaque conductive material may include aluminum (Al), copper (Cu), gold (Au), silver (Ag), molybdenum (Mo), magnesium (Mg), or the like, or an alloy of any thereof. However, embodiments of the present disclosure are not limited thereto.

The second electrode layer E2 may be at a second surface (or a rear surface) opposite to the first surface of the vibration portion PE and may be electrically connected to the second surface of the vibration portion PE. For example, the second electrode layer E2 may have a single-body electrode shape (or a common electrode shape) which is disposed at an entire second surface of the vibration portion PE. The second electrode layer E2 according to an example embodiment of the present disclosure may include a transparent conductive material, a semitransparent conductive material, or an opaque conductive material. For example, the second electrode layer E2 may include the same material as the first electrode layer E1, but embodiments of the present disclosure are not limited thereto. As another example embodiment of the present disclosure, the second electrode layer E2 may include a material different from the first electrode layer E1.

The vibration portion PE may be polarized (or poling) by a certain voltage applied to the first electrode layer E1 and the second electrode layer E2 in a certain temperature atmosphere, or in a temperature atmosphere that may be changed from a high temperature to a room temperature. However, embodiments of the present disclosure are not limited thereto. For example, the vibration portion PE may alternately and repeatedly contract and expand based on an inverse piezoelectric effect according to a driving signal (or a sound signal or a voice signal) applied to the first electrode layer E1 and the second electrode layer E2 from an external source. Thus, the vibration portion PE may be displaced or vibrated (or driven).

Figure 18:
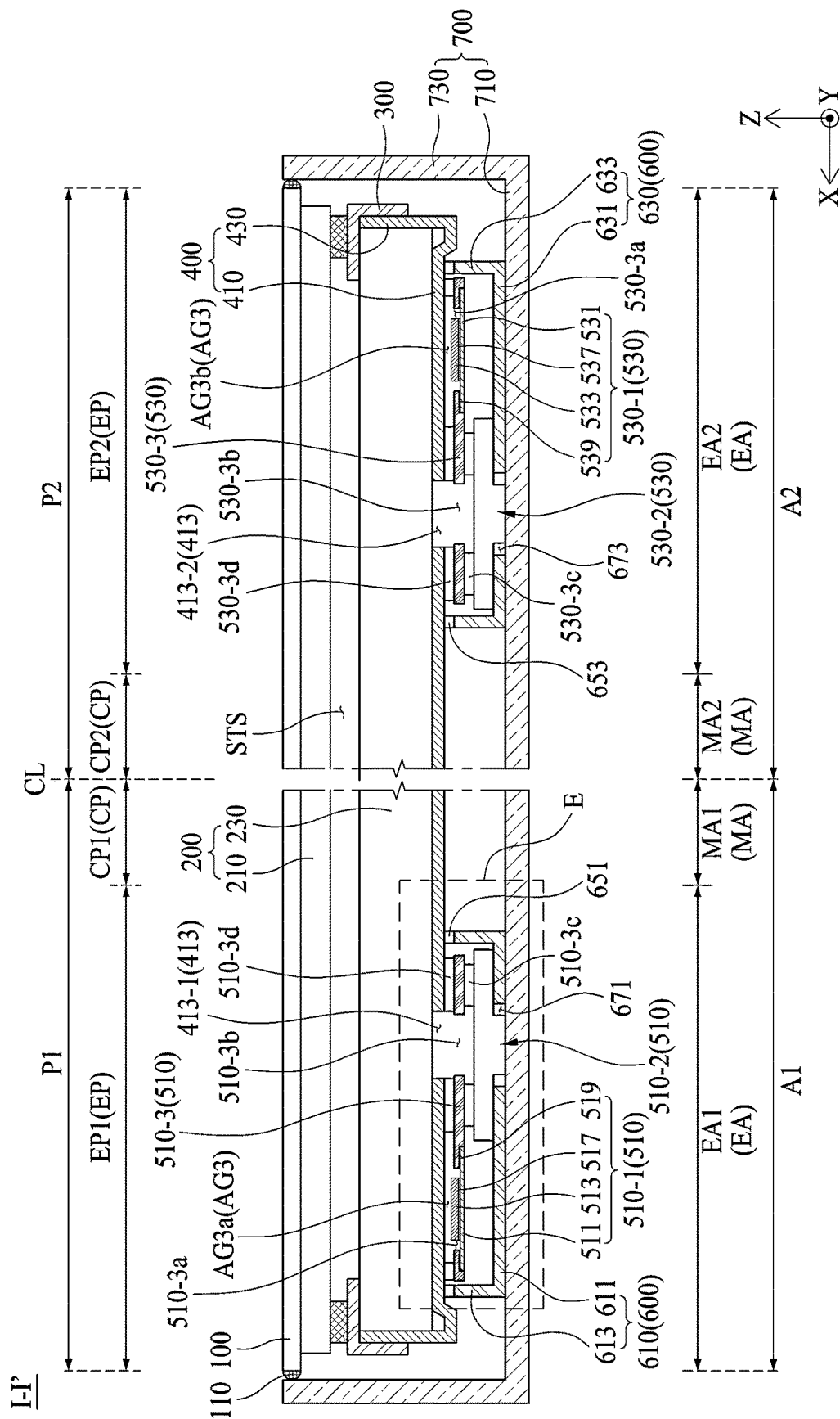
FIG. 18 is another example cross-sectional view taken along line I-I' illustrated in FIG. 1 with respect to a connection structure of the apparatus illustrated in FIG. 14.
Figure 19:
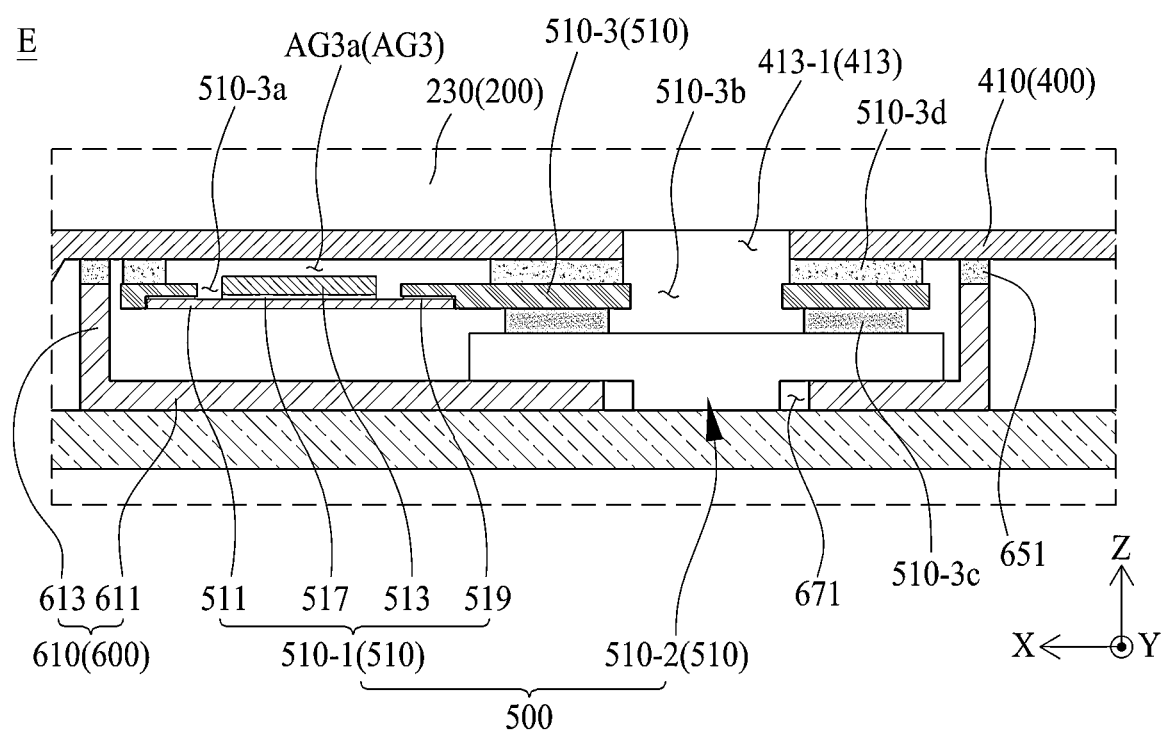
FIG. 19 is an enlarged view of a region "E" illustrated in FIG. 18.

FIG. 18 is another example cross-sectional view taken along line I-I' illustrated in FIG. 1 with respect to a connection structure of the apparatus illustrated in FIG. 14. FIG. 19 is an enlarged view of a region "E" illustrated in FIG. 18.

The apparatus according to another example embodiment of the present disclosure illustrated in FIGS. 18 and 19 may be implemented by adding a connection member in the apparatus according to an example embodiment of the present disclosure illustrated in FIGS. 14 to 16. The following description may focus more on modified and relevant elements, and redundant descriptions of the same or similar elements discussed above may be briefly given or may be omitted.

As illustrated in FIGS. 18 and 19, a first vibration device 510-1 according to another embodiment of the present disclosure may include a first plate 511 and a vibration generator 513. For example, the vibration generator (or a first vibration generator) 513 of the first vibration device 510-1 may be disposed at a rear surface of the first plate 511 by an eighth connection member 517. A second vibration device 530-1 according to another example embodiment of the present disclosure may include a second plate 531 and a vibration generator 533. The vibration generator (or a second vibration generator) 533 of the second vibration device 530-1 may be disposed at a rear surface of the second plate 531 by a ninth connection member 537.

The apparatus according to another example embodiment of the present disclosure may further include sixteenth and seventeenth connection members 519 and 539. For example, the apparatus according to another example embodiment of the present disclosure may include a sixteenth connection member 519 and a seventeenth connection member 539.

The sixteenth connection member 519 may be disposed between a first support member 510-3 and the first plate 511. Therefore, the first plate 511 may be disposed at the first support member 510-3 by the sixteenth connection member 519. For example, the sixteenth connection member 519 may be disposed at one side (or an edge or a periphery) of the first support member 510-3. For example, the sixteenth connection member 519 may overlap one side (or an edge or a periphery) of the first support member 510-3. For example, the sixteenth connection member 519 may be disposed at one side (or an edge or a periphery) of the first plate 511. For example, the sixteenth connection member 519 may overlap one side (or an edge or a periphery) of the first plate 511. For example, the sixteenth connection member 519 may be disposed between one side (or an edge or a periphery) of the first support member 510-3 and one side (or an edge or a periphery) of the first plate 511. For example, the sixteenth connection member 519 may overlap an enclosure member 600. For example, the sixteenth connection member 519 may overlap the first enclosure member 610. For example, the sixteenth connection member 519 may overlap a bottom portion 611 of the first enclosure member 610. For example, the sixteenth connection member 519 may overlap a fifth hole 510-3a, but embodiments of the present disclosure are not limited thereto. For example, the sixteenth connection member 519 may not overlap the fifth hole 510-3a.

The seventeenth connection member 539 may be disposed between a second support member 530-3 and the second plate 531. Therefore, the second plate 531 may be disposed at the second support member 530-3 by the seventeenth connection member 539. For example, the seventeenth connection member 539 may be disposed at one side (or an edge or a periphery) of the second support member 530-3. For example, the seventeenth connection member 539 may overlap one side (or an edge or a periphery) of the second support member 530-3. For example, the seventeenth connection member 539 may be disposed at one side (or an edge or the periphery) of the second plate 531. For example, the seventeenth connection member 539 may overlap one side (or an edge or a periphery) of the second plate 531. For example, the seventeenth connection member 539 may be disposed between one side (or an edge or a periphery) of the second support member 530-3 and one side (or an edge or a periphery) of the second plate 531. For example, the seventeenth connection member 539 may overlap an enclosure member 600. For example, the seventeenth connection member 539 may overlap the second enclosure member 630. For example, the seventeenth connection member 539 may overlap a bottom portion 631 of the second enclosure member 630. For example, the seventeenth connection member 539 may overlap a seventh hole 530-3a, but embodiments of the present disclosure are not limited thereto. For example, the seventeenth connection member 539 may not overlap the seventh hole 530-3a.

The apparatus according to another example embodiment of the present disclosure may further include one or more additional air gaps AG3.

An additional air gap AG3 may be provided between a first cover 400 and each of the first vibration device 510-1 and the second vibration device 530-1. For example, an additional air gap AG3 may be provided between a rear portion 410 of the first cover 400 and each of the first vibration device 510-1 and the second vibration device 530-1. For example, an additional air gap AG3 may be provided between the rear portion 410 of the first cover 400 and each of the first vibration generator 513 and the second vibration generator 533. An additional air gap AG3 may transmit a sound, generated by the first vibration device 510-1, to a front surface of the electronic apparatus and may secure a vibration space of the first vibration device 510-1. Also, another additional air gap AG3 may transmit a sound, generated by the second vibration device 530-1, to the front surface of the electronic apparatus and may secure a vibration space of the second vibration device 530-1. The additional air gaps AG3 according to an example embodiment of the present disclosure may include a third air gap AG3a and a fourth air gap AG3b.

The third air gap AG3a may be provided between the first vibration device 510-1 and the first cover 400. For example, the third air gap AG3a may be provided between the first vibration device 510-1 and the rear portion 410 of the first cover 400. For example, the third air gap AG3a may be provided between the rear portion 410 of the first cover 400 and a first vibration generator 513. For example, the third air gap AG3a may transmit a sound, generated by the first vibration generator 513, to the front surface of the electronic apparatus and may secure a vibration space of the first vibration generator 513.

The fourth air gap AG3b may be provided between the second vibration device 530-1 and the first cover 400. For example, the fourth air gap AG3b may be provided between the second vibration device 530-1 and the rear portion 410 of the first cover 400. For example, the fourth air gap AG3b may be provided between the rear portion 410 of the first cover 400 and a second vibration generator 533. For example, the fourth air gap AG3b may transmit a sound, generated by the second vibration generator 533, to the front surface of the electronic apparatus and may secure a vibration space of the second vibration generator 533.

According to an embodiment of the present disclosure, an additional air gap AG3 (e.g., the third air gap AG3a or the fourth air gap AG3b) may be provided between the first cover 400 and the corresponding vibration apparatus 500, thereby providing an electronic apparatus having more enhanced sound pressure level characteristic and/or sound characteristic. According to an example embodiment of the present disclosure, because an enclosure member 600 is provided, an air impedance of the corresponding vibration apparatus 500 may be controlled, thereby providing an apparatus enabling a pitched sound band to extend. Also, the apparatus according to an example embodiment of the present disclosure may include a film type vibration apparatus. An apparatus having enhanced sound pressure level characteristic and/or sound characteristic including a high-pitched sound band may be provided. Additionally, a thickness of the apparatus may be reduced, thereby providing an apparatus having a slim structure.

Figure 20:
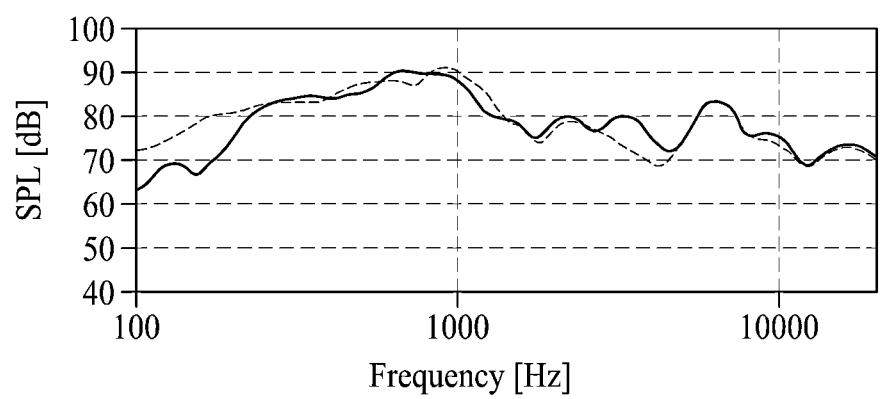
FIG. 20 is a graph showing a sound pressure level characteristic of an electronic apparatus according to an example embodiment of the present disclosure.
Figure 21:
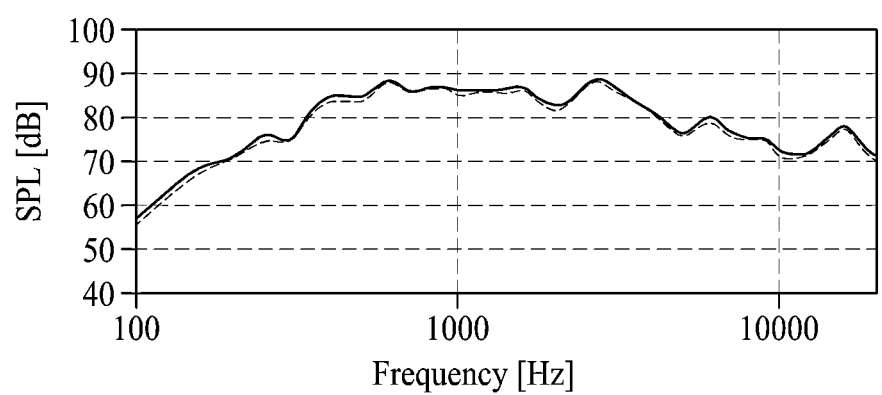
FIG. 21 is a graph showing another sound pressure level characteristic of an electronic apparatus according to an example embodiment of the present disclosure.

FIG. 20 is a graph showing a sound pressure level characteristic of an electronic apparatus according to an example embodiment of the present disclosure. FIG. 21 is a graph showing another sound pressure level characteristic of an electronic apparatus according to an example embodiment of the present disclosure.

In FIGS. 20 and 21, the abscissa axis represents a frequency (Hz), and the ordinate axis represents a sound pressure level (dB). In FIG. 20, a dotted line represents a sound pressure level characteristic measured in an apparatus including no enclosure member, and a solid line represents a sound pressure level characteristic measured in an apparatus including an enclosure member. In FIG. 21, a dotted line represents a sound pressure level characteristic measured in an apparatus which includes an enclosure member and does not include a second cover, and a solid line represents a sound pressure level characteristic measured in an apparatus including an enclosure member and a second cover.

As shown in FIG. 20, it may be seen that a sound pressure level at a low frequency band (about 300 Hz or less) measured in a case including an enclosure member 600 (a solid line) is higher than a sound pressure level measured in a case including no enclosure member 600 (a dotted line). Accordingly, as in an example embodiment of the present disclosure, one or more enclosure members 600 may be provided in the apparatus. Thus, a sound pressure level characteristic and a sound characteristic of a low-pitched sound band may be enhanced.

As shown in FIG. 21, in a total area of a measured frequency range, it may be seen that a sound pressure level characteristic measured in a case including an enclosure member 600 and a second cover 700 (a solid line) is similar to a sound pressure level characteristic measured in a case which includes an enclosure member 600 and does not include a second cover 700 (a dotted line). Accordingly, as in an embodiment of the present disclosure, one or more enclosure member 600 may be provided in the apparatus. Thus, a sound having a consistent sound pressure level may be generated regardless of whether or not a second cover 700 is incorporated.

Figure 22:
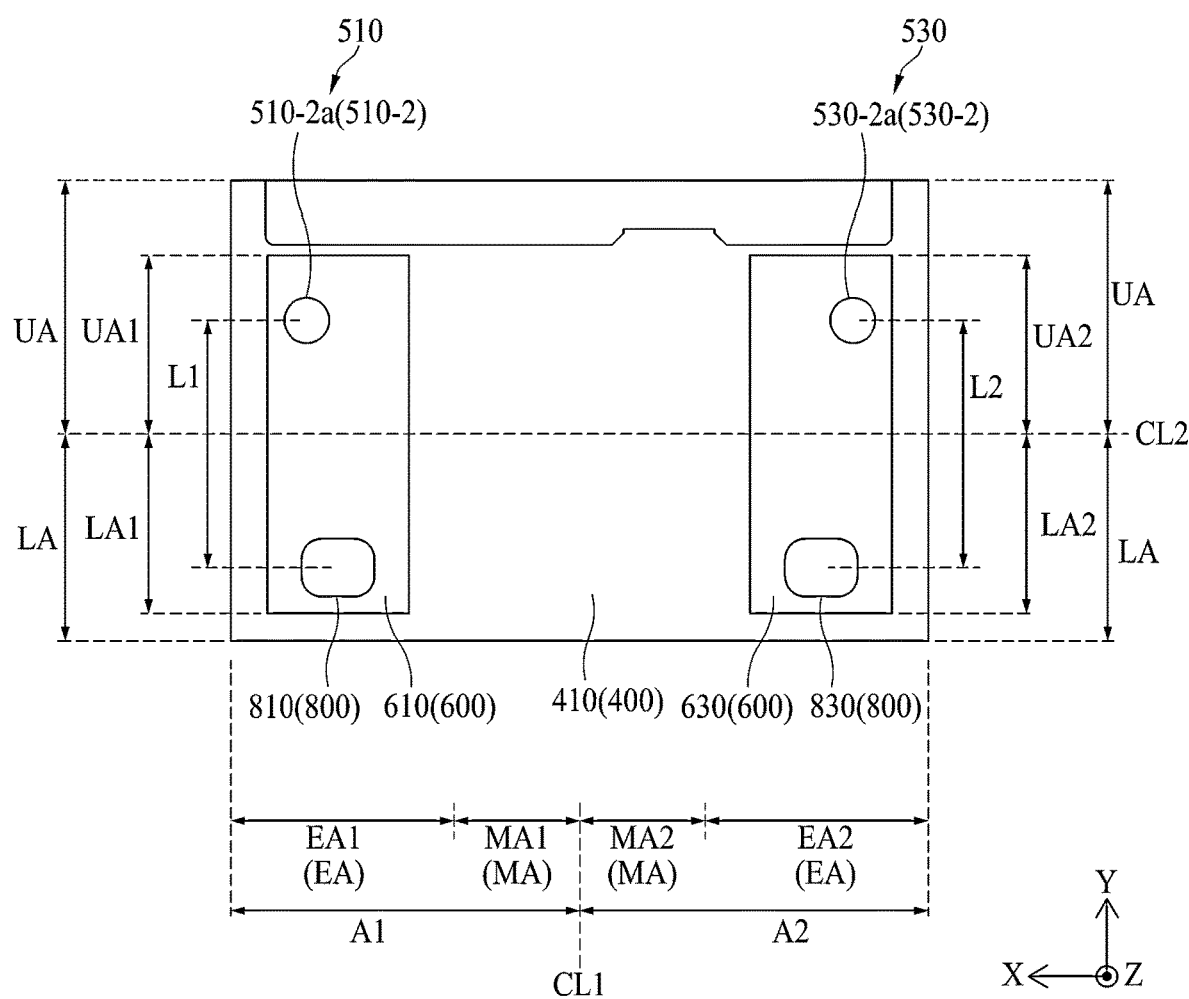
FIG. 22 illustrates a rear surface of an electronic apparatus according to another example embodiment of the present disclosure.
Figure 23:
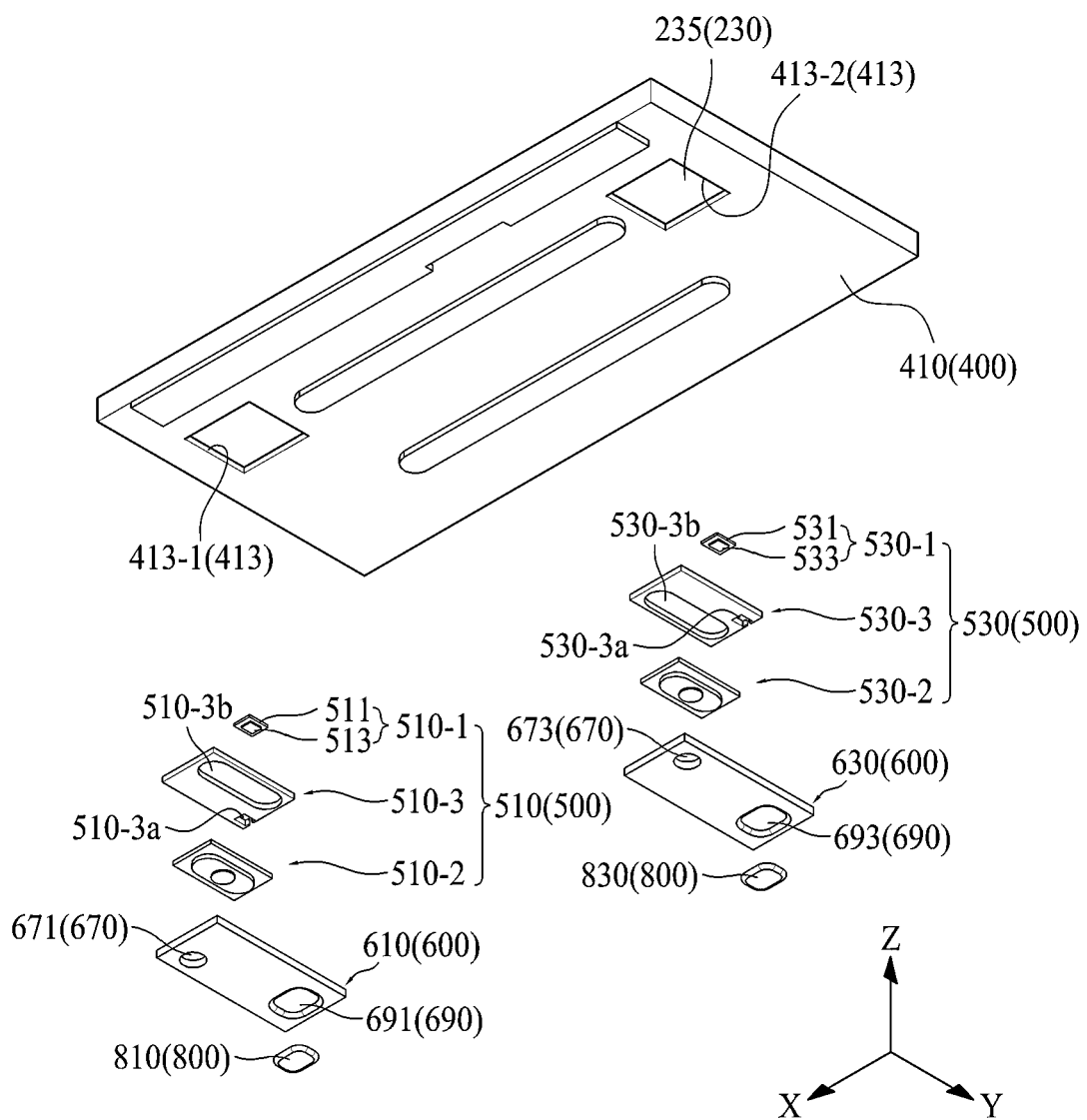
FIG. 23 is an exploded perspective view of the example apparatus illustrated in FIG. 22.

FIG. 22 illustrates a rear surface of an electronic apparatus according to another example embodiment of the present disclosure. FIG. 23 is an exploded perspective view of the example apparatus illustrated in FIG. 22.

The electronic apparatus according to another example embodiment of the present disclosure illustrated in FIGS. 22 and 23 may be implemented by modifying one or more enclosure members 600 and adding a rear vibration member 800 in the example apparatus(es) described above with reference to FIGS. 14 to 19. Descriptions of the enclosure member(s) 600 and the rear vibration member 800 applied to FIGS. 22 and 23 may be identically applied to the example apparatus(es) described above with reference to FIGS. 1 to 13. The following description may focus more on modified and relevant elements, and redundant descriptions of the same or similar elements discussed above may be briefly given or may be omitted.

With reference to FIGS. 14 and 15 (or FIGS. 18 and 19), 22, and 23, the apparatus according to another example embodiment of the present disclosure may further include one or more rear vibration members 800. For example, a rear vibration member 800 may be disposed at a rear surface of an enclosure member 600 (e.g., a first enclosure member 610 or a second enclosure member 630). The enclosure member 600 may include an accommodating portion 690 where the rear vibration member 800 may be disposed. For example, the accommodating portion 690 may be implemented with a shape of a portion of the enclosure member 600 that protrudes from the enclosure member 600 toward a first cover 400 or protrudes away in an opposite direction from the first cover 400. For example, a portion protruding from the enclosure member 600 (e.g., the first enclosure member 610) may be implemented at a bottom portion (e.g., 611) or a lateral portion (e.g., 613) of the enclosure member 600 (e.g., 610). For example, the accommodating portion 690 may be a groove formed at a portion of a front surface of the enclosure member 600 or may be a groove formed at a portion of a rear surface of the enclosure member 600. For example, a groove may be formed at a bottom portion (e.g., 611) or a lateral portion (e.g., 613) of the enclosure member (e.g., the first enclosure member 610). For example, the accommodating portion 690 may include a hole or a slit. For example, the accommodating portion 690 may have a shape corresponding to a shape of the rear vibration member 800. For example, the accommodating portion 690 may include a hole or a slit overlapping the rear vibration member 800.

The first enclosure member 610 may be disposed in a first region A1 of a rear portion 410 of the first cover 400 and may include one or more first accommodating portions 691. The number and shape of first accommodating portions 691 may be determined or adjusted based on a sound characteristic or a haptic feedback characteristic to be implemented.

According to an example embodiment of the present disclosure, the first cover 400 may include a first periphery region EA1 and a second periphery region EA2 with respect to a first center line CL1 in a first direction X (or a widthwise direction). For example, an enclosure member 600 may be disposed at one or more regions of the first periphery region EA1 and the second periphery region EA2 of the first cover 400. For example, the first member 610 may be disposed at the first region A1 of the rear portion 410 of the first cover 400. For example, the first enclosure member 610 may be formed along a second direction Y (or a lengthwise direction) of the rear portion 410 of the first cover 400, in the first region A1 of the rear portion 410 of the first cover 400.

According to an example embodiment of the present disclosure, the first cover 400 may include a first area UA and a second area LA with respect to a second center line CL2 in the second direction Y (or the lengthwise direction). For example, one or more enclosure members 600 may be disposed over the first area UA and the second area LA of the first cover 400.

For example, the first enclosure member 610 may be disposed over the first area UA and the second area LA of the first cover 400, with respect to the second center line (or a lengthwise center line) CL2 in the second direction Y (or the lengthwise direction) of the first cover 400.

According to an example embodiment of the present disclosure, an enclosure member 600 may include a first portion (e.g., UA1 or UA2) and a second portion (e.g., LA1 or LA2). For example, the first portions UA1 and UA2 may correspond to or be disposed at the first area UA of the first cover 400. For example, the second portions LA1 and LA2 may correspond to or be disposed at the second area LA of the first cover 400.

For example, the first enclosure member 610 may include a first portion UA1, which is disposed at or overlaps the first area UA of the first cover 400, and a second portion LA1, which is disposed at or overlaps the second area LA of the first cover 400. For example, the first area UA may be an upper region, but embodiments of the present disclosure are not limited thereto. For example, the second area LA may be a lower region, but embodiments of the present disclosure are not limited thereto. For example, the first portion UA1 may be at an upper region, but embodiments of the present disclosure are not limited thereto. For example, the second portion LA1 may be at a lower region, but embodiments of the present disclosure are not limited thereto.

For example, a vibration apparatus 510 may be disposed at a first portion UA1 or UA2 or at a second portion LA1 or LA2 of an enclosure member 600. For example, the first vibration apparatus 510 may be disposed between the first area UA of the first periphery region EA1 of the first cover 400 and the first portion UA1 of the first enclosure member 610. In this case, the first accommodating portion 691 may be disposed at the second portion LA1 of the first enclosure member 610. For example, the first vibration apparatus 510 may be disposed at the first portion UA1 of the first enclosure member 610, and the first accommodating portion 691 may be disposed at the second portion LA1 of the first enclosure member 610. The first portion UA1 of the first enclosure member 610 may correspond to or be disposed at the first area UA of the first periphery region EA1 of the first cover 400. The second portion LA1 of the second enclosure member 610 may correspond to or be disposed at the second area LA of the first periphery region EA1 of the first cover 400.

For example, the first vibration apparatus 510 may be disposed between the second area LA of the first periphery region EA1 of the first cover 400 and the second portion LA1 of the first enclosure member 610. In this case, the first accommodating portion 691 may be disposed at the first portion UA1 of the first enclosure member 610. For example, the first vibration apparatus 510 may be disposed at the second portion LA1 of the first enclosure member 610, and the first accommodating portion 691 may be disposed at the first portion UA1 of the first enclosure member 610.

The second enclosure member 630 may be disposed at the second region A2 of the rear portion 410 of the first cover 400 and may include one or more second accommodating portions 693. The number and shape of second accommodating portions 693 may be determined or adjusted based on a sound characteristic or a haptic feedback characteristic to be implemented.

For example, the second enclosure member 630 may be disposed at the second periphery region EA2 of the rear portion 410 of the first cover 400. For example, the second enclosure member 630 may be formed along the second direction Y (or the lengthwise direction) of the rear portion 410 of the first cover 400, in the second periphery region EA2 of the rear portion 410 of the first cover 400. For example, the second enclosure member 630 may be disposed over the first area UA and the second area LA of the first cover 400, with respect to the second center line (or the lengthwise center line) CL2 in the second direction Y (or the lengthwise direction) of the first cover 400. For example, the second enclosure member 630 may include a first portion UA2, which is disposed at or overlaps the first area UA of the first cover 400, and a second portion LA2, which is disposed at or overlaps the second area LA of the first cover 400. For example, the first area UA may be an upper region, but embodiments of the present disclosure are not limited thereto. For example, the second area LA may be a lower region, but embodiments of the present disclosure are not limited thereto. For example, the first portion UA2 may be at an upper region, but embodiments of the present disclosure are not limited thereto. For example, the second portion LA2 may be at a lower region, but embodiments of the present disclosure are not limited thereto.

For example, the second vibration apparatus 530 may be disposed between the first area UA of the second periphery region EA2 of the first cover 400 and the first portion UA2 of the second enclosure member 630. In this case, the second accommodating portion 693 may be disposed at the second portion LA2 of the second enclosure member 630. For example, the second vibration apparatus 530 may be disposed at the first portion UA2 of the second enclosure member 630, and the second accommodating portion 693 may be disposed at the second portion LA2 of the second enclosure member 630. The first portion UA2 of the second enclosure member 630 may correspond to or be disposed at the first area UA of the second periphery region EA2 of the first cover 400. The second portion LA2 of the second enclosure member 630 may correspond to or be disposed at the second area LA of the second periphery region EA2 of the first cover 400.

For example, the second vibration apparatus 530 may be disposed between the second area LA of the second periphery region EA2 of the first cover 400 and the second portion LA2 of the second enclosure member 630. In this case, the second accommodating portion 693 may be disposed at the first portion UA2 of the second enclosure member 630. For example, the second vibration apparatus 530 may be disposed at the second portion LA2 of the second enclosure member 630, and the second accommodating portion 693 may be disposed at the first portion UA2 of the second enclosure member 630.

According to an apparatus according to another example embodiment of the present disclosure, a rear vibration member 800 may be disposed at an enclosure member 600. For example, the rear vibration member 800 may be disposed into an accommodating portion 690 formed at the enclosure member 600. For example, the rear vibration member 800 may be disposed at a first portion UA1 or UA2 or at a second portion LA1 or LA2 of an enclosure member 600. For example, the rear vibration member 800 may be disposed at a front surface of an enclosure member 600 facing the first cover 400 or may be disposed at a rear surface of the enclosure member 600 opposite to the front surface of the enclosure member 600.

A rear vibration member 800 may vibrate due to a vibration of a corresponding enclosure member 600 based on a vibration of a corresponding vibration apparatus 500 to enhance a sound characteristic of a low pitched sound band. The rear vibration member 800 may vibrate due to a vibration of the enclosure member 600 based on a vibration of the vibration apparatus 500. The rear vibration member 800 may function as an additional vibration source separate from the vibration apparatus 500, thereby enhancing the strength of a haptic feedback and a sense of vibration (or a vibration characteristic). Accordingly, the rear vibration member 800 may be referred to as a radiation member, a rear radiation member, a sound radiation member, a secondary vibration member, a haptic member, a haptic feedback member, an after-vibration member, or a reaction vibration member. However, embodiments of the present disclosure are not limited thereto.

The rear vibration members 800 according to an example embodiment of the present disclosure may include a first rear vibration member 810 and a second rear vibration member 830.

The first rear vibration member 810 may be disposed at the first enclosure member 610. For example, the first rear vibration member 810 may be disposed at a bottom portion 611 of the first enclosure member 610. For example, the first rear vibration member 810 may be disposed at a front surface or a rear surface of the bottom portion 611 of the first enclosure member 610. For example, the first rear vibration member 810 may be disposed at the first accommodating portion 691 of the first enclosure member 610.

The first rear vibration member 810 may be disposed at the first portion UA1 or the second portion LA1 of the first enclosure member 610. For example, the first rear vibration member 810 may be disposed at a portion of the first enclosure member 610 different from a portion of the first enclosure member 610 where the first vibration apparatus 510 is disposed. For example, the first rear vibration member 810 may be disposed at the second portion LA1 of the first enclosure member 610, and the first vibration apparatus 510 may be disposed at the first portion UA1 of the first enclosure member 610. For example, the first rear vibration member 810 may be disposed at the first portion UA1 of the first enclosure member 610, and the first vibration apparatus 510 may be disposed at the second portion LA1 of the first enclosure member 610.

The first rear vibration member 810 according to an example embodiment of the present disclosure may further include a first vibration plate. The first rear vibration member 810 may further include a first vibration plate and a first rear connection member interposed between the bottom portion 611 of the first enclosure member 610 and the first vibration plate. For example, the first vibration plate may be disposed at a rear surface of the first accommodating portion 691. For example, the first vibration plate may vibrate by reacting on a vibration of the first enclosure member 610 based on vibrations of at least one or more of the first vibration device 510-1 and the third vibration device 510-2 of the first vibration apparatus 510, thereby outputting a haptic vibration. For example, the first rear vibration member 810 may be referred to as a first radiation member, a first rear radiation member, a first sound radiation member, a first secondary vibration member, a first haptic member, a first haptic feedback member, a first after-vibration member, or a first reaction vibration member, or the like. However, embodiments of the present disclosure are not limited thereto.

To secure a sufficient vibration characteristic of the first rear vibration member 810 and to match an acoustic phase between the first rear vibration member 810 and the first vibration apparatus 510, the first rear vibration member 810 and the first vibration apparatus 510 may be spaced apart from each other by a certain-rate distance (a first distance) L1.

For example, the first distance L1 may be a distance between a center of the first rear vibration member 810 and a center of a region (or an exposure region) 510-2a of a third vibration device 510-2 exposed through a first through hole 671 formed at the first enclosure member 610, but a reference position of the first distance L1 is not limited thereto. For example, the first distance L1 may be a distance between the center of the first rear vibration member 810 and a center of the third vibration device 510-2 of the first vibration apparatus 510, which are at opposite areas from each other with respect to the second center line CL2.

The second rear vibration member 830 may be disposed at the second enclosure member 630. For example, the second rear vibration member 830 may be disposed at a bottom portion 631 of the second enclosure member 630. For example, the second rear vibration member 830 may be disposed at a front surface or a rear surface of the bottom portion 631 of the second enclosure member 630. For example, the second rear vibration member 830 may be disposed at the second accommodating portion 693 of the second enclosure member 630.

The second rear vibration member 830 may be disposed at the first portion UA2 or the second portion LA2 of the second enclosure member 630. For example, the second rear vibration member 830 may be disposed at a region different from a region where the second vibration apparatus 530 is disposed. For example, the second rear vibration member 830 may be disposed at the second portion LA2 of the second enclosure member 630, and the second vibration apparatus 530 may be disposed at the first portion UA2 of the second enclosure member 630. For example, the second rear vibration member 830 may be disposed at the first portion UA2 of the second enclosure member 630, and the second vibration apparatus 530 may be disposed at the second portion LA2 of the second enclosure member 630.

The second rear vibration member 830 according to an example embodiment of the present disclosure may further include a second vibration plate. The second rear vibration member 830 may further include a second vibration plate and a second rear connection member interposed between the bottom portion 631 of the second enclosure member 630 and the second vibration plate. For example, the second vibration plate may be disposed at the rear surface of the accommodating portion 693. For example, the second vibration plate may vibrate by reacting on a vibration of the second enclosure member 630 based on vibrations of one or more of the second vibration device 530-1 and the fourth vibration device 530-2 of the second vibration apparatus 530, thereby outputting a haptic vibration. For example, the second rear vibration member 830 may be referred to as a second radiation member, a second rear radiation member, a second sound radiation member, a second secondary vibration member, a second haptic member, a second haptic feedback member, a second after-vibration member, or a second reaction vibration member, or the like, but embodiments of the present disclosure are not limited thereto.

To secure a sufficient vibration characteristic of the second rear vibration member 830 and match an acoustic phase between the second rear vibration member 830 and the second vibration apparatus 530, the second rear vibration member 830 and the second vibration apparatus 530 may be spaced apart from each other by a certain-rate distance (a second distance) L2.

For example, the second distance L2 may be a distance between a center of the second rear vibration member 830 and a center of a region (or an exposure region) 530-2a of a fourth vibration device 530-2 exposed through a second through hole 673 formed at the second enclosure member 630, but a reference position of the second distance L2 is not limited thereto. For example, the second distance L2 may be a distance between the center of the second rear vibration member 830 and a center of the fourth vibration device 530-2 of the second vibration apparatus 530, which are at opposite areas from each other with respect to the second center line CL2. For example, the first distance L1 between the first rear vibration member 810 and the first vibration apparatus 510 may be the same as or different from the second distance L2 between the second rear vibration member 830 and the second vibration apparatus 530.

According to an example embodiment of the present disclosure, the first vibration device 510-1, the third vibration device 510-2, the first support member 510-3, the first enclosure member 610, and the first rear vibration member 810 may configure a first vibration generating apparatus. According to an example embodiment of the present disclosure, the second vibration device 530-1, the fourth vibration device 530-2, the second support member 530-3, the second enclosure member 630, and the second rear vibration member 830 may configure a second vibration generating apparatus.

Figure 24:
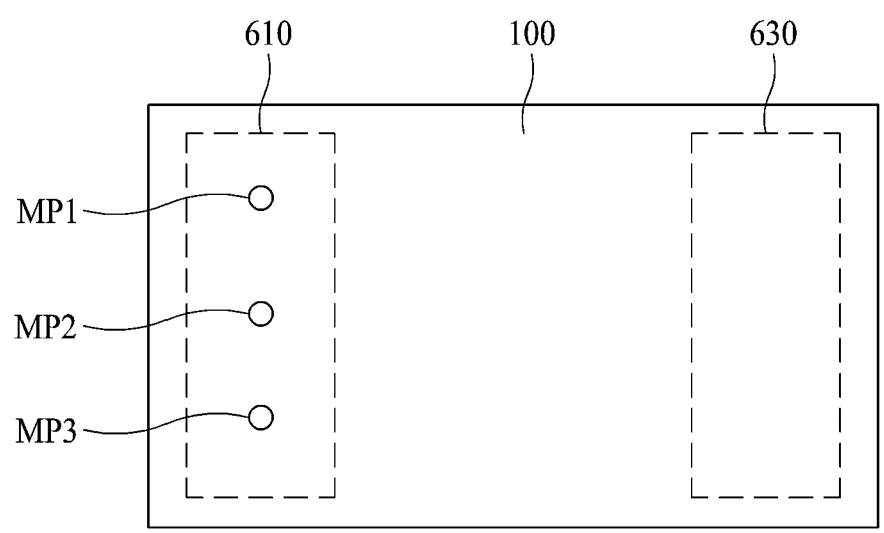
FIG. 24 illustrates example measurement points in a display member for measuring a vibration acceleration in an electronic apparatus according to an example embodiment of the present disclosure.

FIG. 24 illustrates example measurement points in a display member for measuring a vibration acceleration in an apparatus according to an example embodiment of the present disclosure. FIG. 24 is a diagram illustrating a front surface of the example apparatus.

As shown in FIG. 24, in the example apparatus illustrated in FIG. 22, the first to the third measurement points MP1, MP2, and MP3 may be positions which correspond to (or overlap) the first enclosure member 610 or correspond to (or overlap) the first periphery region EA1 of the rear portion 410 of the first cover 400. The first measurement point MP1 may be a position which corresponds to (or overlaps) the first vibration apparatus 510 (or the third vibration device 510-2 of the first vibration apparatus 510). The third measurement point MP3 may be a position which corresponds to (or overlaps) the first rear vibration apparatus 810. The second measurement point MP2 may be a center position between the first measurement point MP1 and the third measurement point MP3.

The following Table 1 shows a result obtained by measuring a vibration acceleration at the first to the third measurement points MP1, MP2, and MP3 shown in FIG. 24. A comparison value is a vibration acceleration measured at the first to the third measurement points MP1, MP2, and MP3 of an example apparatus to which an enclosure member 600 and a rear vibration member 800 are not applied. An experiment value is a vibration acceleration measured at the first to the third measurement points MP1, MP2, and MP3 of an example apparatus to which an enclosure member 600 and the rear vibration member 800 are applied. The comparison value and the experiment value have been measured by applying a sine wave of 5 volts having 200 Hz to the second vibration apparatus 530.

TABLE 1

| Measurement Point | Comparison Value (m/s$^2$) | Experiment Value (m/s$^2$) |
|---|---|---|
| MP1 | 37.68 | 37.68 |
| MP2 | 21.35 | 30.76 |
| MP3 | 20.77 | 32.59 |

With reference to Table 1, it may be seen that an experiment value and a comparison value measured at the first measurement point MP1 corresponding to (overlapping) the first vibration apparatus 510 are the same. However, an experiment value measured at each of the second measurement point MP2 and the third measurement point MP3 is greater than a corresponding comparison value. Therefore, compared to an example apparatus which does not include an enclosure member 600 and a rear vibration member 800, in an apparatus including an enclosure member 600 and a rear vibration member 800 as in another example embodiment of the present disclosure, a vibration acceleration may increase. Thus, a response time of a haptic feedback may be enhanced. Accordingly, because a vibration is transferred at a high speed up to a region which does not correspond to (overlap) the first vibration apparatus 510, a vibration characteristic or a sense of vibration of a haptic feedback may be enhanced.

A vibration apparatus according to an example embodiment of the present disclosure may be applied to a vibration apparatus disposed in an electronic apparatus. The electronic apparatus according to example embodiments of the present disclosure may be applied to mobile apparatuses, video phones, smart watches, watch phones, wearable apparatuses, foldable apparatuses, rollable apparatuses, bendable apparatuses, flexible apparatuses, curved apparatuses, variable apparatuses, sliding apparatuses, electronic organizers, electronic books, portable multimedia players (PMPs), personal digital assistants (PDAs), MP3 players, mobile medical apparatuses, desktop personal computers (PCs), laptop PCs, netbook computers, workstations, navigation apparatuses, automotive navigation apparatuses, automotive display apparatuses, automotive apparatuses, theater display apparatuses, theater apparatuses, TVs, wall paper apparatuses, signage apparatuses, game machines, notebook computers, monitors, cameras, camcorders, home appliances, and so on. Also, the vibration apparatus according to example embodiments of the present disclosure may be applied to organic light emitting lighting apparatuses or inorganic light emitting lighting apparatuses. Where the vibration apparatus is applied to lighting apparatuses, the vibration apparatus according to an example embodiment of the present disclosure may function as lighting and a speaker. Also, where the vibration apparatus of an example embodiment of the present disclosure is applied to a mobile apparatus, the vibration apparatus according to an example embodiment of the present disclosure may function as one or more of a speaker, a receiver, and a haptic apparatus. However, embodiments of the present disclosure are not limited thereto.

An apparatus and a vibration generating apparatus according to various example embodiments of the present disclosure will be described below.

An apparatus according to an example embodiment of the present disclosure may comprise: a vibration member; a first cover disposed at a rear surface of the vibration member; a first vibration apparatus disposed at a rear surface of the first cover and configured to vibrate the vibration member; a first enclosure member disposed at the rear surface of the first cover and at the rear surface of the vibration member; and a first rear vibration member disposed at the first enclosure member.

According to some embodiments of the present disclosure, the first rear vibration member may be disposed at a front surface of the first enclosure member facing the first cover or at a rear surface of the first enclosure member opposite to the front surface of the first enclosure member.

According to some embodiments of the present disclosure, the first enclosure member may comprise an accommodating portion, and the first rear vibration member may be disposed in the accommodating portion.

According to some embodiments of the present disclosure, the accommodating portion may protrude from the first enclosure member toward the first cover or protrudes in an opposite direction away from the first cover.

According to some embodiments of the present disclosure, the accommodating portion may include a groove at a portion of a front surface or a rear surface of the first enclosure member.

According to some embodiments of the present disclosure, the first cover may comprise a first periphery region and a second periphery region with respect to a first center line in a widthwise direction, and the first enclosure member may be disposed at one or more of the first periphery region and the second periphery region of the first cover.

According to some embodiments of the present disclosure, the first cover may comprise a first area and a second area with respect to a second center line in a lengthwise direction, and the first enclosure member may be disposed over the first area and the second area of the first cover.

According to some embodiments of the present disclosure, the first enclosure member may comprise a first portion over the first area of the first cover and a second portion over the second area of the first cover. Also, the first vibration apparatus may be disposed at one of the first portion and the second portion of the first enclosure member, and the first rear vibration member may be disposed at the other of the first portion and the second portion of the first enclosure member.

According to some embodiments of the present disclosure, the apparatus may further comprise: a second enclosure member disposed at the rear surface of the first cover and at the rear surface of the vibration member; and a second rear vibration member disposed at the second enclosure member, wherein the first enclosure member may be disposed at a rear surface of the first periphery region of the first cover, and second enclosure member may be disposed at a rear surface of the second periphery region of the first cover, wherein each of the first enclosure member and the second enclosure member may comprise a first portion over the first area of the first cover and a second portion over the second area of the first cover, wherein the first rear vibration member may be disposed at the first portion or the second portion of the first enclosure member, and wherein the second rear vibration member may be disposed at the first portion or the second portion of the second enclosure member.

According to some embodiments of the present disclosure, the first vibration apparatus may be disposed at a rear surface of the first periphery region of the first cover, and may be disposed at one of the first portion and the second portion of the first enclosure member. Also, the first rear vibration member may be disposed at the other of the first portion and the second portion of the first enclosure member, and may be configured to vibrate based on a vibration of the first vibration apparatus.

According to some embodiments of the present disclosure, the apparatus may further comprise a second vibration apparatus disposed at a rear surface of the second periphery region of the first cover, and the second vibration apparatus may be disposed at one of the first portion and the second portion of the second enclosure member. Also, the second rear vibration member may be disposed at the other of the first portion and the second portion of the second enclosure member, and may be configured to vibrate based on a vibration of the second vibration apparatus.

According to some embodiments of the present disclosure, the apparatus may further comprise a second vibration apparatus disposed at a rear surface of the second periphery region of the first cover, and the first vibration apparatus may be disposed at a rear surface of the first periphery region of the first cover.

According to some embodiments of the present disclosure, a first distance between the first vibration apparatus and the first rear vibration member may be substantially equal to a second distance between the second vibration apparatus and the second rear vibration member.

According to some embodiments of the present disclosure, the first cover may comprise a first hole at the first periphery region and second hole at the second periphery region. Also, wherein the first vibration apparatus may cover the first hole, and the second vibration apparatus may cover the second hole.

According to some embodiments of the present disclosure, the first vibration apparatus may comprise a first vibration device disposed at a rear surface of the first periphery region of the first cover, and the second vibration apparatus may comprise a second vibration device disposed at a rear surface of the second periphery region of the first cover. Also, the first vibration apparatus may further comprise a third vibration device disposed adjacent to the first vibration device to cover the first hole, and the second vibration apparatus may further comprise a fourth vibration device disposed adjacent to the second vibration device to cover the second hole.

According to some embodiments of the present disclosure, each of the first vibration device and the second vibration device may include a film type vibration apparatus, and each of the third vibration device and the fourth vibration device may include a coil type vibration apparatus.

According to some embodiments of the present disclosure, at least one of the first vibration device and the second vibration device may comprise: a vibration portion including a piezoelectric material; a first electrode layer disposed at a first surface of the vibration portion; and a second electrode layer disposed at a second surface of the vibration portion.

According to some embodiments of the present disclosure, the first vibration device may comprise a first vibration generator and a first plate disposed at the rear surface of the first periphery region of the first cover, and the second vibration device may comprise a second vibration generator and a second plate disposed at the rear surface of the second periphery region of the first cover.

According to some embodiments of the present disclosure, the first vibration generator may be disposed at a rear surface of the first plate, or the first plate may be disposed at a rear surface of the first vibration generator. Also, the second vibration generator may be disposed at a rear surface of the second plate, or the second plate may be disposed at a rear surface of the second vibration generator.

According to some embodiments of the present disclosure, at least one of the first vibration generator and the second vibration generator may comprise: a vibration portion including a plurality of first portions including an inorganic material and a plurality of second portions disposed between the plurality of first portions and including an organic material; a first electrode layer disposed at a first surface of the vibration portion; and a second electrode layer disposed at a second surface of the vibration portion.

According to some embodiments of the present disclosure, at least one of the first vibration generator and the second vibration generator may comprise: a vibration portion including a piezoelectric material; a first electrode layer disposed at a first surface of the vibration portion; and a second electrode layer disposed at a second surface of the vibration portion.

According to some embodiments of the present disclosure, the first vibration apparatus may further comprise a first support member disposed at the rear surface of the first periphery region of the first cover, and the third vibration device may be disposed at a rear surface of the first support member. Also, the second vibration apparatus may further comprise a second support member disposed at the rear surface of the second periphery region of the first cover, and the fourth vibration device may be disposed at a rear surface of the second support member.

According to some embodiments of the present disclosure, the first support member may comprise a third hole overlapping with the first vibration device and a fourth hole overlapping with the third vibration device, and the second support member may comprise a fifth hole overlapping with the second vibration device and a sixth hole overlapping with the fourth vibration device.

According to some embodiments of the present disclosure, the fourth hole may overlap with the first hole, and the sixth hole overlaps with the second hole.

According to some embodiments of the present disclosure, the vibration member may include one or more of a display panel including a plurality of pixels configured to display an image, a light emitting diode lighting panel, an organic light emitting lighting panel, and an inorganic light emitting lighting panel.

According to some embodiments of the present disclosure, the vibration member may include a metal material or includes a single or composite nonmetal material having one or more of wood, rubber, plastic, glass, fiber, cloth, paper, and leather.

According to some embodiments of the present disclosure, the vibration member may include one of a display panel including a plurality of pixels configured to display an image, a screen panel for displaying an image projected from a display apparatus, a lighting panel, a signage panel, a vehicular interior material, a vehicular glass window, a vehicular exterior material, a building ceiling material, a building interior material, a building glass window, an aircraft interior material, an aircraft glass window, and a mirror.

According to some embodiments of the present disclosure, the vibration member may include a display member comprising a display panel configured to display an image, wherein the display member may further comprise: a backlight disposed at a rear surface of the display panel; and a guide member between the display panel and the backlight.

According to some embodiments of the present disclosure, the apparatus may further comprise a front member and a second cover, wherein the vibration member may include a display member having a display panel configured to display an image, wherein the front member may be disposed at a front surface of the display member, and wherein the second cover may be disposed at a rear surface of the first enclosure member to accommodate the display member, the first cover, the first vibration apparatus, and the first enclosure member on which the first rear vibration member is disposed.

A vibration generating apparatus for use with a vibration member according to an example embodiment of the present disclosure may comprise: a support member including a first hole and a second hole; a first vibration device disposed at the first hole; a second vibration device disposed at the second hole; an enclosure member connected to a rear surface of the vibration member and configured to cover the support member, the first vibration device, and the second vibration device; and a rear vibration member disposed at the enclosure member.

According to some embodiments of the present disclosure, the rear vibration member may be configured to vibrate based on a vibration of at least one of the first vibration device and the second vibration device.

According to some embodiments of the present disclosure, the enclosure member may comprise an accommodating portion, and the rear vibration member may be disposed in the accommodating portion.

According to some embodiments of the present disclosure, the accommodating portion may comprise a groove at a portion of a front surface or a rear surface of the enclosure member.

According to some embodiments of the present disclosure, the accommodating portion may comprise a hole overlapping with the rear vibration member.

According to some embodiments of the present disclosure, the rear vibration member may further comprise a vibration plate disposed at the accommodating portion, and the vibration plate may be configured to vibrate according to a vibration of the enclosure member based on a vibration of at least one of the first vibration device and the second vibration device.

According to some embodiments of the present disclosure, the first vibration device may be configured to output a first sound pressure level to the vibration member via the first hole, and the second vibration device is configured to output a second sound pressure level, different from the first sound pressure level, to the vibration member via the second hole. Also, the rear vibration member may be configured to output a haptic vibration based on a vibration of at least one of the first vibration device and the second vibration device.

According to some embodiments of the present disclosure, the first vibration device may include a vibration generator including a piezoelectric device, and the second vibration device may include a coil type vibration generator.

According to some embodiments of the present disclosure, the first vibration device may be disposed between the support member and the enclosure member and overlap with the first hole, and the second vibration device may be disposed between the support member and the enclosure member and overlap with the second hole.

An apparatus according to an example embodiment of the present disclosure may comprise: a vibration member; a first cover disposed at a rear surface of the vibration member; and a vibration generating apparatus disposed at a rear surface of the first cover and configured to vibrate the vibration member. The vibration generating apparatus may comprise: a support member including a first hole and a second hole; a first vibration device disposed at the first hole; a second vibration device disposed at the second hole; an enclosure member connected to a rear surface of the vibration member and configured to cover the support member, the first vibration device, and the second vibration device; and a rear vibration member disposed at the enclosure member.

It will be apparent to those skilled in the art that various modifications and variations can be made in the present disclosure without departing from the technical idea or scope of the disclosures. Thus, it is intended that embodiments of the present disclosure cover the modifications and variations of the disclosure provided they come within the scope of the appended claims and their equivalents.

What is claimed is:

1. An apparatus, comprising:
a vibration member;
a first cover disposed at a rear surface of the vibration member;
a first vibration apparatus disposed at a rear surface of the first cover and configured to vibrate the vibration member;
a first enclosure member disposed at the rear surface of the first cover and at the rear surface of the vibration member;
a first rear vibration member disposed at the first enclosure member, the first rear vibration member being configured to vibrate based on a vibration of the first vibration apparatus;
a second enclosure member disposed at the rear surface of the first cover and at the rear surface of the vibration member; and
a second rear vibration member disposed at the second enclosure member,
wherein the first cover comprises a first periphery region and a second periphery region with respect to a first center line in a widthwise direction,
wherein the first enclosure member is disposed at one or more of the first periphery region and the second periphery region of the first cover,
wherein the first enclosure member is disposed at a rear surface of the first periphery region of the first cover, and the second enclosure member is disposed at a rear surface of the second periphery region of the first cover,
wherein the first cover comprises a first area and a second area with respect to a second center line in a lengthwise direction,
wherein the first enclosure member is disposed over the first area and the second area of the first cover,
wherein each of the first enclosure member and the second enclosure member comprises a first portion over the first area of the first cover and a second portion over the second area of the first cover,
wherein the first rear vibration member is disposed at the first portion or the second portion of the first enclosure member, and the second rear vibration member is disposed at the first portion or the second portion of the second enclosure member,
wherein the first vibration apparatus is disposed at a rear surface of the first periphery region of the first cover,
wherein the first vibration apparatus is disposed at one of the first portion and the second portion of the first enclosure member, and
wherein the first rear vibration member is disposed at the other of the first portion and the second portion of the first enclosure member.

2. The apparatus of claim 1,
wherein the first rear vibration member is disposed at a front surface of the first enclosure member facing the first cover or at a rear surface of the first enclosure member opposite to the front surface of the first enclosure member.

3. The apparatus of claim 1,
wherein the first enclosure member comprises an accommodating portion, and
wherein the first rear vibration member is disposed in the accommodating portion.

4. The apparatus of claim 3,
wherein the accommodating portion protrudes from the first enclosure member toward the first cover or protrudes in an opposite direction away from the first cover.

5. The apparatus of claim 3,
wherein the accommodating portion includes a groove at a portion of a front surface or a rear surface of the first enclosure member.

6. The apparatus of claim 1,
further comprising a second vibration apparatus disposed at a rear surface of the second periphery region of the first cover,
wherein the second vibration apparatus is disposed at one of the first portion and the second portion of the second enclosure member,
wherein the second rear vibration member is disposed at the other of the first portion and the second portion of the second enclosure member, and
wherein the second rear vibration member is configured to vibrate based on a vibration of the second vibration apparatus.

7. The apparatus of claim 1,
wherein the vibration member includes one or more of a display panel including a plurality of pixels configured to display an image, a light emitting diode lighting panel, an organic light emitting lighting panel, and an inorganic light emitting lighting panel.

8. The apparatus of claim 1,
wherein the vibration member includes a metal material or includes a single or composite nonmetal material having one or more of wood, rubber, plastic, glass, fiber, cloth, paper, and leather.

9. The apparatus of claim 1,
wherein the vibration member includes one of a display panel including a plurality of pixels configured to display an image, a screen panel configured to display an image projected from a display apparatus, a lighting panel, a signage panel, a vehicular interior material, a vehicular glass window, a vehicular exterior material, a building ceiling material, a building interior material, a building glass window, an aircraft interior material, an aircraft glass window, and a mirror.

10. The apparatus of claim 1,
wherein the vibration member includes a display member comprising a display panel configured to display an image, and
wherein the display member further comprises:
    a backlight disposed at a rear surface of the display panel; and
    a guide member between the display panel and the backlight.

11. The apparatus of claim 1,
further comprising a front member and a second cover,
wherein the vibration member includes a display member having a display panel configured to display an image,
wherein the front member is disposed at a front surface of the display member, and
wherein the second cover is disposed at a rear surface of the first enclosure member to accommodate the display member, the first cover, the first vibration apparatus, and the first enclosure member on which the first rear vibration member is disposed.

12. The apparatus of claim 1,
further comprising a second vibration apparatus disposed at a rear surface of the second periphery region of the first cover,
wherein the first vibration apparatus is disposed at a rear surface of the first periphery region of the first cover.

13. The apparatus of claim 12,
wherein a first distance between the first vibration apparatus and the first rear vibration member is substantially equal to a second distance between the second vibration apparatus and the second rear vibration member.

14. The apparatus of claim 12,
wherein the first cover comprises a first hole at the first periphery region and a second hole at the second periphery region,
wherein the first vibration apparatus covers the first hole, and
wherein the second vibration apparatus covers the second hole.

15. The apparatus of claim 14,
wherein the first vibration apparatus comprises a first vibration device disposed at a rear surface of the first periphery region of the first cover, and the second vibration apparatus comprises a second vibration device disposed at a rear surface of the second periphery region of the first cover,
wherein the first vibration apparatus further comprises a third vibration device disposed adjacent to the first vibration device to cover the first hole, and
wherein the second vibration apparatus further comprises a fourth vibration device disposed adjacent to the second vibration device to cover the second hole.

16. The apparatus of claim 15,
wherein each of the first vibration device and the second vibration device includes a film type vibration apparatus, and
wherein each of the third vibration device and the fourth vibration device includes a coil type vibration apparatus.

17. The apparatus of claim 15,
wherein at least one of the first vibration device and the second vibration device comprises:
a vibration portion including a piezoelectric material;
a first electrode layer disposed at a first surface of the vibration portion; and
a second electrode layer disposed at a second surface of the vibration portion.

18. The apparatus of claim 15,
wherein the first vibration device comprises a first vibration generator and a first plate disposed at the rear surface of the first periphery region of the first cover, and
wherein the second vibration device comprises a second vibration generator and a second plate disposed at the rear surface of the second periphery region of the first cover.

19. The apparatus of claim 18,
wherein the first vibration generator is disposed at a rear surface of the first plate, or the first plate is disposed at a rear surface of the first vibration generator, and
wherein the second vibration generator is disposed at a rear surface of the second plate, or the second plate is disposed at a rear surface of the second vibration generator.

20. The apparatus of claim 18,
wherein at least one of the first vibration generator and the second vibration generator comprises:
    a vibration portion including a plurality of first portions including an inorganic material and a plurality of second portions disposed between the plurality of first portions and including an organic material;
    a first electrode layer disposed at a first surface of the vibration portion; and
    a second electrode layer disposed at a second surface of the vibration portion.

21. The apparatus of claim 18,
wherein at least one of the first vibration generator and the second vibration generator comprises:
a vibration portion including a piezoelectric material;
a first electrode layer disposed at a first surface of the vibration portion; and
a second electrode layer disposed at a second surface of the vibration portion.

22. The apparatus of claim 15,
wherein the first vibration apparatus further comprises a first support member disposed at the rear surface of the first periphery region of the first cover, and the third vibration device is disposed at a rear surface of the first support member, and
wherein the second vibration apparatus further comprises a second support member disposed at the rear surface of the second periphery region of the first cover, and the fourth vibration device is disposed at a rear surface of the second support member.

23. The apparatus of claim 22,
wherein the first support member comprises a third hole overlapping with the first vibration device and a fourth hole overlapping with the third vibration device, and
wherein the second support member comprises a fifth hole overlapping with the second vibration device and a sixth hole overlapping with the fourth vibration device.

24. The apparatus of claim 23,
wherein the fourth hole overlaps with the first hole, and the sixth hole overlaps with the second hole.

25. A vibration generating apparatus for use with a vibration member, comprising:
a support member including a first hole and a second hole;
a first vibration device disposed at the first hole;
a second vibration device disposed at the second hole;
an enclosure member connected to a rear surface of the vibration member and configured to cover the support member, the first vibration device, and the second vibration device; and
a rear vibration member disposed at the enclosure member, the rear vibration member being configured to vibrate based on a vibration of at least one of the first vibration device and the second vibration device.

26. The vibration generating apparatus of claim 25,
wherein the enclosure member comprises an accommodating portion, and
wherein the rear vibration member is disposed in the accommodating portion.

27. The vibration generating apparatus of claim 26,
wherein the accommodating portion comprises a groove at a portion of a front surface or a rear surface of the enclosure member.

28. The vibration generating apparatus of claim 26,
wherein the accommodating portion comprises a hole overlapping with the rear vibration member.

29. The vibration generating apparatus of claim 26,
wherein the rear vibration member further comprises a vibration plate disposed at the accommodating portion, and
wherein the vibration plate is configured to vibrate according to a vibration of the enclosure member based on a vibration of at least one of the first vibration device and the second vibration device.

30. The vibration generating apparatus of claim 25,
wherein the first vibration device is configured to output a first sound pressure level to the vibration member via the first hole,
wherein the second vibration device is configured to output a second sound pressure level, different from the first sound pressure level, to the vibration member via the second hole, and
wherein the rear vibration member is configured to output a haptic vibration based on a vibration of at least one of the first vibration device and the second vibration device.

31. The vibration generating apparatus of claim 25,
wherein the first vibration device includes a vibration generator including a piezoelectric device, and
wherein the second vibration device includes a coil type vibration generator.

32. The vibration generating apparatus of claim 25,
wherein the first vibration device is disposed between the support member and the enclosure member and overlaps with the first hole, and
wherein the second vibration device is disposed between the support member and the enclosure member and overlaps with the second hole.

33. An apparatus, comprising:
a vibration member;
a first cover disposed at a rear surface of the vibration member; and
a vibration generating apparatus disposed at a rear surface of the first cover and configured to vibrate the vibration member, the vibration generating apparatus comprising:
a support member including a first hole and a second hole;
a first vibration device disposed at the first hole;
a second vibration device disposed at the second hole;
an enclosure member connected to a rear surface of the vibration member and configured to cover the support member, the first vibration device, and the second vibration device; and
a rear vibration member disposed at the enclosure member, the rear vibration member being configured to vibrate based on a vibration of at least one of the first vibration device and the second vibration device.

* * * * *